United States Patent [19]

Nakajima et al.

[11] Patent Number: 5,719,843
[45] Date of Patent: Feb. 17, 1998

[54] METHOD OF MAXIMUM LIKELIHOOD DECODING AND DIGITAL INFORMATION PLAYBACK APPARATUS

[75] Inventors: Takeshi Nakajima, Osaka; Shigeru Furumiya, Himeji; Yoshinari Takemura, Settsu; Kenji Koishi, Sanda, all of Japan

[73] Assignee: Matsushita Electric Industrial Co.Ltd, Osaka, Japan

[21] Appl. No.: 668,178

[22] Filed: Jun. 21, 1996

[30] Foreign Application Priority Data

| | | | |
|---|---|---|---|
| Jun. 22, 1995 | [JP] | Japan | 7-155881 |
| Dec. 5, 1995 | [JP] | Japan | 7-344787 |
| Apr. 23, 1996 | [JP] | Japan | 8-100925 |
| Jun. 10, 1996 | [JP] | Japan | 8-146965 |

[51] Int. Cl.[6] ............................. G11B 7/00
[52] U.S. Cl. .................. 369/59; 369/47; 369/124; 360/48
[58] Field of Search ............... 369/59, 47, 48, 369/49, 50, 54, 58, 124, 32; 360/48, 51, 32, 65

[56] References Cited

U.S. PATENT DOCUMENTS

| | | | |
|---|---|---|---|
| 5,095,392 | 3/1992 | Shimazaki et al. | 360/32 X |
| 5,384,671 | 1/1995 | Fisher | 360/51 |
| 5,400,189 | 3/1995 | Sato et al. | 360/65 |

FOREIGN PATENT DOCUMENTS 6-243598  9/1994  Japan.

*Primary Examiner*—Muhammad N. Edun
*Attorney, Agent, or Firm*—McDermott, Will & Emery

[57] ABSTRACT

A digital information playback apparatus comprises A/D converter that converts a playback signal into digital data, a maximum likelihood decoder that decodes the quantized data output from the A/D converter to obtain the original digital information, and a timing signal extractor that generates a sampling clock used in the A/D converter, and wherein the maximum likelihood decoder detects the response characteristic of the record/playback system and obtains level fluctuations contained in the playback signal, based on the survival path obtained as a maximum likelihood decoding result, to control the expected multilevel equalized values used in the maximum likelihood decoder, the timing signal extractor obtains level fluctuations, based on the survival path obtained as a maximum likelihood decoding result, and obtains the component of the level fluctuations due to phase shifts of the sampling clock of the VCO to control the phase of the sampling clock of the VCO.

19 Claims, 30 Drawing Sheets

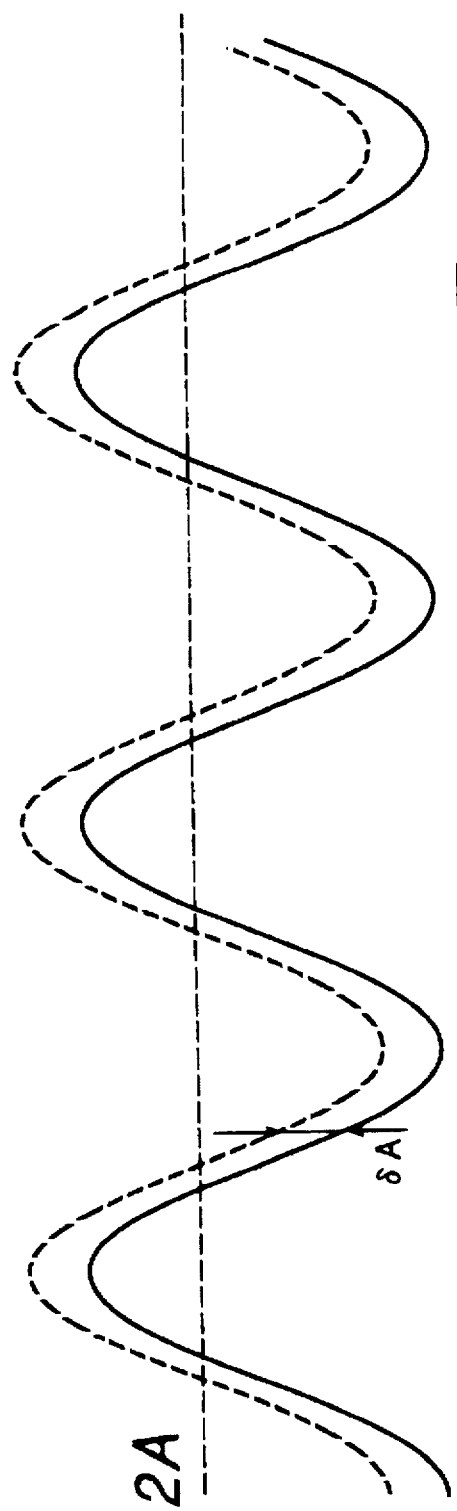
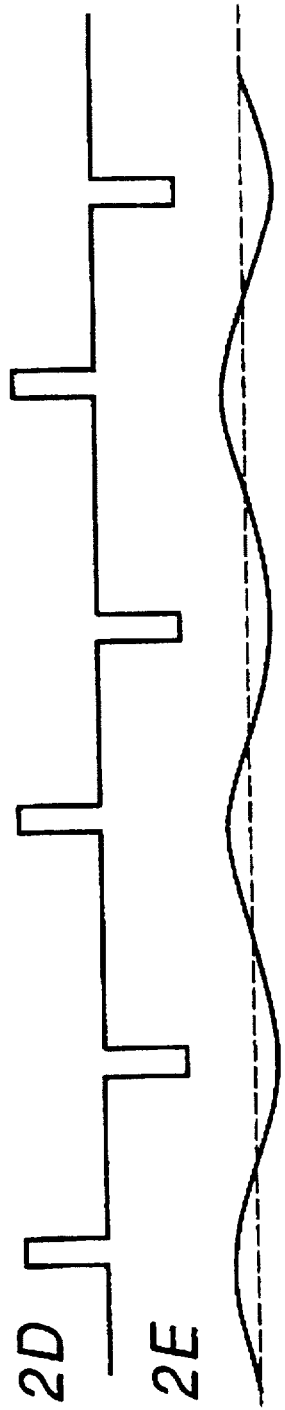
Fig.2A
Fig.2B
Fig.2C
Fig.2D
Fig.2E

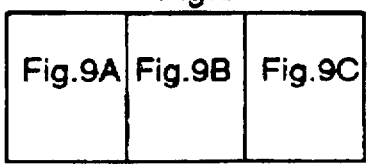
Fig. 9A
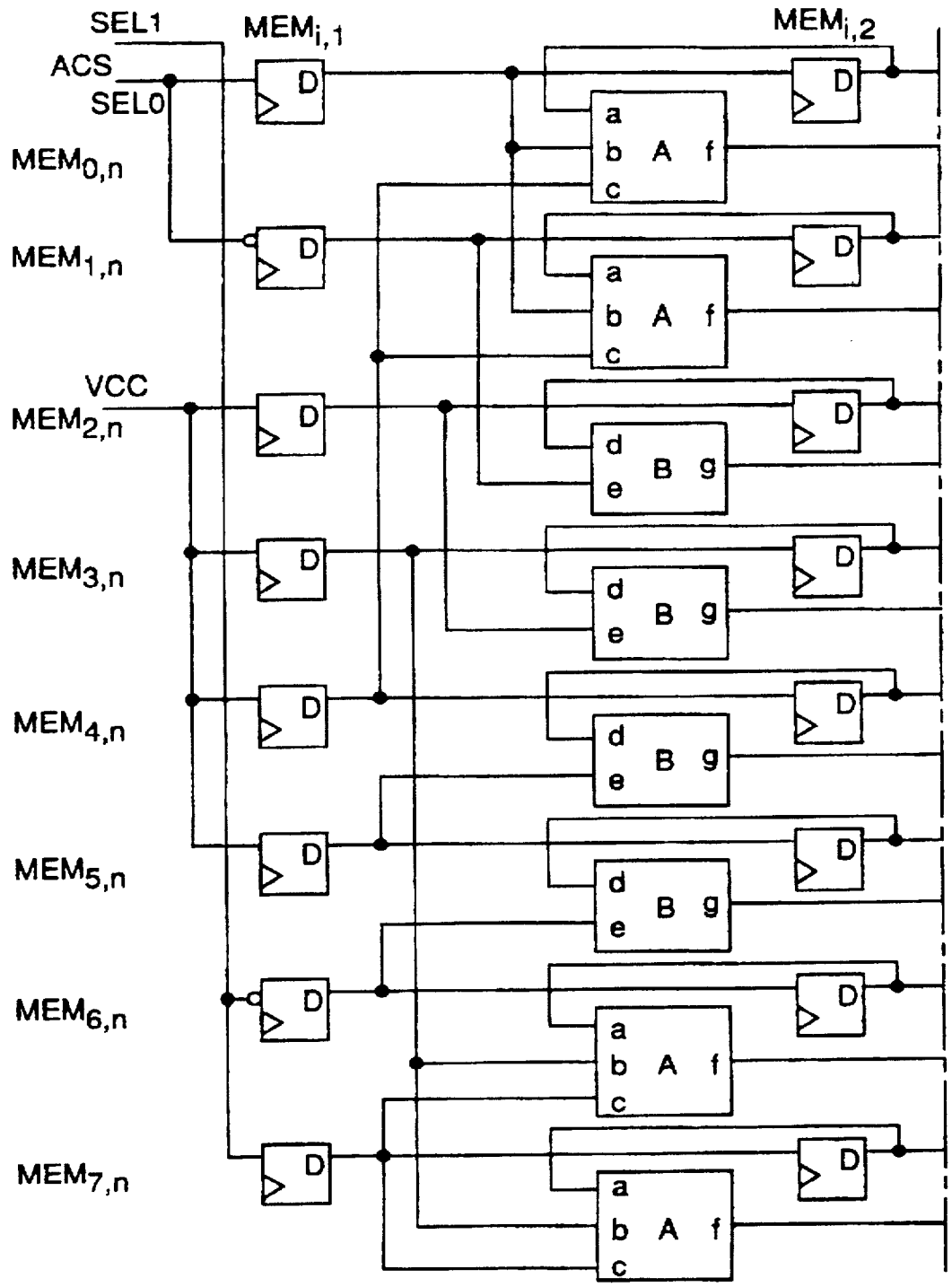

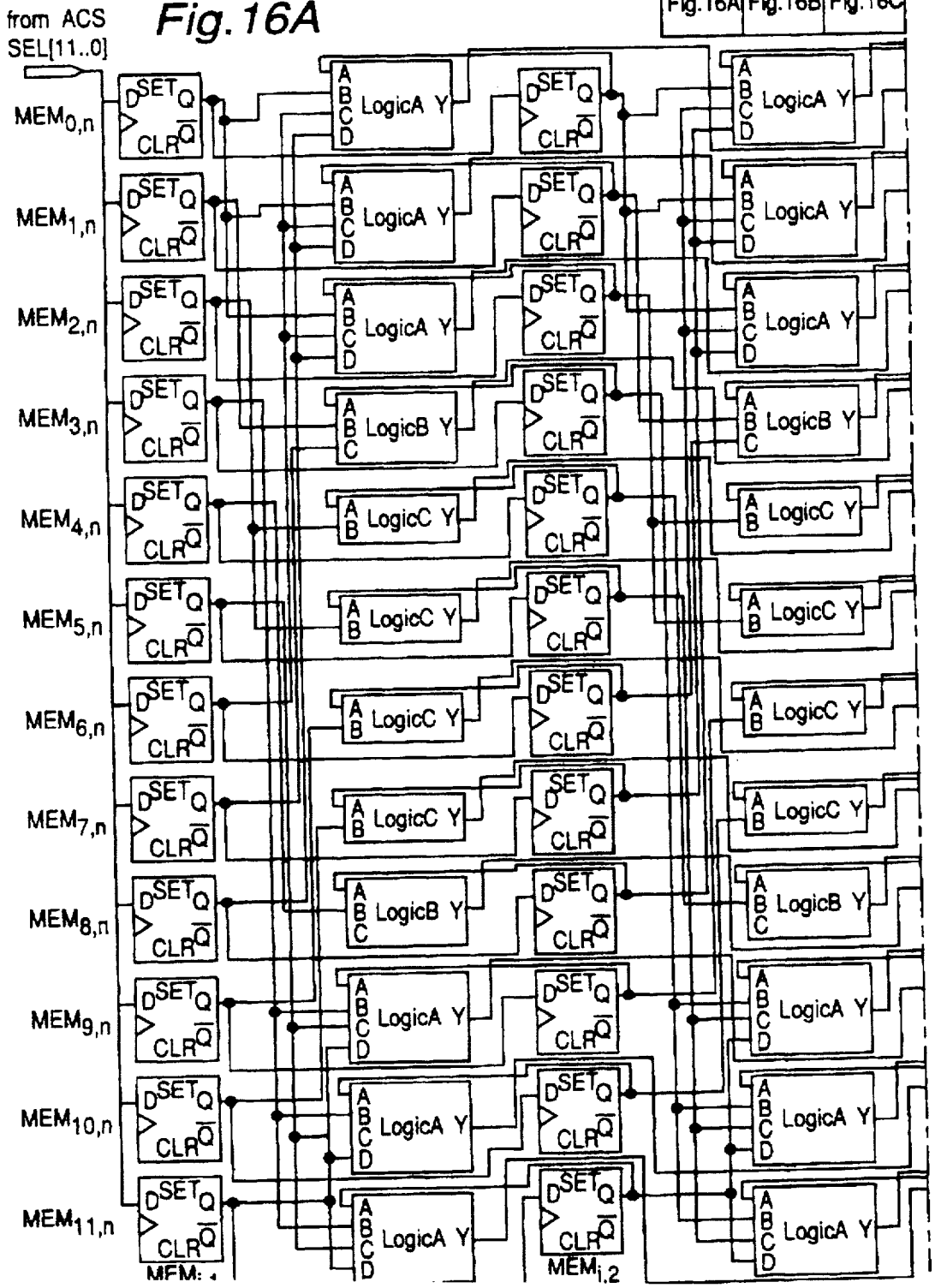

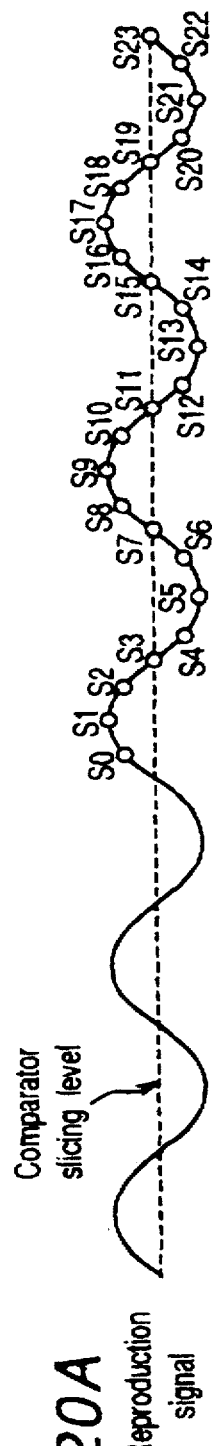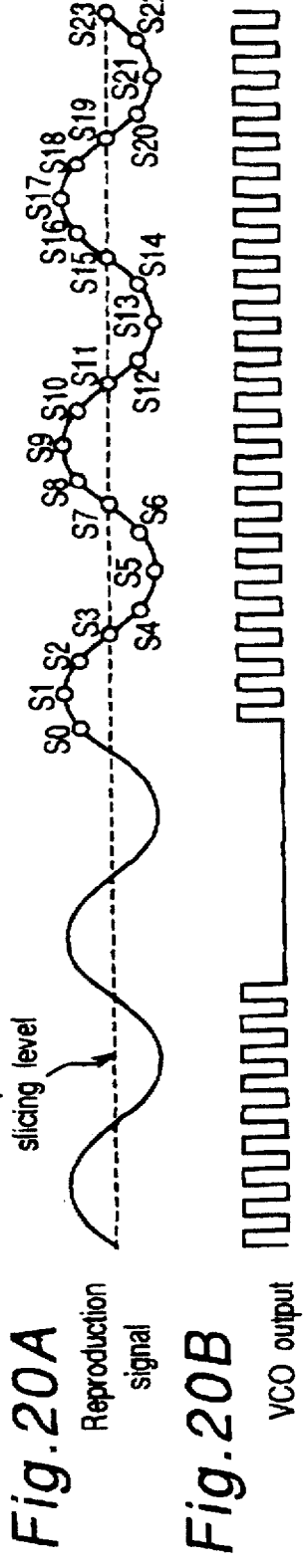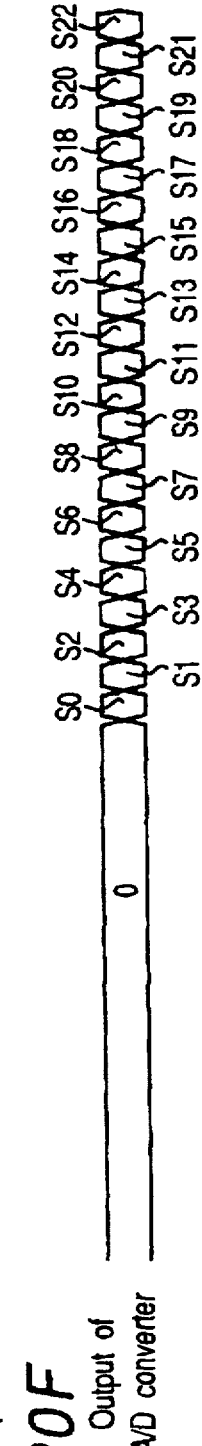
Fig. 20A Reproduction signal
Fig. 20B VCO output
Fig. 20C Read gate
Fig. 20D Output of comparator
Fig. 20E Zero-phase start
Fig. 20F Output of A/D converter

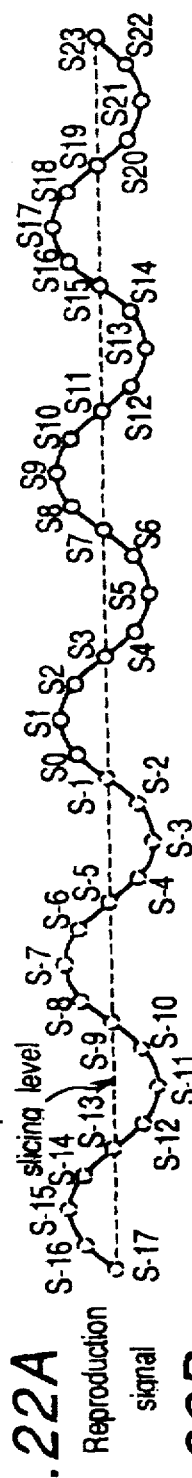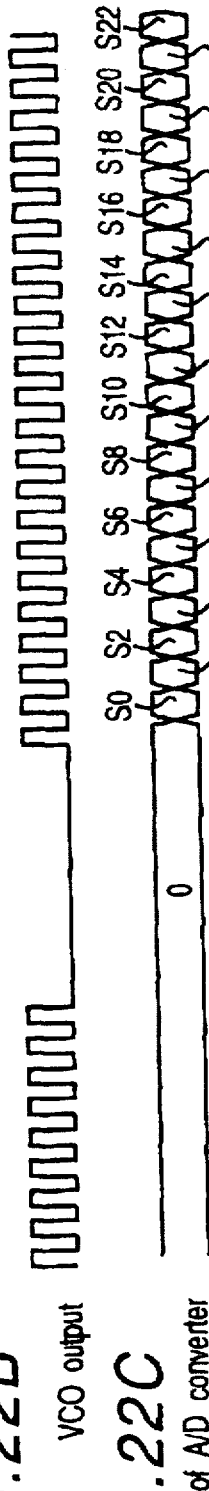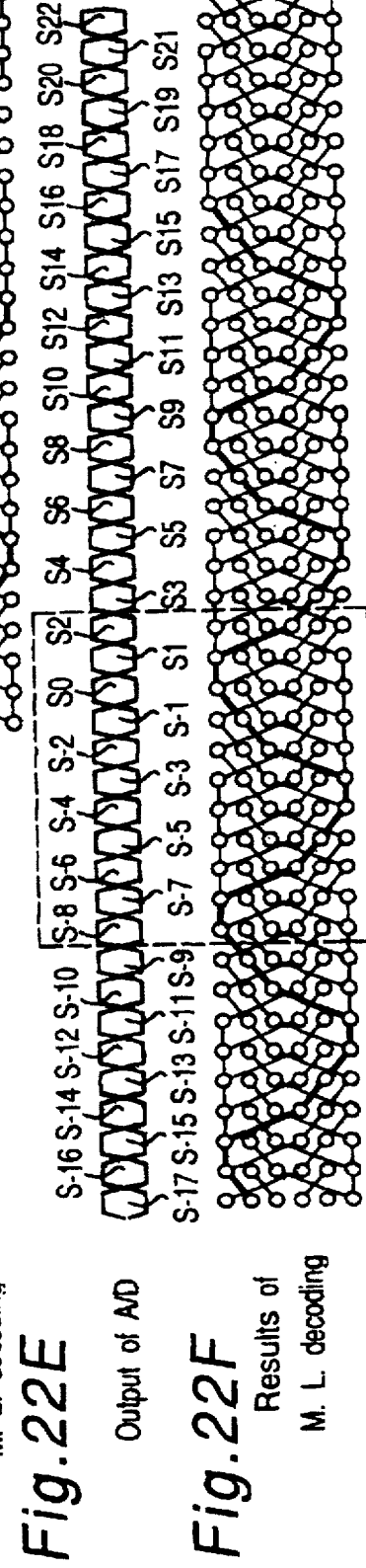
Fig.22A Reproduction signal
Fig.22B VCO output
Fig.22C Output of A/D converter
Fig.22D Results of M.L. decoding
Fig.22E Output of A/D
Fig.22F Results of M.L. decoding

METHOD OF MAXIMUM LIKELIHOOD DECODING AND DIGITAL INFORMATION PLAYBACK APPARATUS

BACKGROUND OF THE INVENTION

1. Field of the Invention

The present invention relates to digital information playback apparatus that reproduces an original digital signal from an analog signal played back from a recording medium.

2. Description of the Related Art

Of recent years PRML (Partial Response Maximum Likelihood) signal processing has been used for a method of decoding digital information recorded on a medium at high density. PRML signal processing is a combined method of partial response processing and Viterbi decoding. When achieving high-density recording on a medium, interference between recorded bits occurs from the frequency characteristic of the record/playback system. Partial response processing can improve the SN ratio more than Nyquist equalization by giving known interference between recorded bits. On the other hand, Viterbi decoding is effective, when correlations exist between successive bits. Partial response processing introduces correlations between recorded bits to give known interference between recorded bits, so that the combination of partial processing and Viterbi decoding is effective. It is generally admitted that recording and playback characteristics of optical disks are consistent with the Class I partial response equalization characteristics, and recording and playback characteristics of magnetic disks are consistent with the Class IV partial response equalization characteristics. Further, methods of multilevel PRML signal processing that introduce more correlations between recorded bits are currently examined for higher density recording.

However, Viterbi decoding uses information about the amplitude of the playback signal, so that it is greatly affected by fluctuations in the amplitude. For example, in the case of an optical disk, defocus, changes in the reflectance of the disk, changes in the recording power of the laser, and the like effect level fluctuations in the waveform of the playback signal. A playback signal from a recording medium contains white noise approximately having the Gauss distribution. If only such white noise is contained in the playback signal as fluctuation components, then the best error rate can be realized during decoding if an expected equalized value is fixed at the center of the dispersion of a quantized data value. However, if level fluctuations are contained in the playback signal in addition to white noise, then the quantized data that is obtained by quantizing the playback signal is dispersed by not only white noise but also level fluctuations. If an expected equalized value is fixed at the center of the dispersion, then not only the white noise but also level fluctuations are PRML processed, so that effects of the PRML processing in improving error rates cannot sufficiently be obtained.

FIG. 1 is a block diagram illustrating the playback-signal processing circuit of a prior optical disk driver. The operation of the signal processing circuit is described in conjunction with FIG. 1. The reflected light from an optical disk 1 is detected by an optical head 2 as a playback signal. The detected playback signal is amplified by a preamplifier 3, and its waveform is shaped by an equalizer 4, abbreviated to EQ hereafter. Then, a zero crossing point of the playback signal having the shaped waveform is detected by a comparator 7 that compares it with a predetermined slicing level. A VCO 10 is a voltage-controlled oscillator and generates a clock signal. A phase comparator 8 compares the timing of the zero crossing point and the timing of the edge of a clock pulse to output a pulse of a width corresponding to the amount of a phase error. An LPF 9 extracts from the output signal of phase comparator 8 a signal component of the playback signal that should follow the playback signal. VCO 10 is controlled by the extracted signal. The clock signal generated by VCO 10 is provided to an A/D converter 5 and a maximum likelihood decoder 6. A/D converter 5 quantizes the playback signal shaped by EQ 4 with the timing of the clock signal. Maximum likelihood decoder 6 decodes the input quantized data to obtain the original digital signal by estimating a most likely state transition based on partial response equalization, hereafter called PR equalization, and state transitions determined by the channel code.

FIGS. 2A to 2E show examples of signal waveforms at each part. Consider the case where a playback signal shifted by δA in the negative direction, caused by level fluctuations, as in FIG. 2A. In the above signal processing circuit, comparator 7 compares the playback signal with a predetermined slicing level to judge whether the playback signal is at high level or at low level, even when VCO 10 is outputting an optimal timing signal. If comparator 7 finds a zero crossing point, then it outputs a pulse of a definite width, as shown in FIG. 2B. Phase comparator 8 compares the output (FIG. 2B) of comparator 7 and the clock signal (FIG. 2C) of VCO 10 to output a signal of FIG. 2D to LPF 9. Further, LPF 9 extracts a necessary low-band component, to output a signal of FIG. 2E to VCO 10. Consequently, the prior timing signal extracting circuit detects phase errors for VCO 10 that is outputting an optimal timing signal to perform phase control. The clock signal is affected by level fluctuations contained in the playback signal. In an extreme case, where the effects of level fluctuations are so great that a zero crossing point does not appear for a long time, phase errors cannot be detected. If such a state continues, then the synchronization on the playback side is unlocked, to cause fatal errors for PRML signal processing. If level fluctuations occur in this way, then not only a predetermined error rate cannot be maintained, but also accurate clock reproduction cannot be realized.

This problem will become much more serious in DVD (Digital Video Disk) system.

SUMMARY OF THE INVENTION

An object of the present invention is to provide a reproduction method of digital signal recorded at a high density.

Another object of the present invention is to provide a PRLM decoding method suitable for reproducing digital signal recorded by modulation with the channel code of the minimum distance between polarity inversions 3 or more.

One more object of the present invention is to provide a method for obtaining a clock signal suitable for reproducing digital signal of high record density by utilizing information output from a maximum likelihood decoder.

A further object of the present invention is to provide a maximum likelihood decoder suitable for use in PRML decoding system.

According to a digital information apparatus of the present invention, in a digital information apparatus equipped with an A/D converter that converts a playback signal into quantized data, a maximum likelihood decoder that decodes the quantized data output from the A/D converter to obtain original digital information, and a timing signal extractor that generates a timing signal used in the A/D converter based on phase error information output from the maximum likelihood decoder, the maximum likelihood decoder obtains level fluctuations contained in the playback signal to control expected multilevel equalized values used for branch-metric operations.

According to a maximum likelihood decoding method of the present invention, a playback signal played back from a recording medium on which digital information is recorded by modulation with the channel code of the minimum distance between polarity inversions 3 or greater is quantized by an equalizer having the impulse response of the record/playback system defined by the equation (1) and a timing signal contained in the playback signal. Then a most likely state transition sequence is estimated from state transitions obtained from constraints determined by the impulse response and the minimum distance between polarity inversions to reproduce original digital information.

According to a digital information playback apparatus of the present invention, in a digital information playback apparatus having an A/D converter that converts a playback signal into quantized data, a maximum likelihood decoder that decodes the quantized data to obtain original digital information, and a timing signal extractor that generates a timing signal used in the A/D converter based on phase error information output from the maximum likelihood decoder, the maximum likelihood decoder obtains level fluctuations contained in the playback signal to output into the timing signal extractor as phase error information, and the timing signal extractor calculates phase error amounts to control the phase of the timing signal.

Further, a digital information playback apparatus of the present invention has an A/D converter that converts a playback signal played back from a recording medium into a digital signal sampled at constant intervals with a predetermined clock, a D/D converter that obtains and outputs, from the digital signal and a timing signal output from a timing signal extractor, quantized data in synchronization with a timing signal contained in the playback signal, a maximum likelihood decoder that decodes the quantized data to obtain original digital information, and a timing signal extractor that extracts and outputs, from phase error information output from the maximum likelihood decoder, initial phase information, and initial frequency information, a timing signal contained in the playback signal. The timing signal extractor extracts a timing signal contained in the playback signal from digital data sampled with the predetermined clock to calculate, by digital operations, quantized data in synchronization with the extracted timing signal from the digital data.

A maximum likelihood decoding method of the present invention comprises an n-frequency divider that obtains a timing signal of a frequency 1/n the frequency of a timing signal output from a timing signal extractor, where n is a positive integer greater than 1, a parallel data converter that outputs n values of quantized data output from an A/D converter in alignment with the frequency-divided clock, a BMU that obtains distances between n quantized data values input from the parallel data converter and expected values of partial response equalization, an ACS that performs cumulative summation of each input branch metric and the metric value that represents the likelihood of each state at n time units before, compares the results, and selects likely state transitions from possible state transitions at each time to output the selection results into an SMU, and an SMU that stores the likely state transitions for a predetermined time period and discards the state transitions that cannot continue further because of rules determined by the partial response equalization, to output a survival path.

According to a digital information playback apparatus of the present invention, in a digital information playback apparatus having an A/D converter that converts a playback signal into quantized data, a maximum likelihood decoder that decodes the quantized data to obtain original digital information, and a timing signal extractor that generates a timing signal used in the A/D converter based on phase error information output from the maximum likelihood decoder, the timing signal extractor generates a timing signal with a pre-set center frequency in alignment with an instance when the playback signal reaches a pre-set threshold value after the gate signal that indicates the start of signal processing becomes effective. The timing signal extractor also varies the frequency of the timing signal based on phase error amounts output from the maximum likelihood decoder or a phase comparator, a pre-set amplification factor control signal, and a pre-set center frequency control signal.

Further, according to a digital information playback apparatus of the present invention, in a digital information playback apparatus having an A/D converter that converts a playback signal from a recording medium into quantized data, a maximum likelihood decoder that decodes the quantized data to obtain original digital information, and a timing signal extractor that generates a timing signal with a pre-set center frequency in alignment with an instance when the playback signal reaches a pre-set threshold value after a gate signal that indicates the start of signal processing becomes effective, the frequency of the timing signal is varied based on phase error amounts output from the maximum likelihood decoder, a pre-set amplification factor control signal, and a pre-set center frequency signal. Also, metric values that represent the likelihood of states at one unit time before are set at predetermined initial values after the gate signal becomes effective, until a first quantized data value is input to the maximum likelihood decoder from the A/D converter, and until operations are started at an addition comparison selector in the maximum likelihood decoder.

Further, a digital information playback apparatus of the present invention is equipped with an A/D converter that converts a playback signal into quantized data, a phase comparator that obtains phase error information from the quantized data, and a timing signal extractor that generates a timing signal with a pre-set center frequency in alignment with an instance when the playback signal reaches a pre-set threshold value after a gate signal that indicates the start of signal processing becomes effective. The frequency of the timing signal is varied based on phase error amounts output from the phase comparator, a pre-set amplification factor control signal, and a pre-set center frequency signal.

Further, according to a digital information playback apparatus of the present invention, in a digital information playback apparatus having an A/D converter that converts a playback signal into quantized data, a maximum likelihood decoder that decodes the quantized data to obtain original digital information, and a timing signal extractor that generates a timing signal with a pre-set center frequency in alignment with an instance when the playback signal reaches a pre-set threshold value after a gate signal that indicates the start of signal processing becomes effective, the frequency of the timing signal is varied based on phase error amounts output from the maximum likelihood decoder, a pre-set amplification factor control signal, and a pre-set center frequency signal. Also, the maximum likelihood decoder has path memories of different lengths, obtains different phase error information from different survival path information.

and selects phase error information based on the output of a counter circuit that counts the number of times at which the A/D converter has quantized the playback signal since the gate signal became effective. The maximum likelihood decoder then obtains a phase error amount to output into the timing signal extractor.

Further, according to a digital information playback apparatus of the present invention, in a digital information playback apparatus having an A/D converter that converts a playback signal into quantized data, a maximum likelihood decoder that decodes the quantized data to obtain original digital information, a phase comparator that obtains phase error amounts from the quantized data, and a timing signal extractor that generates a timing signal with a pre-set center frequency in alignment with an instance when the playback signal reaches a pre-set threshold value after a gate signal that indicates the start of signal processing becomes effective, the frequency of the timing signal is varied based on detected phase error amounts, a pre-set amplification factor control signal, and a pre-set center frequency signal. Also, the maximum likelihood decoder selects phase error information from the phase error information of the maximum likelihood decoder and the phase error information of a phase comparator based on the output of a counter circuit that counts the number of times at which an A/D converter has quantized the playback signal since the gate signal became effective. The maximum likelihood decoder then obtains a phase error amount to output into the timing signal extractor.

Further, according to a digital information playback apparatus of the present invention, in a digital information playback apparatus having an A/D converter that converts a playback signal into quantized data, a maximum likelihood decoder that decodes the quantized data to obtain original digital information, and a timing signal extractor that generates a timing signal with a pre-set center frequency in alignment with an instance when the playback signal reaches a pre-set threshold value after a gate signal that indicates the start of signal processing becomes effective, the frequency of the timing signal is varied based on detected phase error amounts, a pre-set amplification factor control signal, and a pre-set center frequency signal. Also, the timing signal extractor varies the coefficient of a digital loop filter based on the output of a counter circuit that counts the number of times at which an A/D converter has quantized the playback signal since the gate signal became effective.

Further, according to a digital information playback apparatus of the present invention, in a digital information playback apparatus having an A/D converter that converts a playback signal into quantized data, a maximum likelihood decoder that decodes the quantized data to obtain original digital information, and a timing signal extractor that generates a timing signal with a pre-set center frequency in alignment with an instance when the playback signal reaches a pre-set threshold value after a gate signal that indicates the start of signal processing becomes effective, the frequency of the timing signal is varied based on detected phase error amounts, a pre-set amplification factor control signal, and a pre-set center frequency signal. Also, the timing signal extractor switches expected values of partial response equalization from fixed initial values to those output from the maximum likelihood decoder when the output of the counter circuit becomes a predetermined value.

BRIEF DESCRIPTION OF THE DRAWINGS

These and other objects and features of the present invention will become clear from the following description taken in conjunction with the preferred of embodiments thereof with reference to the accompanying drawings throughout which like parts are designated by like reference numerals, and in which:

FIGS. 2A, 2B, 2C, 2D and 2E show examples of waveforms for describing the operation of signal processing by the prior optical disk shown in FIG. 1.

FIGS. 9 9A, 9B and 9C) is a block diagram of SMU 20 of the first embodiment of the maximum likelihood decoder.

FIGS. 20A, 20B, 20C, 20D, 20E and 20F illustrate a timing chart of timing extractor 34 in the fourth embodiment according to the present invention.

FIGS. 22A, 22B, 22C, 22D, 22E and 22F are schematic diagrams illustrating the operation of maximum likelihood decoder 33 in the fourth embodiment according to the present invention.

DETAILED DESCRIPTION OF THE PREFERRED EMBODIMENTS

The preferred embodiments according to the present invention will be described below in conjunction with the attached drawings.

A first embodiment of a maximum likelihood decoding method and digital information playback apparatus in accordance with the present invention is described in the following. The channel code is so-called (d, k) run-length-limited code (abbreviated to RLL code hereafter), where d and k are non-negative integers, in particular the code satisfying the minimum run length condition d=2. Recorded bits are obtained from channel bits by NRZI modulation, where NRZI denotes non-return to zero invert. Further, the impulse response h(t) satisfying the following equation (1) is used for equalization.

$$h((2k-1)T/2) = \begin{cases} a, & \text{if } k=-1, \\ b, & \text{if } k=0, \\ c, & \text{if } k=1, \\ d, & \text{if } k=2, \\ 0, & \text{otherwise,} \end{cases} \quad (1)$$

where a, b, c, and d are arbitrary positive constants, k is an integer, and T is the period of the timing signal.

Figure 1:
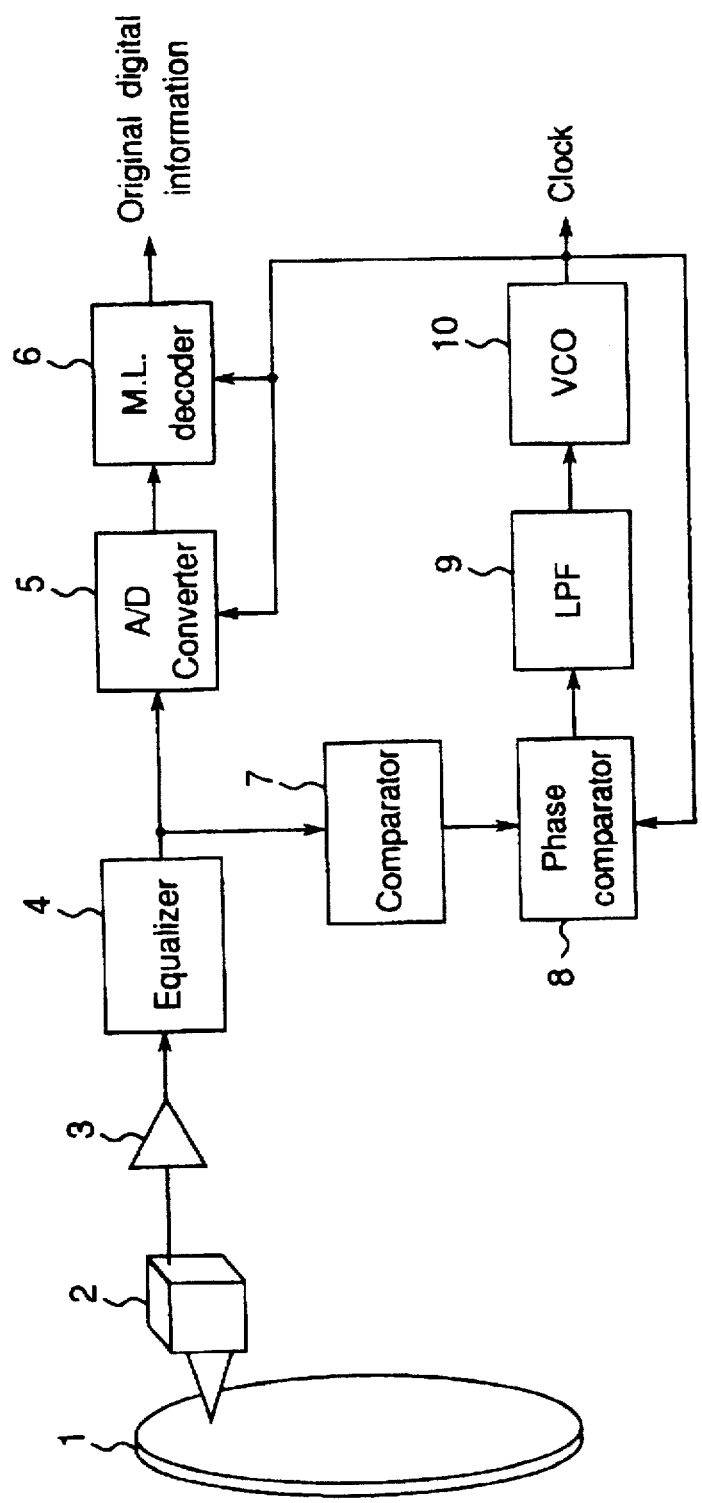
FIG. 1 is a block diagram illustrating a playback-signal processing circuit of a prior optical disk driver.
Figure 3:
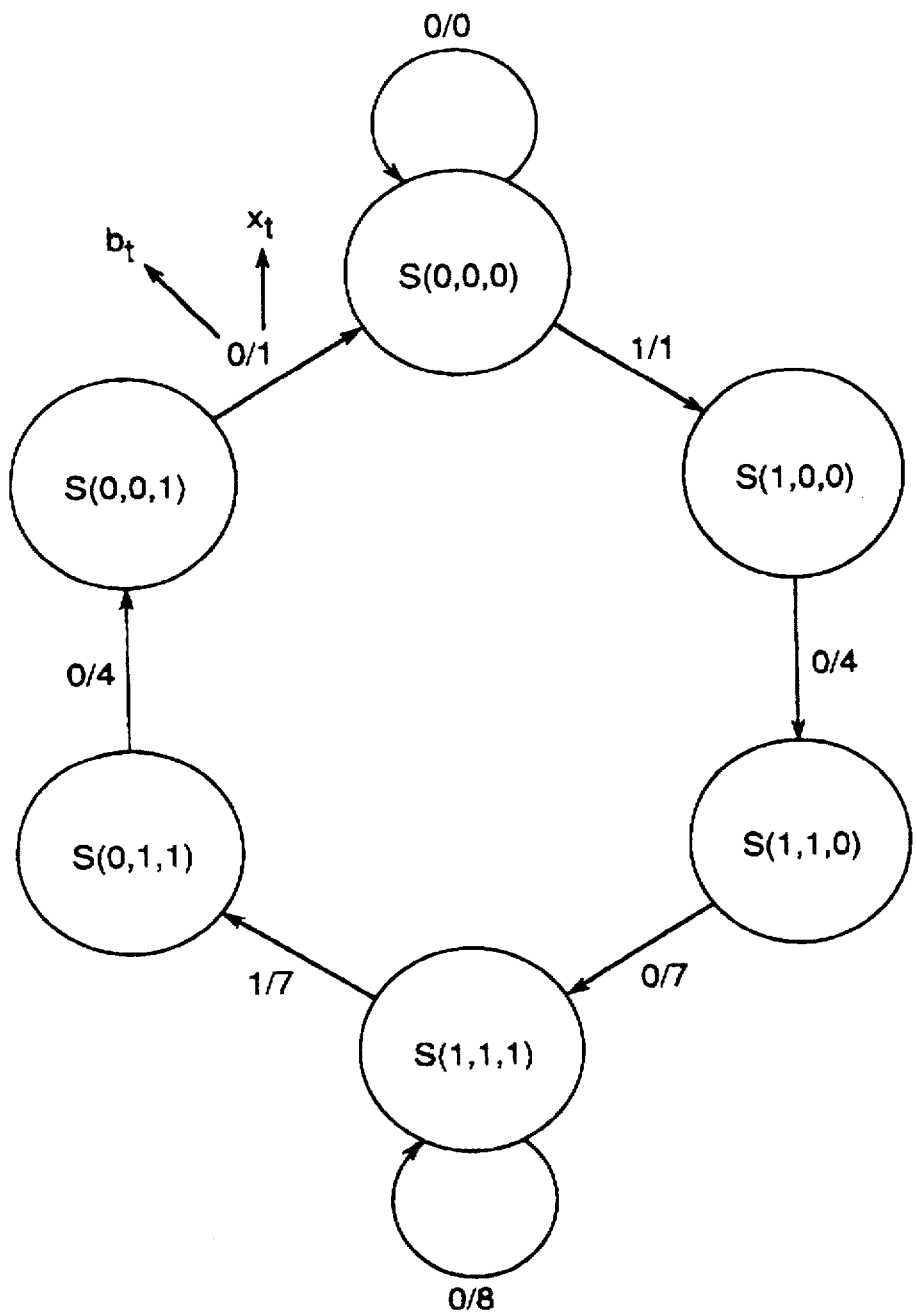
FIG. 3 is a state transition diagram in the case of combining the channel code of the minimum distance between polarity inversions 3 with PR(1, 3, 3, 1) equalization according to a preferred embodiment of the present invention.
Figure 4:
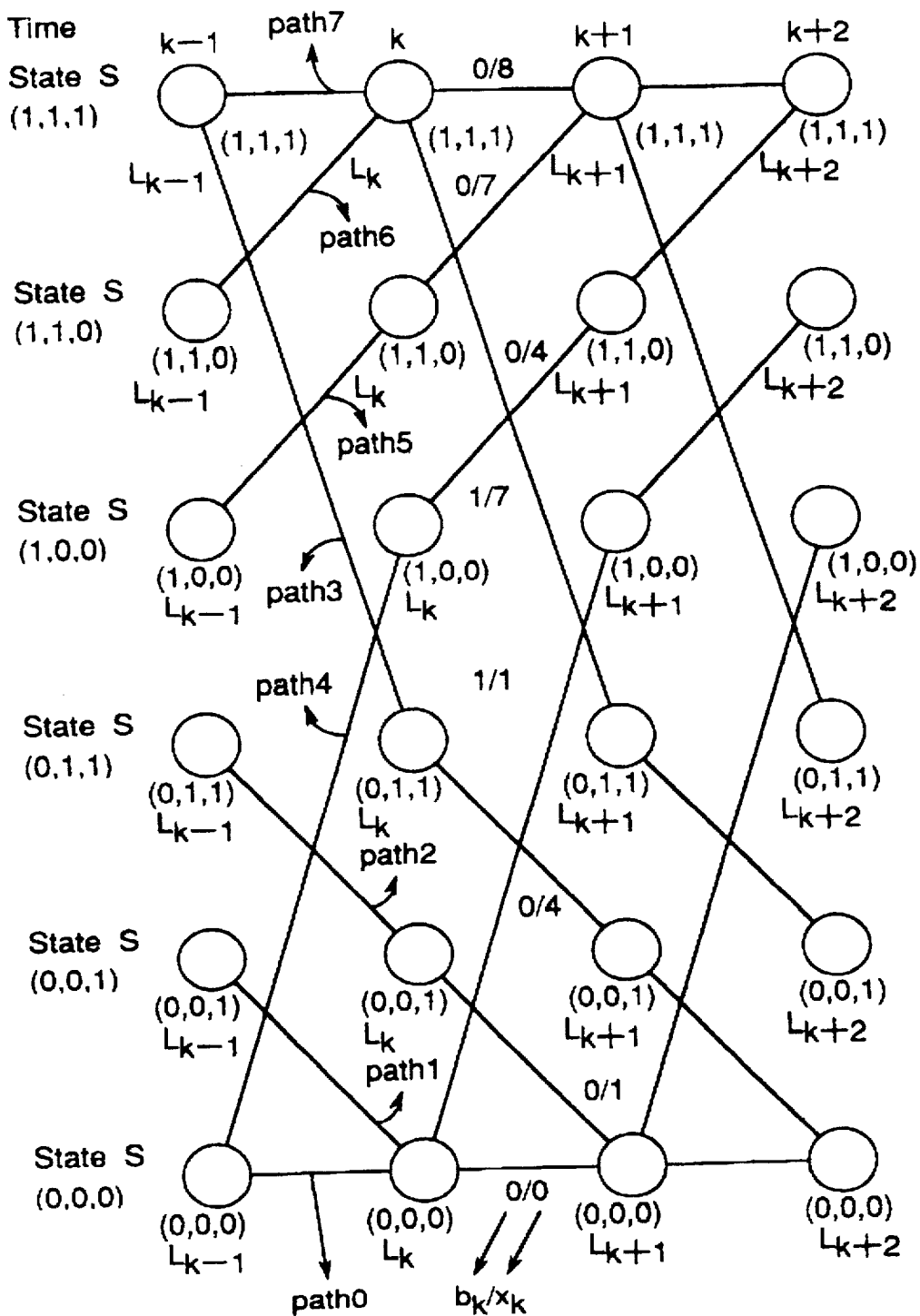
FIG. 4 is a trellis diagram in the case of combining the channel code of the minimum distance between polarity inversions 3 with PR(1, 3, 3, 1) equalization as shown in FIG. 3.

For simplification, the present embodiment employs so-called PR(1, 3, 3, 1) equalization, so that the constants in the impulse response are set as a=d=1, b=c=3. If the channel code of the minimum distance between polarity inversions 3 and PR(1, 3, 3, 1) equalization are combined as in the present embodiment, then the original digital information value $b_t$, where t is a non-negative integer denoting time, and the signal values $X_t$ of the PR equalized output follow the state transition diagram of FIG. 3. In FIG. 3, each state is assigned with a symbol S(1, m, n), which indicates that the recorded bit $c_{t-1}$ at time t−1 is 1, the recorded bit $c_{t-2}$ at time t−2 is m, and the recorded bit $c_{t-3}$ at time t−3 is n, where the value $c_t$ is either 0 or 1 for every t. In the v/u attached to each transition state, v is the original digital information value $b_t$ at t, and u is the expected signal value $X_t$ of the PR equalization output at t. If the state transition diagram of FIG. 3 is expanded over the time axis, then the trellis diagram of FIG. 4 is obtained. If the value obtained as a result of sampling the playback signal with the timing signal extracted from the playback signal is denoted by the value $Y_t$ of the playback signal at t, and if it is taken as an index of expressing the probability of each state necessary for performing maximum likelihood decoding, then maximum likelihood decoding selects state transitions such that the accumulated sum of the square of the difference between $y_t$ and the expected signal value $X_t$ of the PR equalization output becomes the minimum at every time. The accumulated sum at each time is called the metric value. The metric value is denoted by $L_t^{(l, m, n)}$, which is attached to each state of trellis diagram at each time t. At time t, among the possible state transitions from time t−1, a state transition of maximum likelihood is selected. Now, let the possible state transitions be denoted by pathi, i=0, 1, . . . , 7, where each pathi is defined as follows.

Path 7: S(1,1,1)→S(1,1,1), path 6: S(1,1,0)→S(1,1,1), path 5: S(1,0,0)→S(1,1,0), path 4: S(0,0,0)→S(0,0,1), path 3: S(1,1,1)→S(0,1,1), path 2: S(0,1,1)→S(0,0,1), path 1: S(0,0,1)→S(0,0,0), path 0: S(0,0,0)→S(0,0,0).

Then, if the metric values $L_{t-1}^{(l,m,n)}$ of all states at time t−1 and the value $y_t$ of the playback signal at time t are given, then 6 of the 8 possible state transitions are selected. In this way, most likely state transitions are selected by obtaining metric values at each time. The selected results are stored in a register of a predetermined size. Then a state transition sequence that follows the trellis diagram in the time direction is determined. This is a state transition sequence of maximum likelihood, that is, a so-called survival path $p_t$. The original digital information value $b_t$ is uniquely determined from the survival path $p_t$ to achieve maximum likelihood decoding.

Figure 5:
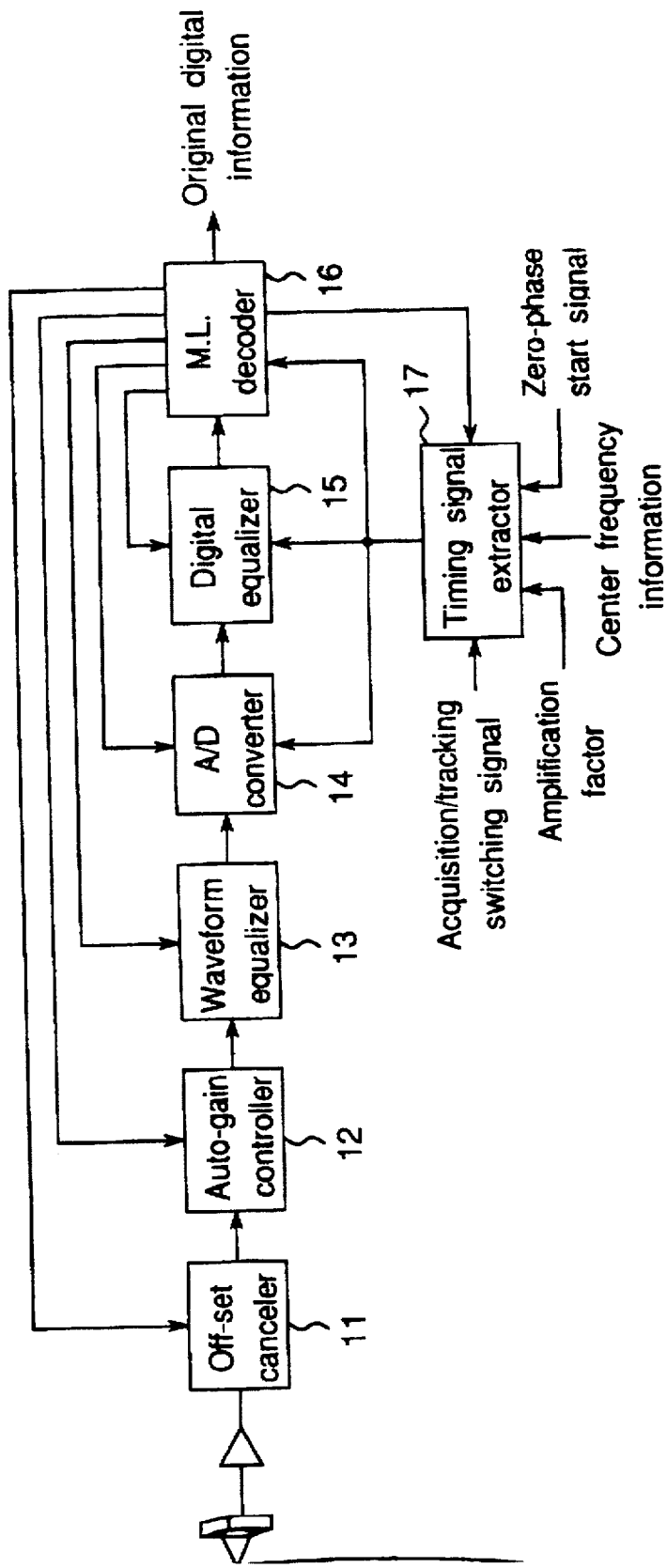
FIG. 5 is a diagram illustrating a digital information playback apparatus in accordance with a preferred embodiment of the present invention.

FIG. 5 is a block diagram illustrating a digital information playback apparatus in accordance with the present invention. A playback signal reproduced from a recording medium is input to an offset canceler 11 that removes the direct current offset component contained in the playback signal. Then the amplitude of the playback signal becomes a predetermined value in an automatic gain controller 12 (abbreviated to AGC here after). Then the waveform of the playback signal is shaped by a waveform equalizer 13 so that the frequency characteristic of the record/playback system and the frequency characteristic of the waveform equalizer coincide with a predetermined PR equalization method. The shaped playback signal is quantized by an A/D converter 14 with a timing signal extracted by a timing signal extractor 17. The quantized data output from A/D converter 14 is equalized by a digital equalizer 15, which compensates for equalization errors that have remained after the equalization by waveform equalizer 13. A maximum likelihood decoder 16 estimates a state transition sequence of maximum likelihood from the input quantized data to reproduce original digital information. Using the decoding results, maximum likelihood decoder outputs phase error information to timing signal extractor 17, offset cancel control information to offset canceler 11, automatic gain control information to AGC 17, waveform equalization error information to waveform equalizer 18, digital equalization error information to digital equalizer 20. Timing signal extractor 22 generates a timing signal based on the phase error information to output to A/D converter 16.

Figure 6:
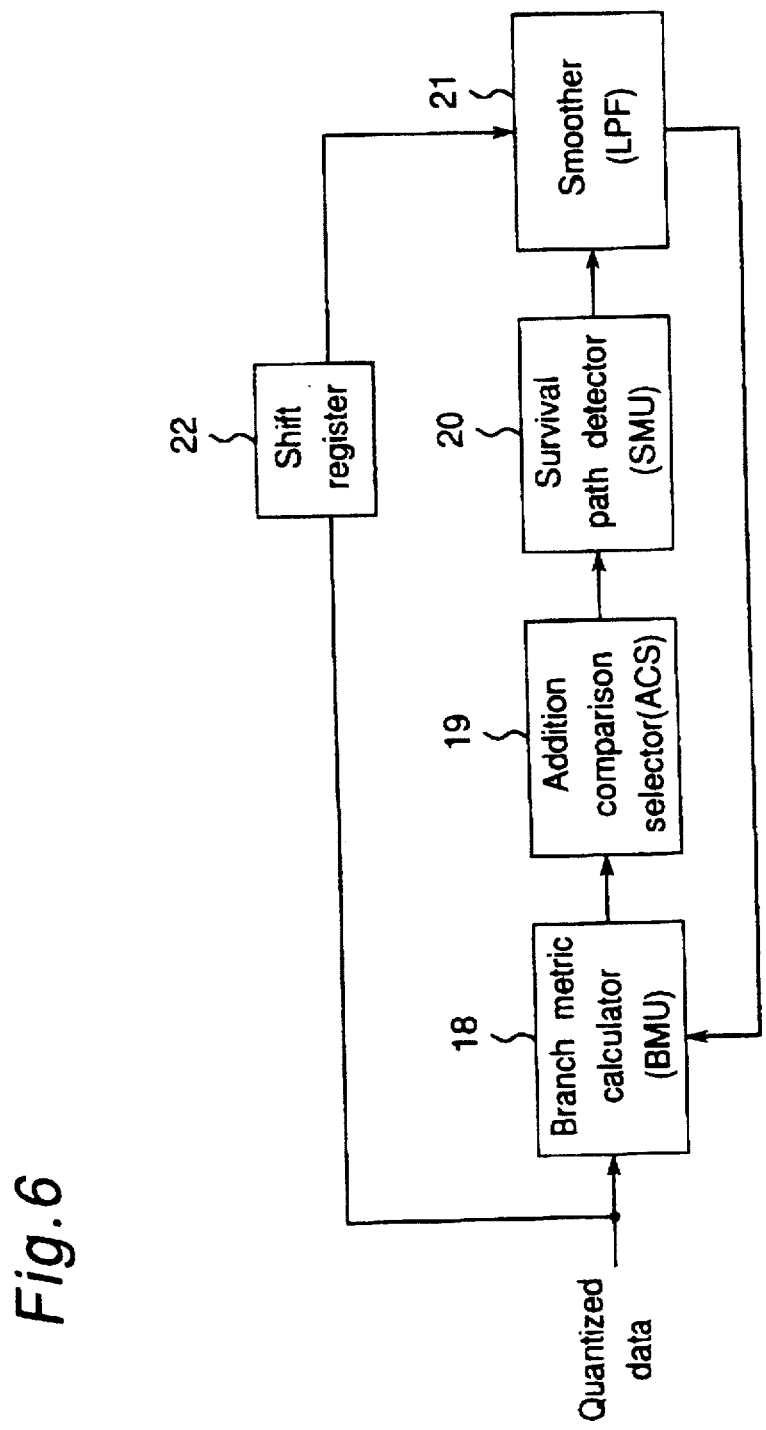
FIG. 6 is a block diagram of a first embodiment of a maximum likelihood decoder of the digital information apparatus in accordance with the present invention.

The operation of each part is described in the following. FIG. 6 is a block diagram of a first embodiment of a maximum likelihood decoding method and a maximum likelihood decoder of digital information apparatus in accordance with the present invention. The operation of the maximum likelihood decoder is described in detail. The maximum likelihood decoder of the present embodiment comprises a branch metric calculator 18 (abbreviated to BMU hereafter), an addition comparison selector 19 (abbreviated to ACS hereafter), a survival path detector 20

(abbreviated to SMU hereafter), a smoother 21 (abbreviated to LPF hereafter), and a shift register 22 (abbreviated to REG hereafter). Let $x_{i,t}$ denote the expected signal values of the 8 PR equalization outputs of LPF 21, where i are the pathi, i=0, 1, ..., 7, of the above 8 possible state transitions, and t is time. The expected signal value $x_{i,t}$ expresses the signal value after PR equalization for each state transition pathi in the response characteristic of the record/playback system. For example, in the case of ideal PR(1, 3, 3, 1) equalization, we have $x_{7,t}=8$, $x_{3,t}=x_{6,t}=7$, $x_{2,t}=x_{5,t}=4$, $x_{1,t}=x_{4,t}=1$, and $x_{0,t}=0$. BMU 18 calculates the so-called branch metric, which is the square of the difference between the value $Y_t$ of the playback signal and each expected signal value $x_{i,t}$ of the PR equalization output, as expressed by the following equation (2).

$$-(y_t-x_{i,t})^2, i=0, 1, \ldots, 7. \quad (2)$$

The method of selecting a state transition of maximum likelihood from time t−1 to time t is described in the following. From (2) we obtain the following equation (3).

$$L_t^{(1,1,1)}=\max[L_{t-1}^{(1,1,1)}-(y_t-x_{7,t})^2, L_{t-1}^{(1,1,0)}-(y_t-x_{6,t})^2],$$
$$L_t^{(1,1,0)}=L_{t-1}^{(1,0,0)}-(y_t-x_{5,t})^2,$$
$$L_t(1,0,0)=L_{t-1}^{(0,0,0)}-(y_t-x_{4,t})^2, \quad (3)$$
$$L_t^{(0,1,1)}=L_{t-1}^{(1,1,1)}-(y_t-x_{3,t})^2,$$
$$L_t^{(0,0,1)}=L_{t-1}^{(0,1,1)}-(y_t-x_{2,t})^2,$$
$$L_t^{(0,0,0)}=\max[L_{t-1}^{(0,0,1)}-(y_t-x_{1,t})^2, L_{t-1}^{(0,0,0)}-(y_t-x_{0,t})^2],$$

where $\max[\alpha, \beta]$ denotes the maximum value of $\alpha$ and $\beta$.

Further, we define the difference $M_{j,t}$ where j=1, 2, ..., 6, between metric values by the following equation (4).

$$M_{1,t}=L_t^{(0,0,0)}-L_t^{(0,0,1)},$$
$$M_{2,t}=L_t^{(0,0,1)}-L_t^{(0,1,1)},$$
$$M_{3,t}=L_t^{(0,0,1)}-L_{t(1,1,1)}, \quad (4)$$
$$M_{4,t}=L_t^{(1,0,0)}-L_{t(0,0,0)},$$
$$M_{5,t}=L_t^{(1,1,0)}-L_{t(1,1,0)},$$

By substituting (3) in (4), we obtain the following equation (5).

$$M_{2,t}=M_{3,t-1}+(y_t-x_{3,t})^2-(y_t-x_{2,t})^2,$$
$$M_{5,t}=M_{4,t-1}+(y_t-x_{4,t})^2-(y_t-x_{5,t})^2,$$

If $M_{1,t-1} \geq (y_t-x_{0,t})^2-(y_t-x_{1,t})^2,$ then $$M_{1,t}=M_{1,t-1}30\ M_{2,t-1}+(y_t-x_{2,t})^2-(y_t-x_{1,t})^2,$$
$$M_{4,t}=(y_t-x_{0,t})^2-(y_t-x_{4,t})^2,$$

If $M_{1,t-1} < (y_t-x_{0,t})^2-(y_t-x_{1,t})^2,$ then $$M_{1,t}=M_{2,t-1}+(y_t-x_{2,t})^2-(y_t-x_{1,t})^2,$$
$$M_{4,t}=M_{1,t-1}+(y_t-x_{1,t})^2-(y_t-x_{4,t})^2, \quad (5)$$

If $M_{6,t-1} \geq (y_t-x_{7,t})^2-(y_t-x_{6,t})^2,$ then $$M_{3,t}=(y_t-x_{7,t})^2,$$
$$M_{6,t}=M_{5,t}+M_{6,t-1}+(y_t-x_{5,t})^2-(y_t-x_{7,t})^2,$$

If $M_{6,t-1} < (y_t-x_{7,t})^2-(y_t-x_{6,t})^2,$ then $$M_{3,t-1}+(y_t-x_{6,t})^2-(y_t-x_{3,t})^2,$$
$$M_{6,t}=M_{5,t-1}+(y_t-x_{5,t})^2-(y_t-x_{6,t})^2.$$

Figure 7:
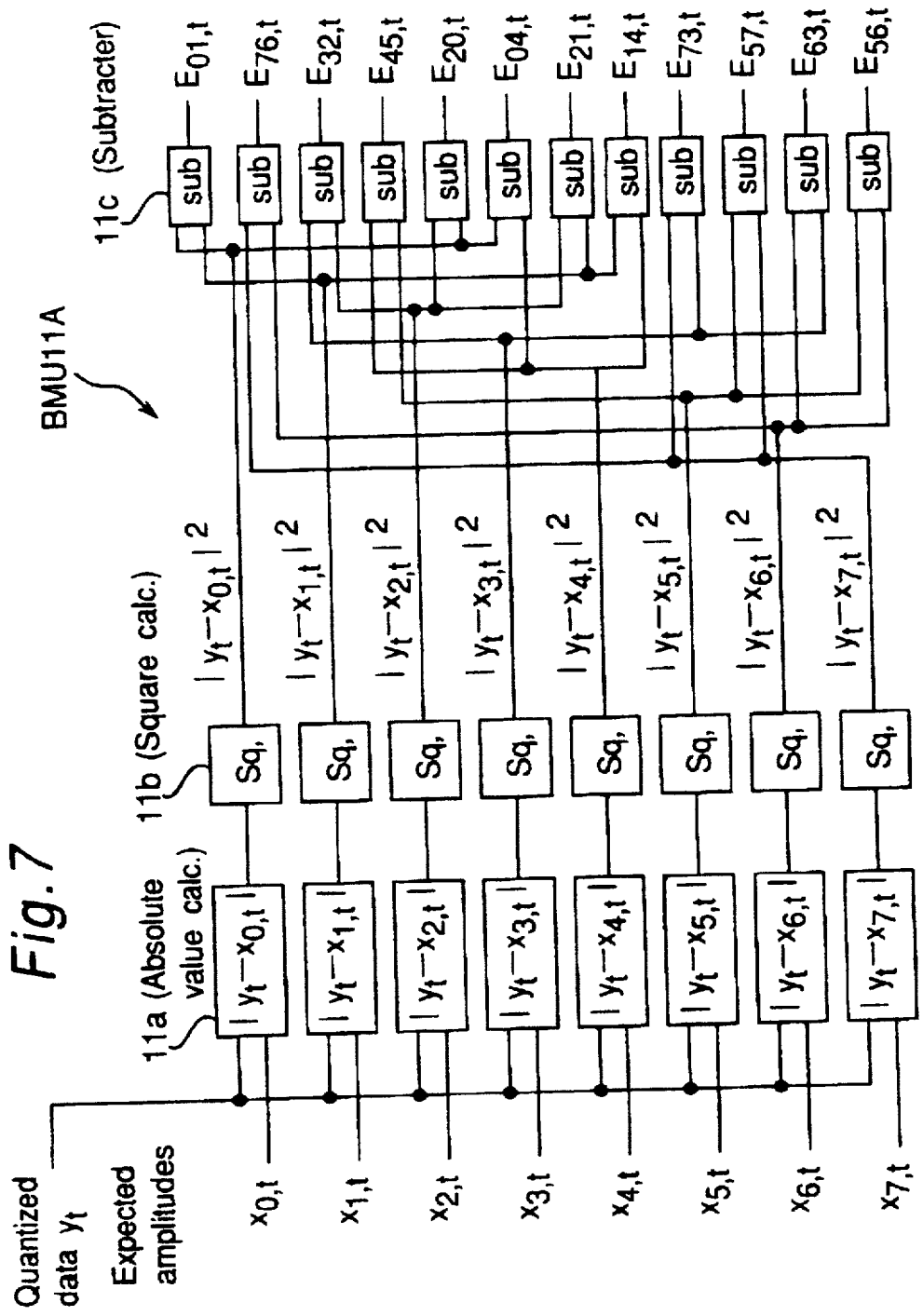
FIG. 7 is a block diagram of BMU 18 of the first embodiment of the maximum likelihoood decoder.

FIG. 7 is a block diagram of BMU 18 of the present embodiment. BMU 18 comprises absolute value calculators, square calculators, and subtracters (sub). It calculates the so-called branch metric, which is the square of the difference between the value $y_t$ of the playback signal and the expected signal value $x_{i,t}$ of the PR equalization output, and further performs the operations of the following equation (6) to output the results E01$_t$, E76$_t$, E32$_t$, E45$_t$, E20$_t$, E04$_t$, E21$_t$, E14$_t$, E57$_t$, E63$_t$, and E56$_t$, into ACS 19.

$$E01_t=(y_t-x_{0,t})^2-(y_t-x_{1,t})^2,$$
$$E76_t=(y_t-x_{7,t})^2-(y_t-x_{6,t})^2,$$
$$E32_t=(y_t-x_{3,t})^2-(y_t-x_{2,t})^2,$$
$$E45_t=(y_t-x_{4,t})^2-(y_t-x_{5,t})^2,$$
$$E20_t=(y_t-x_{2,t})^2-(y_t-x_{0,t})^2, \quad (6)$$
$$E04_t=(y_t-x_{0,t})^2-(y_t-x_{4,t})^2,$$
$$E21_t=(y_t-x_{2,t})^2-(y_t-x_{1,t})^2,$$
$$E14_t=(y_t-x_{1,t})^2-(y_t-x_{4,t})^2,$$
$$E73_t=(y_t-x_{7,t})^2-(y'-x_{3,t})^2,$$
$$E57_t=(y_t-x_{5,t})^2-(y_t-x_{7,t})^2,$$
$$E63_t=(y_t-x_{6,t})^2-(y_t-x_{3,t})^2,$$
$$E56_t=(y_t-x_{5,t})^2-(y_t-x_{6,t})^2,$$

In the present embodiment, the branch metric has been defined as the square of the difference between the value $y_t$ of the playback signal and the expected signal value $x_{i,t}$ of the PR equalization output, as expressed by (2). However (2) can be replaced by the following equation (7), which is the absolute value of the difference between the value $y_t$ of the playback signal and the expected signal value $x_{i,t}$ of the PR equalization output. A square calculator is not necessary in this case, so that the circuitry size can be made smaller.

$$-|y_t-x_{i,t}|, i=0,1, \ldots, 7. \quad (7)$$

Then the equation (3) becomes the following equation (8).

$$L_t^{(1,1,1)}=\max[L_{t-1}^{(1,1,1)}-|y_t-x_{7,t}|, L_{t-1}^{(1,1,0)}-|y_t-x_{6,t}|],$$
$$L_t^{(1,1,0)}=L_{t-1}^{(1,0,0)}-|y_t-x_{5,t}|,$$
$$L_t^{(1,0,0)}=L_{t-1}^{(0,0,0)}-|y_t-x_{4,t}|, \quad (8)$$
$$L_t^{(0,1,1)}=L_{t-1}^{(1,1,1)}-|y_t-x_{3,t}|,$$
$$L_t^{(0,0,1)}=L_{t-1}^{(0,1,1)}-|y_t-x_{2,t}|,$$
$$L_t^{(0,0,0)}=\max[L_{t-1}^{(0,0,1)}-|y_t-x_{1,t}|, L_{t-1}^{(0,0,0)}-|y_t-x_{0,t}|],$$

Figure 8:
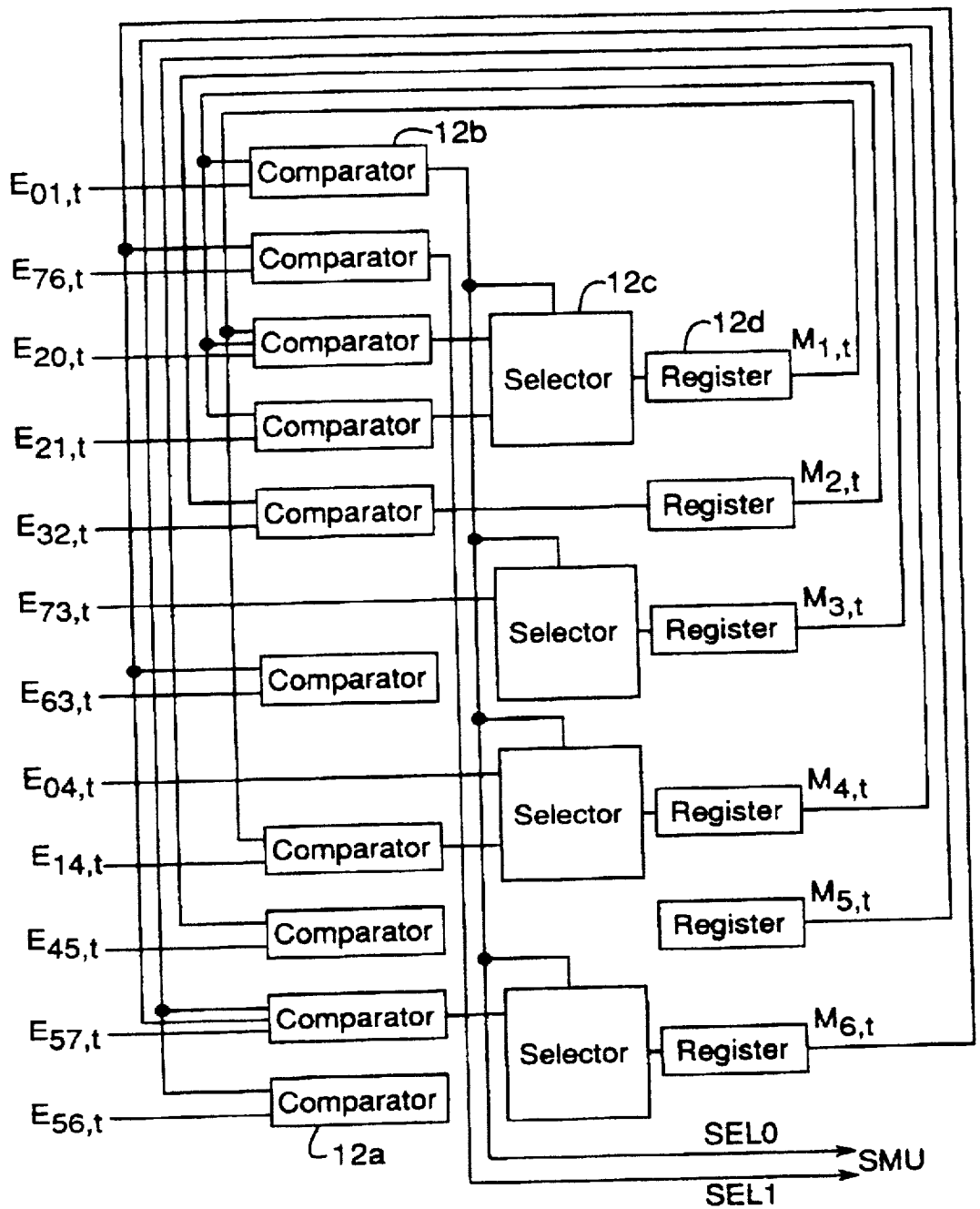
FIG. 8 is a block diagram of ACS 19 of the first embodiment of the maximum likelihood decoder.

FIG. 8 is a block diagram of ACS 19 of the present embodiment. ACS 19 comprises adders (add), comparators (comp), selectors (sel), and registers (reg). ACS 19 stores at each time t the differences $M_{j,t-1}$, j=1, 2, ..., 6, of metric values at time t-1 in the registers. ACS 19 then obtains the differences $M_{j,t}$, j=1, 2, ..., 6, of metric values at time t by the following equation (9) from the input signals $E01_t$, $E76_t$, $E45_t$, $E20_t$, $E04_t$, $E14_t$, $E73_t$, $E63_t$, and $E56_t$, and the differences $M_{j,t-1}$, j =1, 2, ..., 6, of metric values at time t-1 in the registers.

$$M_{2,t}=M_{3,t-1}+E32_t,$$

$$M_{2,t}=M_{3,t-1}+E32_t,$$

$$M_{5,t}=M_{4,t-1}+E45_t,$$

If $M_{1,t-1} \geq E01_t,$ then $$M_{1,t}=M_{1,t-1}+M_{2,t-1}+E20_t,$$

$$M_{4,t}=M_{1,t-1}+E04_t,$$

If $M_{1,t-1} < E01_t,$  (9)

then $$M_{1,t}=M_{2,t-1}+E21_t,$$

$$M_{4,t}=M_{1,t-1}+E14_t,$$

If $M_{6,t-1} \geq E76_t,$ then $$M_{3,t}=E73_t,$$

$$M_{6,t}=M_{5,t-1}+M_{6,t-1}+E57_t,$$

If $M_{6,t-1} < E76_t,$ then $$M_{3,t}=M_{6,t-1}+E63_t,$$

$$M_{6,t}=M_{5,t-1}+E56_t,$$

The values stored in the registers are differences between metric values of two states, so that they are always less than a predetermined value. Therefore, the differences $M_{j,t-1}$, j=1, 2, ..., 6, between metric values can be expressed at a predetermined bit width.

ACS 19 not only obtains differences between metric values but also outputs to SMU 20 2-bit information indicating which of the 8 state transitions it has selected. The signals of these 2 bits are called selection signals, and denoted by SEL0 and SEL2. The concrete operation of ACS 19 is described in the following. ACS 19 always selects path2, path3, path4, path5 at each time. Also, it selects path0 if $M_{1,t-1} \geq E01_t$, and outputs a high-level selection signal bit SEL0 to SMU 20. It selects path1 and outputs a low-level selection signal bit SE0 to SMU 20, if $M_{1,t-1} \leq E01_t$. ACS 19 selects path7 and outputs a high-level selection signal bit SEL1, if $M_{6,t-1} \geq E76_t$. It selects path6 and outputs a low-level selection signal bit SEL1 to SMU 20, if $M_{6,t-1} < E76_t$.

Figure 9B:
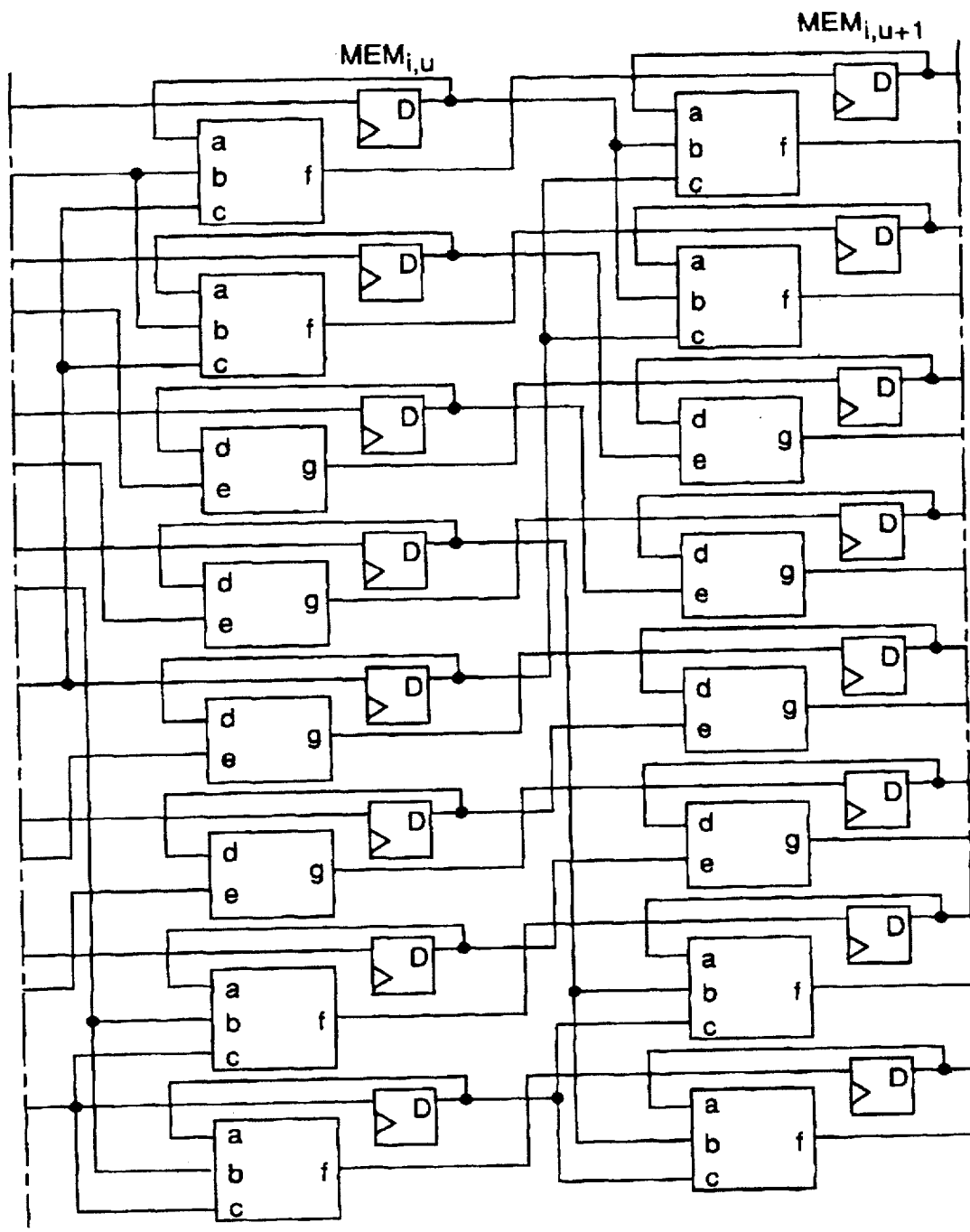
Figure 9C:
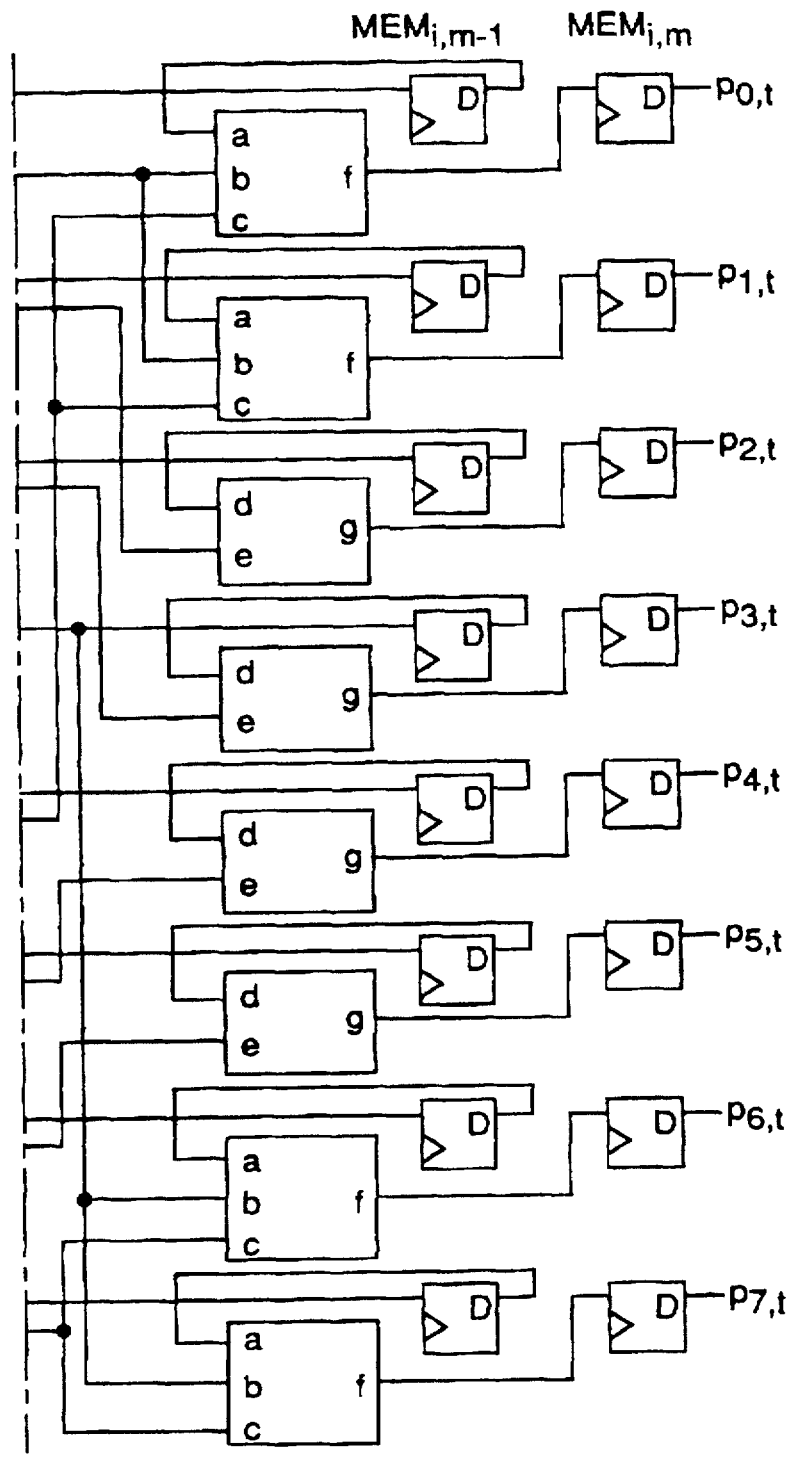

FIG. 9 (FIGS. 9A, 9B and 9C) is a block diagram of SMU 20 of the present embodiment. The operation of SMU 20 is described in detail in the following. SMU 20 has a register (called path memory hereafter) of a size 8× predetermined length (referred to path memory length m hereafter). SMU 20 stores the selection results of state transitions in path memory based on the selection signals input from ACS 19. There are 8 possible state transitions, so that path memory consists of 8×m bits, denoted by $MEM_{i,j}$, where i is path/of state transitions, and j is the bit address taking one of values 1, 2, ..., m. SMU 20 consists of logical circuits A, logical circuits B, and registers. Each logical circuit A outputs a signal f=a·(b∨c) corresponding to three binary input signals a, b, c, where · denotes the logical product, and ∨ denotes the logical sum. Each logical circuit B outputs a signal g=d·e corresponding to the binary input signals d, e. The state transitions that have been selected at time t but do not survive at time t+1 can be discarded from the path memory based on the selection results of the state transitions at time t and at time t+1 by means of the logical circuits A and the logical circuits B. For example, consider the case where high-level selection signal bits SEL0 and SEL1 are input at time t, t+1, and t +2. As described above, it is indicated that path0 and path7 have been selected and path1 or path 6 has not been selected, since the two selection signal bits SEL0 and SEL1 are at high level. When selection signal bits SEL0 and SEL1 are input at time t, SMU 20 stores "1" in path memory bits $MEM_{0,1}$, $MEM_{2,1}$, $MEM_{3,1}$, $MEM_{4,1}$, $MEM_{5,1}$, and $MEM_{7,1}$, and stores "0" at $MEM_{1,1}$ and $MEM_{6,1}$. Here "1" denotes a high-level bit, and "0" denotes a low-level bit. When selection signal bits SEL0 and SEL1 are input at time t+1, SMU 20 stores the data stored in path memory bits $MEM_{0,1}$, $MEM_{1,1}$, $MEM_{2,1}$, $MEM_{3,1}$, $MEM_{4,1}$, $MEM_{5,1}$, $MWM_{6,1}$, and $MEM_{7,1}$, in path memory bits $MEM_{0,2}$, $MEM_{1,2}$, $MEM_{2,2}$, $MEM_{3,2}$, $MEM_{4,2}$, $MEM_{5,2}$, $MEM_{6,2}$, and $MEM_{7,2}$. SMU 20 also stores "1" in path memory bits $MEM_{1,1}$, $MEM_{2,1}$, $MEM_{3,1}$, $MEM_{4,1}$, $MEM_{5,1}$, and $MEM_{7,1}$, and stores "0" at $MEM_{1,1}$ and $MEM_{6,1}$. Further, when selection signal bits SEL0 and SEL1 are input at time t+1, then the input a of a logical circuit A becomes the bit "1" of $MEM_{0,2}$, and the input b of the logical circuit A becomes the bit "1" of $MEM_{0,1}$. The input c of the logical circuit A becomes the bit "1" of $MEM_{4,1}$, so that the output f of the logical circuit A becomes "1," which is stored in $MEM_{0,3}$. Then, the input a of a logical circuit A becomes the bit "0" of $MEM_{1,2}$, and the input b of the logical circuit A becomes the bit "1" of $MEM_{0,1}$. The input c of the logical circuit A becomes the bit "1" of $MEM_{4,1}$, so that the output f of the logical circuit A becomes "0," which is stored in $MEM_{1,3}$. Also, the input d of a logical circuit B becomes the bit "1" of $MEM_{2,2}$, and the input e of the logical circuit B becomes the bit "0" of $MEM_{1,1}$, so that the output g of the logical circuit B becomes "0," which is stored in $MEM_{2,3}$. Then the input d of a logical circuit B becomes the bit "1" of $MEM_{3,2}$, and the input e of the logical circuit B becomes the bit "1" of $MEM_{2,1}$, so that the output g of the logical circuit B becomes "1," which is stored in $MEM_{3,3}$. Then, the input d of a logical circuit B becomes the bit "1" of $MEM_{4,2}$, and the input e of the logical circuit B becomes the bit "1" of $MEM_{5,1}$, so that the output g of the logical circuit B becomes "1," which is stored in $MEM_{4,3}$. Then the input d of a logical circuit B becomes the bit "1" of $MEM_{5,2}$, and the input e of the logical circuit B becomes the bit "0" of $MEM_{6,1}$, so that the output g of the logical circuit B becomes "0," which is stored in $MEM_{5,3}$. Then, the input a of a logical circuit A becomes the bit "0" of $MEM_{6,2}$, and the input b of the logical circuit A becomes the bit "1" of $MEM_{3,1}$. The input c of the logical circuit A becomes the bit "1" of $MEM_{7,1}$, so that the output f of the logical circuit A becomes "0" which is stored in $MEM_{6,3}$. Then, the input a of a logical circuit A becomes the bit "1" of $MEM_{7,2}$, and the input b of the logical circuit A becomes the bit "1" of $MEM_{3,1}$. The input c of the logical circuit A becomes the bit "1" of $MEM_{7,1}$, so that the output f of the logical circuit A becomes "1," which is stored in $MEM_{7,3}$.

By the above operation, path2 and path5 have been discarded from the state transitions from time t to time t+1.

Further, SMU 20 stores the data stored in path memory bits $MEM_{0,1}$, $MEM_{1,1}$, $MEM_{2,1}$, $MEM_{3,1}$, $MEM_{4,1}$, $MEM_{5,1}$, $MWM_{6,1}$, and $MEM_{7,1}$, in path memory bits $MEM_{0,2}$, $MEM_{1,2}$, $MEM_{2,2}$, $MEM_{3,2}$, $MEM_{4,2}$, $MEM_{5,2}$, $MEM_{6,2}$, and $MEM_{7,2}$. SMU 20 also stores "1" in path memory bits $MEM_{0,1}$, $MEM_{2,1}$, $MEM_{3,1}$, $MEM_{4,1}$, $MEM_{5,1}$, and $MEM_{7,1}$, and stores "0" at $MEM_{1,1}$ and $MEM_{6,1}$.

The above operation for the data in path memory bits $MEM_{i,3}$, i=0, 1, . . . , 7, is further performed for $MEM_{i,j}$, j=4, . . . , m. Then only one of the 8 bits $ME_{i,m}$, i=0, 1, . . . , 7, of path memory becomes "1," if the path memory length m is sufficiently large. This memory bit indicates a survival path. As described for the state transition diagram of FIG. 3, if the path memory bit $MEM_{3,m}$ is "1," or the path memory bit $MEM_{4,m}$ is "1," then SMU 20 outputs "1" as the decoding result. Otherwise, SMU 20 outputs "0" as the decoding result. The original digital information signal $b_t$ is obtained in this way.

SMU 13 outputs $P_{i,t}=MEM_{i,m}$, i=0, . . . , 7 that indicate a survival path into LPF 21 at each time t. SMU 13 also provides $P_{i,t}$ to timing signal extractor 17 as phase error information. Using the logical circuits A and the logical circuits B, SMU 20 of the present embodiment discards from the path memory the state transitions that have been selected but do not survive at time t+1 based on the selection results on the state transitions at time t and at time t+1. More generally, SMU 20 may discard from the path memory the state transitions from time t to time t+r that have been selected at time t but do not survive at time t+r, where r is a positive integer, based on the selection results on the state transitions at time t and at time t+r.

In FIG. 6, REG 22 outputs the delayed signal $y_t$ of the playback signal by processing time in BMU 18, ACS 19, and SMU 20 into LPF 21. REG 22 also outputs the $y_t$ into timing signal extractor 13 as phase error information, into offset canceler 11 as offset cancel control information, into automatic gain controller 12 as waveform equalization error information, and into digital equalizer 15 as digital equalization error information.

Figure 10:
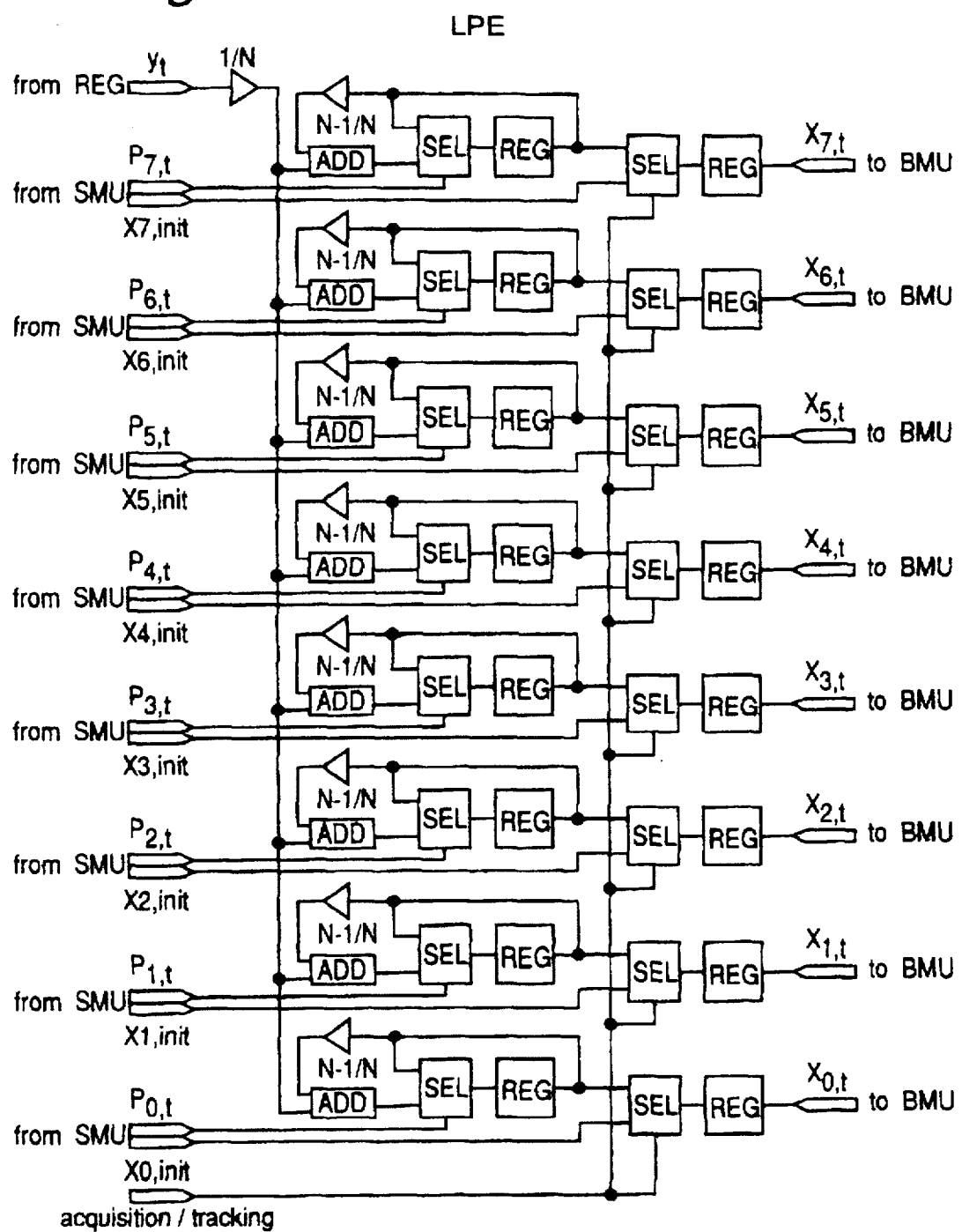
FIG. 10 is block diagram of LPF 21 of the first embodiment of the maximum likelihood decoder.

FIG. 10 is a block diagram of LPF 21 of the present embodiment. The operation of LPF 21 is divided into initializing operation and stationary operation. Initializing operation is the so-called acquisition mode. In the acquisition mode, LPF extracts with high speed a timing signal from a particular pattern recorded on the recording medium and synchronize the playback signal with it. Stationary operation is called the tracking mode. In the tracking mode, LPF extracts a timing signal from the playback signal and yields the playback signal to the timing signal. LPF has registers to store the expected equalized values $x_{7,t}$, $x_{6,t}$, . . . , $x_{0,t}$ and performs the operations defined by the following equation (10) to store the results in the registers.

$$x_{i,t+1}=x_{i,t}, \text{ if } p_{i,t}=0,$$

$$x_{i,t+1} =1/N \times y_t+(N-1)/N \times x_{i,t}, \text{ if } p_{i,t}=1, \quad (10)$$

where N is a positive integer, and i=0, 1, . . . , 7. In initializing operation, LPF 21 outputs into BMU 18 initial 8 expected signal values $x_{7,init}$, $x_{6,init}$, . . . , $x_{0,init}$ given from the outside. In stationary operation, LPF 21 performs the operations of (10) to output into BMU 11 the renewed values of the registers as the 8 expected signal values $x_{7,t}$, $x_{6,t}$, . . . , $x_{0,t}$ of the PR equalization output. This operation detects the response characteristic of the record/playback system from the maximum likelihood decoding results to adaptively change the PR equalization characteristic based on the detected results.

Next the operation of timing signal extractor 17 is described. Timing signal extractor 17 reads the indicators $p_{i,t}$ of the survival path output from SMU 20 and the playback signal value $y_t$ delayed by processing time taken by BMU 18, ACS 19, and SMU 20 to perform the operation of the following equation (11). The calculated results are stored in corresponding registers $level_{i,t}$, i=2, 5.

$$level_{i,t}=level_{i,t}, \text{ if } p_{i,t}=0,$$

$$level_{i,t}=1/N \times y_t+(N-1)/N \times level_{i,t-1},$$

$$\text{if } p_{i,t}=1, \quad (11)$$

where N is a positive integer, and i=2 or 5.

If the timing signal used in A/D converter 14 for quantization has no phase error, and if the equalization characteristic of the record/playback system is the impulse response defined by the equation (1), then $level_{2,t}$ takes the value c+d, which is the signal value at a fall point of the playback signal waveform, and $level_{5,t}$ takes the value a+b, which is the signal value at a rise point of the playback signal waveform. The impulse response is symmetric in the present embodiment, that is, a=d and b=c, so that $level_{2,t} = level_{5,t}$. The phase error amount $phase\_error_t$ is defined by the following equation (12).

$$Phase\_error_t=level_{2,t}-level_{5,t}. \quad (12)$$

Then, when $phase\_error_t$ is positive, the phase of the timing signal is ahead of a sampling position for quantization. When $phase\_error_t$ is negative, the phase of the timing signal is behind a sampling position for quantization.

Therefore, timing signal extractor 17 obtains the VCO control signal $VCOCTL_t$ defined by $$VCOCTL_t = \alpha \times phase\_error_t + \beta \times \sum_{j=0}^{t-1} phase\_error_j, \quad (13)$$

where $\alpha$ and $\beta$ are coefficients of a loop filter, and t=0 is the time when the initial phase information becomes effective. Then timing signal extractor 17 calculates the frequency $f_t$ of the timing signal it outputs by the following equation (14).

$$f_t = f_{center} - GAIN \times VCOCTL_t, \quad (14)$$

where GAIN is the amplification factor of the VCO, and $f_{center}$ is the center frequency. If the impulse response is non-symmetric, the equation (14) is modified to $$f_t = f_{center} - GAIN \times (VCOCTL_t - (a+b-c-d)). \quad (15)$$

The response characteristic of the phase-locked loop can be changed by varying $\alpha$, $\beta$, and GAIN in the acquisition mode from those in the tracking mode, so that synchronization is swiftly achieved in the acquisition mode, and a pull-out can be prevented in the tracking mode. In alignment with an instance when initial phase information, i.e. the so-called zero-phase start signal becomes effective, timing signal extractor 17 outputs a timing signal of the frequency determined by (14) or (15) into A/D converter 14.

Next, the operation of offset canceler 11 is described in the following. Offset canceler 11 reads the indicators $P_{i,t}$ of the survival path output from SMU 20 and the playback signal value $y_t$ delayed by the processing time taken by BMU 18, ACS 19, and SMU 20 to perform the operation of the following equation (11). The calculated results are stored in corresponding registers $level_{i,t}$, i=2, 5. If the timing signal used in A/D converter 14 for quantization has no phase error, and if the equalization characteristic of the record/playback system is the impulse response defined by the equation (1), then $level_{2,t}$ takes the value c+d, which is the signal value at a fall point of the playback signal waveform, and $level_{5,t}$ takes the value a+b, which is the signal value at a rise point of the playback signal waveform. The impulse response is symmetric in the present embodiment, that is, a=d and b=c, so that $level_{2,t}=level_{5,t}$. The offset error amount offset_$error_t$ is defined by the following equation (16).

$$\text{offset\_error}_t = level_{2,t} + level_{5,t} - (a+b+c+d). \quad (16)$$

When offset_$error_t$ is positive, the playback signal is shifted in the positive direction from the center value of the dynamic range of A/D converter 14. When offset_$error_t$ is negative, the playback signal is shifted in the negative direction from the center value of the dynamic range of A/D converter 14.

Therefore, offset canceler 11 obtains the offset control signal OFFSET_$CTL_t$ defined by $$\text{OFFSET\_CTL}_t = \alpha \times \text{offset\_error}_t + \beta \times \sum_{j=0}^{t-1} \text{offset\_error}_j, \quad (17)$$

where $\alpha$ and $\beta$ are coefficients of a loop filter, and t=0 is the time when the initial phase information becomes effective. The offset control signal OFFSET_$CTL_t$ is converted into an analog signal by a D/A converter and amplified by an amplification factor offset_gain. Further, the result is added to the playback signal input to offset canceler 11 to be output to AGC 12. The response characteristic of the feedback loop can be changed by varying $\alpha$, $\beta$, and GAIN in the acquisition mode from those in the tracking mode.

Next, the operation of AGC 12 is described. AGC 12 reads the indicators $p_{i,t}$ of the survival path output from SMU 20 and the playback signal value $y_t$ delayed by the processing time taken by BMU 18, ACS 19, and SMU 20 to perform operation of the following equation (18). The calculated results are stored in corresponding registers $level_{i,t}$, i=0, 7.

$$level_{i,t} = level_{i,t} \text{ if } p_{i,t}=0,$$

$$level_{i,t} = 1/N \times y_t + (N-1)/N \times level_{i,t-1},$$

if $p_{i,t}=1$, \quad (18)

where N is a positive integer, and i=0 or 7.

If the timing signal used in A/D converter 14 for quantization has no phase error, and if the equalization characteristic of the record/playback system is the impulse response defined by the equation (1), then $level_{0,t}$ takes the value 0, which is the signal value at the bottom of the playback signal waveform, and $level_{7,t}$ takes the value a+b+c+d, which is the signal value at the peak of the playback signal waveform. The AGC error amount AGC_$error_t$ is defined by the following equation (19).

$$\text{AGC\_error}_t = level_{7,t} + level_{0,t} - \text{AGC\_init}, \quad (19)$$

where AGC_init is an initially-set predetermined amplitude value of the playback signal. When AGC_$error_t$ is positive, the amplitude value of the playback signal is greater than the predetermined amplitude value. When AGC_$error_t$ is negative, the amplitude value of the playback signal is less than the predetermined amplitude value.

Therefore, AGC 12 obtains the AGC control signal AGC_$CTL_t$ defined by $$\text{AGC\_CTL}_t = \alpha \times \text{AGC\_error}_t + \beta \times \sum_{j=0}^{t-1} \text{AGC\_error}_j, \quad (20)$$

where $\alpha$ and $\beta$ are coefficients of a loop filter, and t=0 is the time when the initial phase information becomes effective.

The AGC control signal AGC_$CTL_t$ is converted into an analog signal by a D/A converter and amplified by an amplification factor AGC_gain. Then AGC 12 obtains the variable gain amplifier control voltage $VGA_t$ defined by the following equation (21).

$$VGA_t = VGAinit - AGC\_gain \times AGC\_CTL_t. \quad (21)$$

Then, AGC 12 outputs the playback signal amplified by the gain determined by the equation (21) into waveform equalizer 13. The response characteristic of the feed-back loop can be changed by varying $\alpha$, $\beta$, and AGC_gain in the acquisition mode from those in the tracking mode.

Next, the operation of waveform equalizer 13 is described. Waveform equalizer 13 reads the indicators $P_{i,t}$ of the survival path output from SMU 20 and the playback signal value $y_t$ delayed by the processing time taken by BMU 18, ACS 19, and SMU 20 to perform operation described in the following and stores the results in corresponding registers $level_{i,t,3T}$, $level_{i,t,4T}$, i=1, 4, 6, 3.

If the survival path from time t−1 to t+1 is indicated by $p_{i,t}$ as shown by the following table 1-a, TABLE 1-a

| i | 0 | 1 | 2 | 3 | 4 | 5 | 6 | 7 |
|---|---|---|---|---|---|---|---|---|
| $p_{i,t-1}$ | 0 | 0 | 1 | 0 | 0 | 0 | 0 | 0 |
| $p_{i,t}$ | 0 | 1 | 0 | 0 | 0 | 0 | 0 | 0 |
| $p_{i,t+1}$ | 0 | 0 | 0 | 0 | 1 | 0 | 0 | 0 | then $$level_{1,t,3T} = 1/N \times y_t + (N-1)/N \times level_{1,t-1,3T}, \quad (22\text{-a})$$

otherwise, $$level_{1,t,3T} = level_{1,t-1,3T}.$$

where N is a positive integer. If the survival path from time t−1 to t+1 is indicated by $p_{i,t}$ as shown by the following table 1-b, TABLE 1-b

| i | 0 | 1 | 2 | 3 | 4 | 5 | 6 | 7 |
|---|---|---|---|---|---|---|---|---|
| $p_{i,t-1}$ | 0 | 1 | 0 | 0 | 0 | 0 | 0 | 0 |
| $p_{i,t}$ | 0 | 0 | 0 | 0 | 1 | 0 | 0 | 0 |
| $p_{i,t+1}$ | 0 | 0 | 0 | 0 | 0 | 1 | 0 | 0 | then $$level_{4,t,3T} = 1/N \times y_t + (N-1)/N \times level_{4,t-1,3T}, \quad (22\text{-b})$$

otherwise, $$level_{4,t,3T} = level_{4,t-1,3T}.$$

If the survival path from time t−1 to t+1 is indicated by $p_{i,t}$ as shown by the following table 1-c, TABLE 1-c

| i | 0 | 1 | 2 | 3 | 4 | 5 | 6 | 7 |
|---|---|---|---|---|---|---|---|---|
| $p_{i,t-1}$ | 0 | 0 | 0 | 0 | 0 | 1 | 0 | 0 |
| $p_{i,t}$ | 0 | 0 | 0 | 0 | 0 | 0 | 1 | 0 |
| $p_{i,t+1}$ | 0 | 0 | 0 | 1 | 0 | 0 | 0 | 0 | then $$level_{6,t,3T} = 1/N \times y_t + (N-1)/N \times level_{6,t-1,3T}, \quad (22\text{-c})$$

otherwise, $$level_{6,t,3T} = level_{6,t-1,3T}$$

If the survival path from time t−1, to t+1 is indicated by $p_{i,t}$ as shown by the following table 1-d, TABLE 1-d

| i | 0 | 1 | 2 | 3 | 4 | 5 | 6 | 7 |
|---|---|---|---|---|---|---|---|---|
| $p_{i,t-1}$ | 0 | 0 | 0 | 0 | 0 | 0 | 1 | 0 |
| $p_{i,t}$ | 0 | 0 | 0 | 1 | 0 | 0 | 0 | 0 |
| $p_{i,t+1}$ | 0 | 0 | 1 | 0 | 0 | 0 | 0 | 0 | then $$level_{3,t,3T} = 1/N \times y_t + (N-1)/N \times level_{3,t-1,T} \quad (22\text{-d})$$

otherwise, $$level_{4,t,3T} = level_{4,t-1,3T}$$

If the survival path from time t−1 to t+1 is indicated by $P_{i,t}$ as shown by the following table 1-e, TABLE 1-e

| i | 0 | 1 | 2 | 3 | 4 | 5 | 6 | 7 |
|---|---|---|---|---|---|---|---|---|
| $p_{i,t-1}$ | 0 | 0 | 1 | 0 | 0 | 0 | 0 | 0 |
| $p_{i,t}$ | 0 | 1 | 0 | 0 | 0 | 0 | 0 | 0 |
| $p_{i,t+1}$ | 1 | 0 | 0 | 0 | 0 | 0 | 0 | 0 | then $$level_{1,t,4T} = 1/N \times y_t + (N-1)/N \times level_{1,t-1,4T} \quad (22\text{-e})$$

otherwise, $$level_{1,t,4T} = level_{1,t-1,4T}$$

If the survival path from time t−1 to t is indicated by $p_{i,t}$ as shown by the following table 1-f, TABLE 1-f

| i | 0 | 1 | 2 | 3 | 4 | 5 | 6 | 7 |
|---|---|---|---|---|---|---|---|---|
| $p_{i,t-1}$ | 1 | 0 | 0 | 0 | 0 | 0 | 0 | 0 |
| $p_{i,t}$ | 0 | 0 | 0 | 0 | 1 | 0 | 0 | 0 |
| $p_{i,t+1}$ | 0 | 0 | 0 | 0 | 0 | 1 | 0 | 0 | then $$level_{4,t,4T} = 1/N \times y_t + (N-1)/N \times level_{4,t-1,4T} \quad (22\text{-f})$$

otherwise, $$level_{4,t,4T} = level_{4,t-1,4T}$$

If the survival path from time t−1 to t+1 is indicated by $p_{i,t}$ as shown by the following table 1-g, TABLE 1-g

| i | 0 | 1 | 2 | 3 | 4 | 5 | 6 | 7 |
|---|---|---|---|---|---|---|---|---|
| $p_{i,t-1}$ | 0 | 0 | 0 | 0 | 0 | 1 | 0 | 0 |
| $p_{i,t}$ | 0 | 0 | 0 | 0 | 0 | 0 | 1 | 0 |
| $p_{i,t+1}$ | 0 | 0 | 1 | 0 | 0 | 0 | 0 | 0 | then $$level_{6,t,4T} = 1/N \times y_t + (N-1)/N \times level_{6,t-1,4T} \quad (22\text{-g})$$

otherwise, $$level_{6,t,4T} = level_{6,t-1,4T}$$

If the survival path from time t−1 to t+1 is indicated by $p_{i,t}$ as shown by the following table 1-h.

TABLE 1-h

| i | 0 | 1 | 2 | 3 | 4 | 5 | 6 | 7 |
|---|---|---|---|---|---|---|---|---|
| $p_{i,t-1}$ | 0 | 0 | 0 | 0 | 0 | 0 | 0 | 1 |
| $p_{i,t}$ | 0 | 0 | 0 | 1 | 0 | 0 | 0 | 0 |
| $p_{i,t+1}$ | 0 | 0 | 1 | 0 | 0 | 0 | 0 | 0 | then $$level_{3,t,4T} = 1/N \times y_t + (N-1)/N \times level_{3,t-1,4T} \quad (22\text{-h})$$

otherwise, $$level_{4,t,3T} = level_{4,t-1,3T}$$

If the timing signal used in A/D converter 14 for quantization has no phase error, and if the equalization characteristic of the record/playback system is the impulse response defined by the equation (1), then $level_{1,t,3T}$, $level_{4,t,3T}$, $level_{1,t,4T}$, and $level_{4,t,4T}$ take the value a of the playback signal, and $level_{6,t,3T}$, $level_{3,t,3T}$, $level_{6,t,4T}$, and $level_{3,t,4T}$ take the value a+b+c of the playback signal. The waveform equalization error EQ_error$_t$ is defined by $$EQ\_error_t = (level_{6,t,3T} + level_{3,t,3T} - level_{1,t,3T} - level_{4,t,3T}) - \quad (23)$$

$$(level_{6,t,4T} + level_{3,t,4T} - level_{1,t,4T} - level_{4,t,4T}).$$

When the waveform equalization error EQ_error$_t$ is negative, waveform equalization is not sufficiently performed by a predetermined partial response method, and the waveform equalization amount at a high band, called boost amount hereafter, is insufficient. When the waveform equalization error EQ_error$_t$ is positive, waveform equalization is not sufficiently performed by a predetermined partial response method, and the boost amount is excessive.

Therefore, waveform equalizer 13 obtains the waveform equalization control signal EQ_CTL$_t$ defined by the following equation (24).

$$EQ\_CTL_t = \alpha \times EQ\_error_t + \beta \times \sum_{j=0}^{t-1} EQ\_error_j, \quad (24)$$

where α and β are coefficients of a loop filter, and t=0 is the time when the initial phase information becomes effective. The waveform equalization control signal EQ_CTL$_t$ is converted into an analog signal by a D/A converter. Then waveform equalizer 13 outputs into A/D converter 14 the playback signal waveform-equalized with the boost amount EQ$_t$ determined by the following equation (25), $$EQ_t 32 EQinit - EQ\_gain \times EQ\_CTL_t, \quad (25)$$

where EQinit is a predetermined initial boost amount, and EQ_gain is an amplification factor. The response characteristic of the feed-back loop can be changed by varying α, β, and EQ_gain in the acquisition mode from those in the tracking mode.

Next, the operation of digital equalizer 15 is described. Digital equalizer 15 reads the indicators $p_{i,t}$ of the survival path output from SMU 20 and the playback signal value $y_t$ delayed by the processing time taken by BMU 18, ACS 19, and SMU 20 to perform the same operation defined by (22-a) to (22-h) and stores the results in corresponding registers $level_{i,t,3T}$ and $level_{i,t,4T}$, i=1, 4, 6, 3. Digital equalizer 15 has a symmetric FIR filter having three taps, and determines the coefficient $FIR_t$ by $$FIR_t = FIRinit - FIR\_gain \times EQ\_CTL_t,  \quad (25')$$

where FIRinit is a predetermined initial coefficient, $EQ\_CTL_t$ is the waveform control signal $EQ\_CTL_t$ defined by the equations (23) and (24), and FIR_gain is an amplification factor. Then, digital equalizer 15 filters the input signal with the filter coefficient $FIR_t$ and outputs the filtered quantized data into maximum likelihood decoder 14. The response characteristic of the feedback loop can be changed by varying $\alpha$, $\beta$, and FIR_gain in the acquisition mode from those in the tracking mode.

Figure 11:
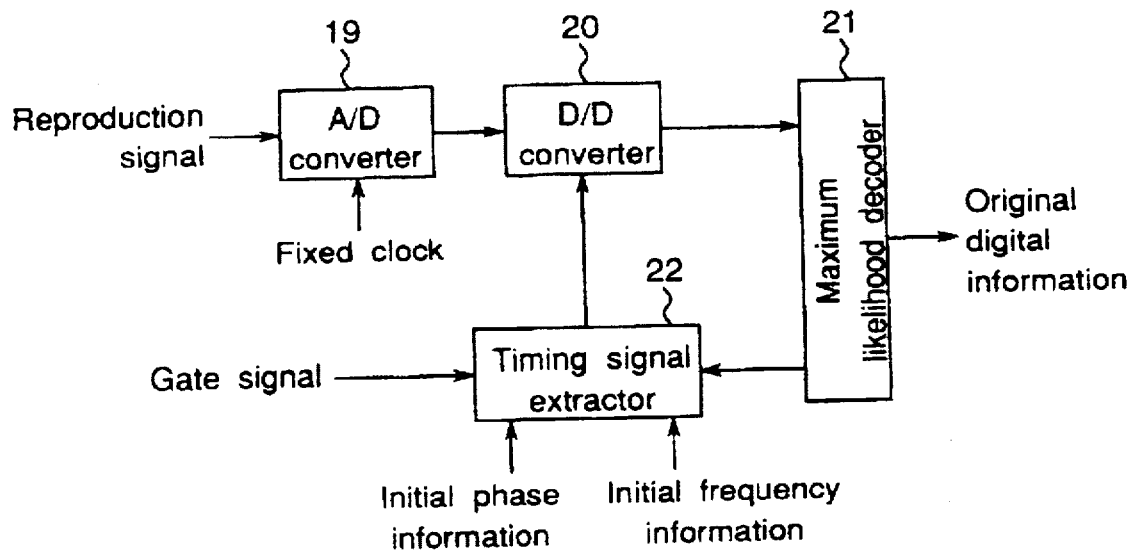
FIG. 11 is a block diagram of a second embodiment of digital information apparatus in accordance with the present invention.

FIG. 11 is a block diagram of a second embodiment of digital information apparatus in accordance with the present invention.

A playback signal reproduced from a recording medium is over-sampled by an A/D converter 23 with a fixed clock input thereto. The sampled data is requantized by a D/D converter 24 with a timing signal input from a timing signal extractor 25, so that quantized data synchronous with a timing signal contained in the playback signal is output into a maximum likelihood decoder 26. Maximum likelihood decoder 26 estimates a most likely state transition from the input quantized data to output original digital information. Maximum likelihood decoder 26 also obtains phase error information from the decoded results to output into timing signal extractor 25. Timing signal extractor 25 calculates a phase error amount from the phase error information. Timing signal extractor 25 then obtains an oscillation frequency from the initial phase, referred to init_timing hereafter, the initial frequency, referred to init_interval hereafter, and the phase error amount to output into D/D converter 24.

The operation of the present embodiment is described in more detail. Timing signal extractor 25 reads the indicators $p_{i,t}$ of the survival path output from SMU 20 and the playback signal value $y_t$ delayed by the processing time taken by BMU 18, ACS 19, and SMU 20 to perform the operation defined by the equation (11) and stores the results in corresponding registers $level_{i,t}$, i =2, 5.

If the timing signal used in D/D converter 24 for quantization has no phase error, and if the equalization characteristic of the record/playback system is the impulse response defined by the equation (1), then $level_{2,t}$ takes the value c+d, which is the signal value at a fall point of the playback signal waveform, and $level_{5,t}$ takes the value a+b, which is the signal value at a rise point of the playback signal waveform. The impulse response is symmetric in the present embodiment, that is, a=d and b=c, so that $level_{2,t} = level_{5,t}$. The phase error amount phase_error$_t$ is defined by the equation (12). Then, when phase_error$_t$ is positive, the phase of the timing signal is ahead of a sampling position for quantization. When phase_error$_t$ is negative, the phase of the timing signal is behind a sampling position for quantization.

Therefore, timing signal extractor 17 obtains the VCO control signal VCOCTL$_t$ defined by the equation (13). Then timing signal extractor 25 calculates the set frequency interval$_t$ of the timing signal by the following equation (26).

$$interval_t = \frac{init\_interval}{1 - GAIN \times VCOCTL_t \times init\_interval} \quad (26)$$

where GAIN is the amplification factor of the VCO, and $f^{center}$ is the center frequency. If the impulse response is non-symmetric, the equation (26) is modified to $$interval_t = \frac{init\_interval}{1 - GAIN \times (VCOCTL_t - (a+b-c-d)) \times init\_interval} \quad (27)$$

Further, timing signal extractor 25 calculates the time timing, of the timing signal by the following equation (28) to output into D/D converter 24.

$$timing_t = timing_{t-1} + interval_t \quad (28)$$

where $timing_0$ = init_timing.

Let $z_j$, j=1, 2, . . . , denote the sampled results obtained by A/D converter 23 from the playback signal with a fixed clock of period T. D/D converter 24 obtains the quantized playback signal value $y_t$ from the sampled results $z_j$ and the timing signal timing, by the following equation (29).

$$Y_t = \frac{timing_t - T \times (m-1)}{T} \times z_m + \frac{-timing_t + T \times m}{T} \times z_{m-1} \quad (29)$$

where m is the positive integer such that $T \times (m-1) \leq timing_t < T \times m$. In this way the present embodiment can extract an accurate timing signal from the playback signal and can yield the quantized playback signal to the timing signal. Further, the present embodiment does not require adjustments that have been necessary for prior apparatus constructed by analogue circuits, since the present embodiment can realize all operation by digital processing.

In the first and second embodiments, the maximum likelihood decoder selected most likely state transitions from state transitions from time t−1 to time t for each state at time t in the trellis diagram shown in FIG. 4. Similarly, considering each state at time t−1, a maximum likelihood decoder can select most likely state transitions from state transitions from time t−2 to time t−1 for each state at time t−1. Therefore, a maximum likelihood decoder can select most likely state transitions from state transitions from time t−2 to time t for each state at time t. In general, a maximum likelihood decoder can select most likely state transitions from state transitions from time t−n to time t for each state at time t, where n is a positive integer.

Figure 12:
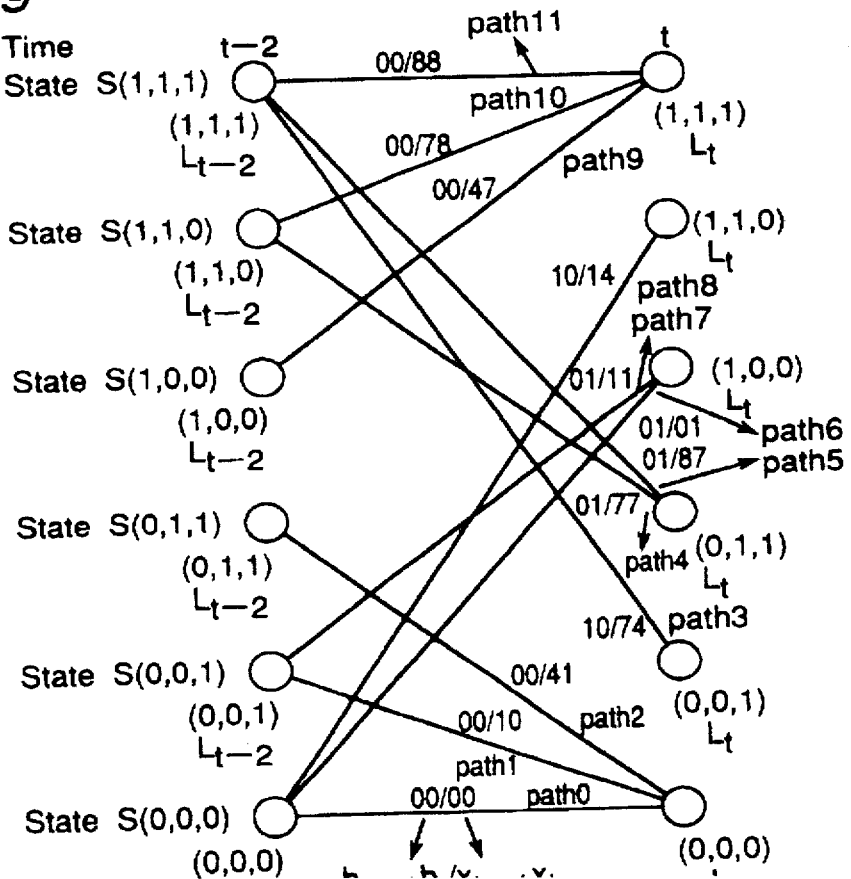
FIG. 12 is a state transition diagram illustrating state transitions from time t−b 2to time t in the case of combining the channel code of the minimum distance between polarity inversions 3 with PR(1, 3, 3, 1) equalization in accordance the present invention.

Now, a third embodiment of digital information playback apparatus in which n=2 is described. As shown in FIG. 3, there are 8 possible state transitions from time t−1 to time t. In the case of n=2, there are 12 possible state transitions from time t−2 to time t as shown in FIG. 12. Let the possible state transitions be denoted by pathi, i=0, 1, . . . , 11. Then, if the metric values $L_{t-1}^{(l,m,n)}$ of all states at time t−2, the quantized value $y_t$ of the playback signal at time t, and the quantized value $y_{t-1}$ at time t−1 are given, then 6 of the 12 possible state transitions are selected. Let the possible 12 state transitions be denoted as follows.

Path11: S(1,1,1)→S(1,1,1), path10: S(1,1,0)→S(1,1,1), path9: S(1,0,0)→S(1,1,1), path8: S(0,0,0)→S(1,1,0), path7: S(0,0,1)→S(1,0,0), path6: S(0,0,0)→S(1,0,0), path5: S(1,1,1)→S(0,0,1), path4: S(1,1,0)→S(0,1,1), path3: S(1,1,1)→S(0,0,1), path2: S(0,1,1) →S(0,0,0), path1: S(0,0,1)→S(0,0,0), path0: S(0,0,0)→S(0,0,0).

Then by obtaining the metric value $L_{t-2}^{(l,m,n)}$ and $L_t^{(l,m,n)}$ for all states S(l,m,n), the maximum likelihood decoder of the present embodiment selects most likely state transitions to store the results in a register of a predetermined length. Then a state transition sequence that follows the trellis diagram in the time direction is determined. This is a state transition sequence of maximum likelihood, that is, a so-called survival path $p_t$. The original digital information values $b_t$ and $b_{t-1}$ are uniquely determined from the survival path $p_t$ to realize maximum likelihood decoding every two time units.

Figure 13:
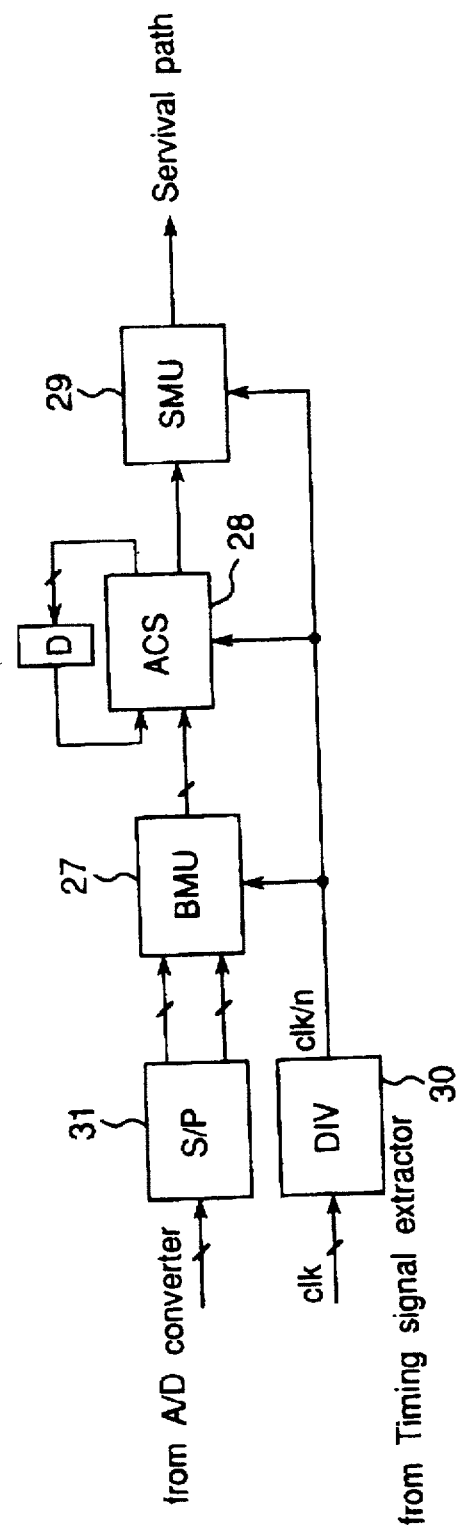
FIG. 13 is a block diagram of a third embodiment of the maximum likelihood decoder in accordance with the present invention.

FIG. 13 is a block diagram of the maximum likelihood decoder in the third embodiment. The maximum likelihood decoder comprises a BMU 27, an ACS 28, an SMU 29, a divider 30 that produces a timing signal of the frequency 1/n the frequency of a timing signal output from a timing signal extractor, and a parallel data converter 31 that outputs n pieces of quantized data input from an A/D converter in alignment with the n-frequency-divided timing signal.

The operation of the maximum likelihood decoder in the third embodiment is described in detail in the following. BMU 27 receives the quantized values $y_t$, $y_{t-1}$ of the playback signal and 8 expected values $x_{i,t}$, i=0, 1, ..., 7, of partial response equalization. BMU 27 calculates the branch metric, which is the absolute value of the difference between each of the values $y_t$, $y_{t-1}$ of the playback signal and each expected signal value $x_{i,t}$ of PR equalization, as expressed by the following equation (30).

$$-|y_t - x_{i,t}|, \ i=0, 1, \ldots, 7,$$
$$-|y_{t-1} - x_{i,t}|, \ i=0, 1, \ldots, 7. \quad (30)$$

The expected values $x_{i,t}$ of partial response equalization express the signal values after PR equalization in the response characteristic of the record/playback system. For example, in the case of ideal PR(1, 3, 3, 1) equalization, we have $x_7=8$, $x_3=x_6=7$, $x_2=x_5=4$, $x_{1}=x_4=1$, and $x_0=0$.

The method of selecting most likely state transitions from time t−2 to time t is described in the following. From (30) we obtain the following equation (31).

$$L_t^{(1,1,1)} = \max[L_{t-1}^{(1,1,1)} - |y_t - x_7|, L_{t-1}^{(1,1,0)} - |y_t - x_6|],$$
$$L_t^{(1,1,0)} = L_{t-1}^{(1,0,0)} - |y_t - x_5|,$$
$$L_t^{(1,0,0)} = L_{t-1}^{(0,0,0)} - |y_t - x_4|, \quad (31)$$
$$L_t^{(0,1,1)} = L_{t-1}^{(1,1,1)} - |y_t - x_3|,$$
$$L_t^{(0,0,1)} = L_{t-1}^{(0,1,1)} - |y_t - x_2|,$$
$$L_t^{(0,0,0)} = \max[L_{t-1}^{(0,0,1)} - |y_t - x_1|, L_{t-1}^{(0,0,0)} - |y_t - x_0|],$$

where max[α, β] denotes the maximum value of α and β. similarly, $$L_{t-1}^{(1,1,1)} = \max[L_{t-2}^{(1,1,1)} - |y_{t-1} - x_{7,t-1}|, L_{t-2}^{(1,1,0)} - |y_{t-1} - x_{6,t-1}|],$$
$$L_{t-1}^{(1,1,0)} = L_{t-2}^{(1,0,0)} - |y_{t-1} - x_{5,t-1}|,$$
$$L_{t-1}^{(1,0,0)} = L_{t-2}^{(0,0,0)} - |y_{t-1} - x_{4,t-1}|, \quad (32)$$
$$L_{t-1}^{(0,1,1)} = L_{t-2}^{(1,1,1)} - |y_{t-1} - x_{3,t-1}|,$$
$$L_{t-1}^{(0,0,1)} = L_{t-2}^{(0,1,1)} - |y_{t-1} - x_{2,t-1}|,$$
$$L_{t-1}^{(0,0,0)} = \max[L_{t-2}^{(0,0,1)} - |y_{t-1} - x_{1,t-1}|, L_{t-2}^{(0,0,0)} - |y_{t-1} - x_{0,t-1}|],$$

Next, we define the difference $M_{j,t}$, where j=1, 2, ..., 6, between metric values by the equation (4). Then by substituting (31) and (32) in (4), we obtain the following equation (33).

If $M_{1,t-2} \geq |y_{t-1} - x_0| - |y_{t-1} - x_1|$ and $M_{1,t-2} + M_{2,t-2} \geq |y_{t-1} - x_0| - |y_{t-1} - x_2| + |y_t - x_0| - |y_t - x_1|$, then $$M_{1,t} = M_{1,t-2} + M_{2,t-2} + M_{3,t-2} +$$
$$|y_{t-1} - x_3| - |y_{t-1} - x_0| +$$
$$|y_t - x_2| - |y_t - x_0|,$$
$$M_{4,t} = |y_t - x_0| - |y_t - x_4|,$$
$$M_{5,t} = |y_{t-1} - x_0| - |y_{t-1} - x_4| +$$
$$|y_t - x_4| - |y_t - x_5|;$$

If $M_{1,t-2} < |y_{t-1} - x_0| - |y_{t-1} - x_1|$ and $M_{1,t-2} + M_{2,t-2} \geq |y_{t-1} - x_0| - |y_{t-1} - x_2| + |y_t - x_0| - |y_t - x_1|$, then $$M_{1,t} = M_{2,t-2} + M_{3,t-2} +$$
$$|y_{t-1} - x_3| - |y_{t-1} - x_1| +$$
$$|y_t - x_2| - |y_t - x_0|,$$
$$M_{4,t} = |y_t - x_0| - |y_t - x_4|,$$
$$M_{5,t} = M_{1,t-2} + |y_{t-1} - x_1| - |y_{t-1} - x_4| +$$
$$|y_t - x_4| - |y_t - x_5|;$$

If $M_{1,t-2} \geq |y_{t-1} - x_0| - |x_1|$ and $M_{1,t-2} + M_{2,t} < |y_{t-1} - x_0| - |y_{t-1} - x_2| - |y_t - x_0| - |y_t - x_1|$, then $$M_{1,t} = M_{3,t-2} +$$
$$|y_{t-1} - x_3| - |y_{t-1} - x_2| +$$
$$|y_t - x_2| - |y_t - x_1|,$$
$$M_{4,t} = M_{1,t-2} + M_{2,t-2} +$$
$$|y_{t-1} - x_2| - |y_{t-1} - x_0| +$$
$$|y_t - x_1| - |y_t - x_4|,$$
$$M_{5,t} = |y_{t-1} - x_0| - |y_{t-1} - x_4| +$$
$$|y_t - x_4| - |y_t - x_5|;$$

If $M_{1,t-2} < |y_{t-1} - x_0| - |y_{t-1} - x_1|$ and $M_{1,t-2} + M_{2,t\,2} < |y_{t-1} - x_0| - |y_{t-1} - x_2| + |y_t - x_0| - |y_t - x_1|$, then $$M_{1,t} = M_{3,t-2} + \quad (33)$$
$$|y_{t-1} - x_3| - |y_{t-1} - x_2| +$$
$$|y_t - x_2| - |y_t - x_1|,$$
$$M_{4,t} = M_{2,t-2} +$$
$$|y_{t-1} - x_2| - |y_{t-1} - x_1| +$$
$$|y_t - x_1| - |y_t - x_4|,$$
$$M_{5,t} = M_{1,t-2} +$$
$$|y_{t-1} - x_1| - |y_{t-1} - x_4| +$$
$$|y_t - x_4| - |y_t - x_5|;$$

If $M_{6,t-2} \geq |y_{t-1} - x_7| - |y_{t-1} - x_6|$ and $M_{6,t-2} + M_{5,t-2} \geq |y_{t-1} - x_7| - |y_{t-1} - x_5| + |y_t - x_7| - |y_t - x_6|$, then $$M_{2,t} = |y_{t-1} - x_{7,t}| - |y_{t-1} - x_{3,t}| +$$
$$|y_t - x_{3,t}| - |y_t - x_{2,t}|,$$

$$M_{3,t} = |y_t - x_{7,t}| - |y_t - x_{3,t}|,$$

$$M_{6,t} = M_{6,t-2} + M_{5,t-2} + M_{4,t-2} +$$
$$|y_{t-1} - x_{4,t}| - |y_{t-1} - x_{7,t}| +$$
$$|y_t - x_{5,t}| - |y_t - x_{7,t}|;$$

If $M_{6,t-2} \geq |y_{t-1}-x_{7,t}|-|y_{t-1}-x_{6,t}|$ and $M_{6,t-2}+M_{5,t-2}<|y_{t-1}-x_{7,t}|-|y_{t-1}-x_{5,t}|+|y_{t-1}-x_{7,t}|-|y_t-x_{6,t}|$, then $$M_{2,t} = |y_{t-1} - x_{7,t}| - |y_{t-1} - x_{3,t}| +$$
$$|y_t - x_{3,t}| - |y_t - x_{2,t}|,$$

$$M_{3,t} = M_{6,t-2} + M_{5,t-2} +$$
$$|y_{t-1} - x_{5,t}| - |y_{t-1} - x_{7,t}| +$$
$$|y_t - x_{6,t}| - |y_t - x_{3,t}|,$$

$$M_{6,t} = M_{4,t-2} +$$
$$|y_{t-1} - x_{4,t}| - |y_{t-1} - x_{5,t}| +$$
$$|y_t - x_{5,t}| - |y_t - x_{6,t}|;$$

If $M_{6,t-2}<|y_{t-1}-x_{7,t}|-|y_{t-1}-x_{6,t}|$ and $M_{6,t-2}+M_{5,t-2}\geq|y_{t-1}-x_{7,t}|-|y_{t-1}-x_{5,t}|+|y_{t-1}-x_{7,t}|-|y_t-x_{6,t}|$, then $$M_{2,t} = M_{6,t-2} +$$
$$|y_{t-1} - x_{6,t}| - |y_{t-1} - x_{3,t}| +$$
$$|y_t - x_{3,t}| - |y_t - x_{2,t}|,$$

$$M_{3,t} = |y_t - x_{7,t}| = |y_t - x_{3,t}|,$$

$$M_{6,t} = M_{5,t-2} + M_{4,t-2} +$$
$$|y_{t-1} - x_{4,t}| - |y_{t-1} - x_{6,t}| +$$
$$|y_t - x_{5,t}| - |y_t - x_{7,t}|;$$

If $M_{6,t-2}<|y_{t-1}-x_{7,t}|-|y_{t-1}-x_{6,t}|$ and $M_{6,t-2}+M_{5,t-2}<|y_{t-1}-x_{7,t}|-|y_{t-1}-x_{5,t}|+|y_{t-1}-x_{7,t}|-|y_t-x_{6,t}|$, then $$M_{2,t} = M_{6,t-2} +$$
$$|y_{t-1} - x_{6,t}| - |y_{t-1} - x_{3,t}| +$$
$$|y_t - x_{3,t}| - |y_t - x_{2,t}|,$$

$$M_{3,t} = M_{5,t-2} +$$
$$|y_{t-1} - x_{5,t}| - |y_{t-1} - x_{6,t}| +$$
$$|y_t - x_{6,t}| - |y_t - x_{3,t}|,$$

$$M_{6,t} = M_{4,t-2} +$$
$$|y_{t-1} - x_{4,t}| - |y_{t-1} - x_{5,t}| +$$
$$|y_t - x_{5,t}| - |y_t - x_{6,t}|;$$

Figure 14:
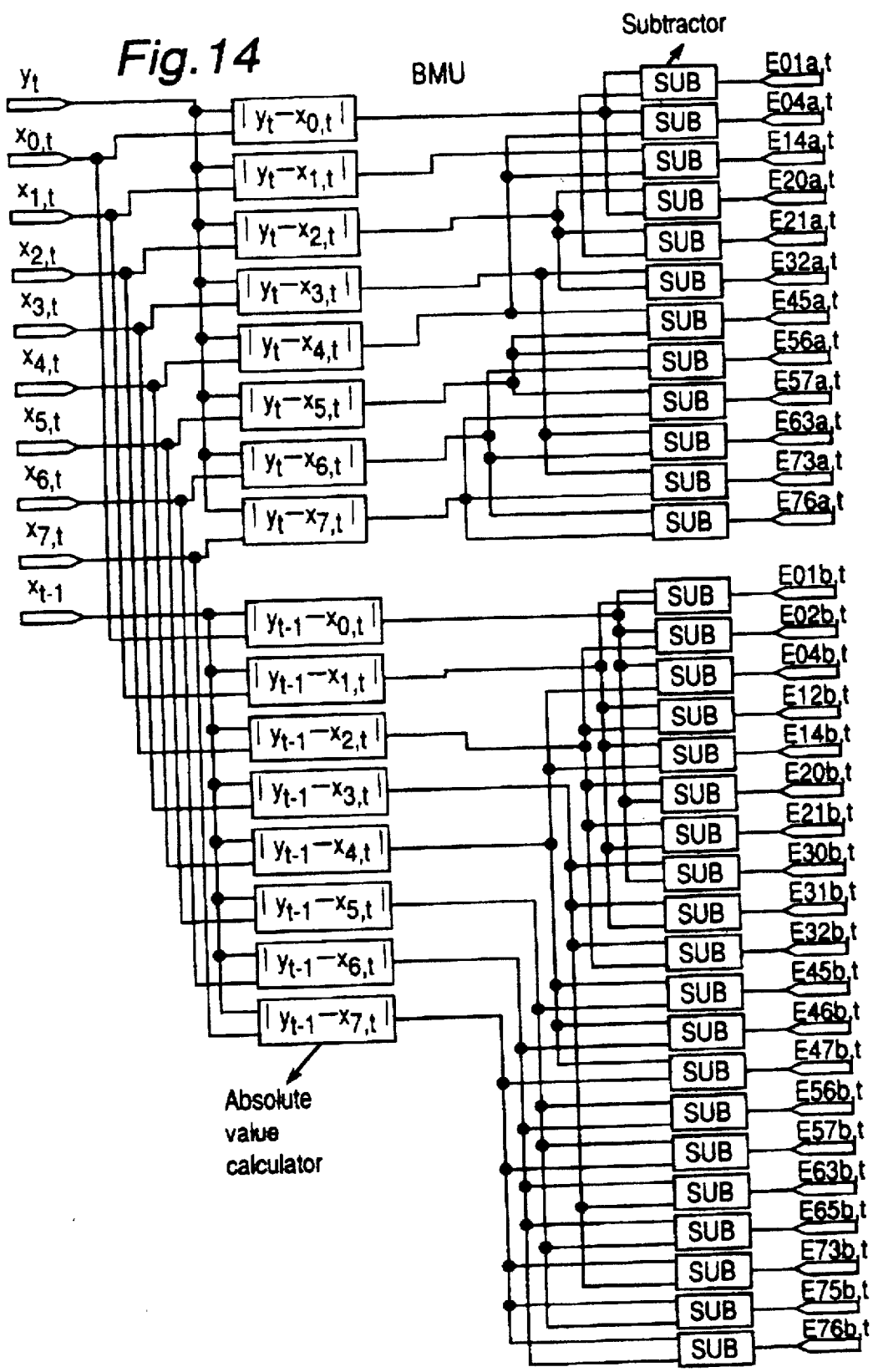
FIG. 14 is a block diagram of BMU 27 in the maximum likelihood decoder of the third embodiment according to the present invention.

FIG. 14 is a block diagram of BMU 27 in the third embodiment. BMU 27 comprises absolute value calculators and subtracters (sub). It calculates the absolute value of the difference between each of the quantized values $y_t$, $y_{t-1}$ of the playback signal and each expected signal value $x_{i,t}$ of the PR equalization output, and further performs the operations of the following equation (34) to output the results $E01a_t$, $E04a_t$, $E14a_t$, $E20a_t$, $E21a_t$, $E32a_t$, $E45a_t$, $E56a_t$, $E57a_t$, $E63a_t$, $E73a_t$, $E76a_t$, $E01b_t$, $E02b_t$, $E04b_t$, $E12b_t$, $E14b_t$, $E20b_t$, $E21b_t$, $E30b_t$, $E31b$, $E32b_t$, $E45b_t$, $E46b_t$, $E47b_t$, $E56b_t$, $E57b_t$, $E63b_t$, $E65b_t$, $E73b_t$, $E75b_t$, and $E76b_t$ into ACS 28.

$$E01a_t = |y_t - x_{0,t}| - |y_t - x_{1,t}|,$$
$$E04a_t = |y_t - x_{0,t}| - |y_t - x_{4,t}|,$$
$$E14a_t = |y_t - x_{1,t}| - |y_t - x_{4,t}|,$$
$$E20a_t = |y_t - x_{2,t}| - |y_t - x_{0,t}|,$$
$$E21a_t = |y_t - x_{2,t}| - |y_t - x_{1,t}|,$$
$$E32a_t = |y_t - x_{3,t}| - |y_t - x_{2,t}|,$$
$$E45a_t = |y_t - x_{4,t}| - |y_t - x_{5,t}|,$$
$$E56a_t = |y_t - x_{5,t}| - |y_t - x_{6,t}|,$$
$$E57a_t = |y_t - x_{5,t}| - |y_t - x_{7,t}|,$$
$$E63a_t = |y_t - x_{6,t}| - |y_t - x_{3,t}|,$$
$$E73a_t = |y_t - x_{7,t}| - |y_t - x_{3,t}|,$$
$$E76a_t = |y_t - x_{7,t}| - |y_t - x_{6,t}|,$$
$$E01b_t = |y_{t-1} - x_{0,t}| - |y_{t-1} - x_{1,t}|,$$
$$E02b_t = |y_{t-1} - x_{0,t}| - |y_{t-1} - x_{2,t}|,$$
$$E04b_t = |y_{t-1} - x_{0,t}| - |y_{t-1} - x_{4,t}|,$$
$$E12b_t = |y_{t-1} - x_{1,t}| - |y_{t-1} - x_{2,t}|,$$
$$E14b_t = |y_{t-1} - x_{1,t}| - |y_{t-1} - x_{1,t}|,$$
$$E20b_t = |y_{t-1} - x_{2,t}| - |y_{t-1} - x_{0,t}|,$$
$$E21b_t = |y_{t-1} - x_{2,t}| - |y_{t-1} - x_{1,t}|,$$
$$E30b_t = |y_{t-1} - x_{3,t}| - |y_{t-1} - x_{0,t}|,$$
$$E31b_t = |y_{t-1} - x_{3,t}| - |y_{t-1} = -x_{1,t}|,$$
$$E32b_t = |y_{t-1} - x_{3,t}| - |y_{t-1} - x_{2,t}|,$$
$$E45b_t = |y_{t-1} - x_{4,t}| - |y_{t-1} - x_{5,t}|,$$
$$E46b_t = |y_{t-1} - x_{4,t}| - |y_{t-1} - x_{6,t}|,$$
$$E47b_t = |y_{t-1} - x_{4,t}| - |y_{t-1} - x_{7,t}|,$$
$$E56b_t = |y_{t-1} - x_{5,t}| - |y_{t-1} - x_{6,t}|,$$
$$E57b_t = |y_{t-1} - x_{5,t}| - |y_{t-1} - x_{7,t}|,$$
$$E63b_t = |y_{t-1} - x_{6,t}| - |y_{t-1} - x_{3,t}|,$$
$$E65b_t = |y_{t-1} - x_{6,t}| - |y_{t-1} - x_{5,t}|,$$
$$E73b_t = |y_{t-1} - x_{7,t}| - |y_{t-1} - x_{3,t}|,$$
$$E75b_t = |y_{t-1} - x_{7,t}| - |y_{t-1} - x_{5,t}|,$$
$$E76b_t = |y_{t-1} - x_{7,t}| - |y_{t-1} - x_{6,t}|,$$

Figure 15:
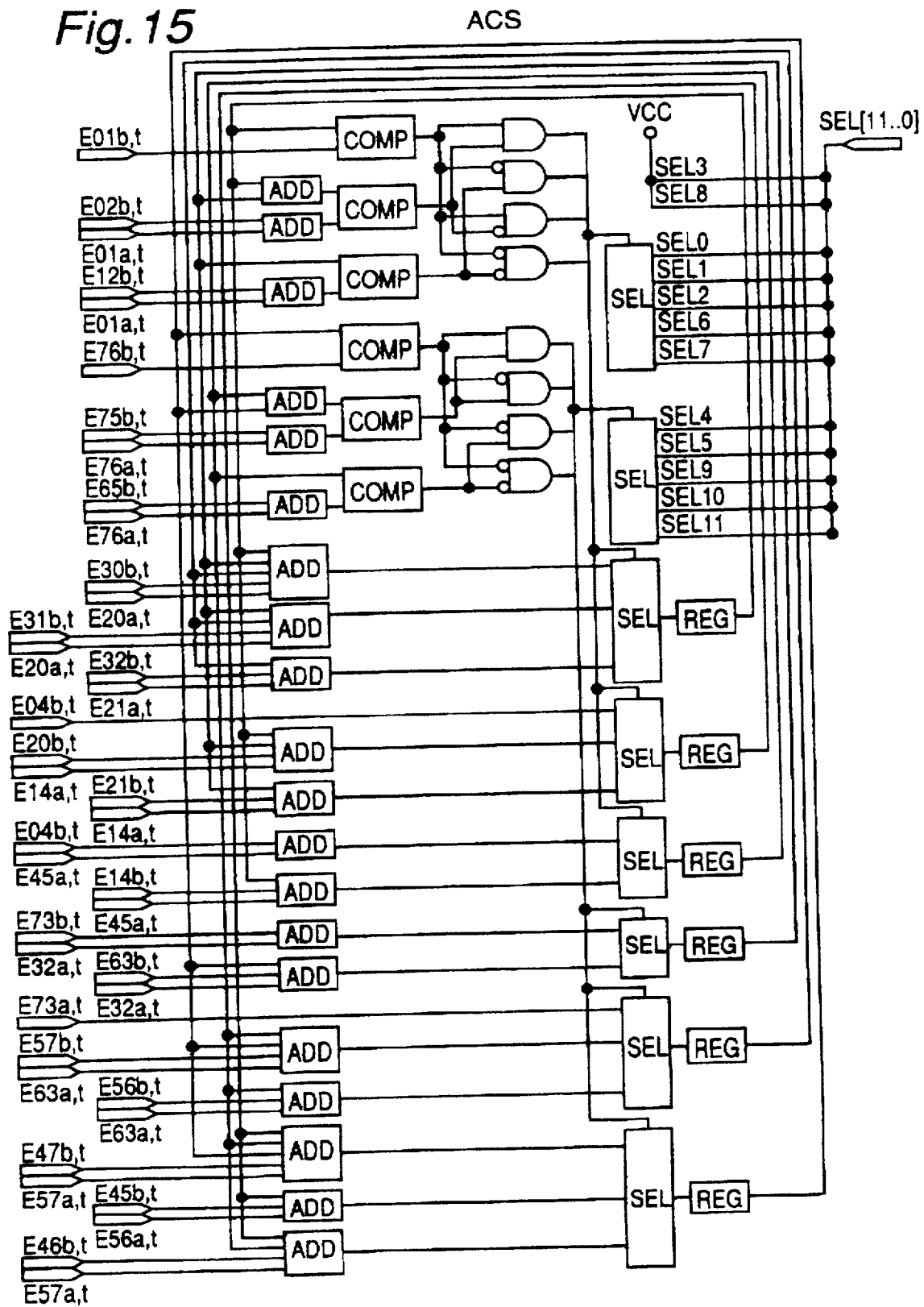
FIG. 15 is a block diagram of ACS 28 in the maximum likelihood decoder of the third embodiment according to the present invention.

FIG. 15 is a block diagram of ACS 28 in the maximum likelihood decoder in the third embodiment. ACS 28 comprises adders (add), comparators (comp), selectors (sel), and registers (reg). ACS 28 stores at each time t the differences $M_{j,t-2}$, j=1, 2, . . . , 6, of metric values at time t−2 in the registers. ACS 28 then obtains the differences $M_{j,t}$, j=1, 2, . . . , 6, of metric values at time t by the following equation

(35) from the input signals $E01a_t$, $E04a_t$, $E14a_t$, $E20a_t$, $E21a_t$, $E32a_t$, $E45a_t$, $E56a_t$, $E57a_t$, $E63a_t$, $E73a_t$, $E76b_t$, $E01b_t$, $E02b_t$, $E04b_t$, $E12b_t$, $E14b_t$, $E20b_t$, $E21b_t$, $E30b_t$, $E31b$, $E32b_t$, $E45b_t$, $E46b_t$, $E47b_t$, $E56b_t$, $E57b_t$, $E63b_t$, $E65b_t$, $E73b_t$, $E75b_t$, and $E76b_t$ and the differences $M_{j,t-2}$, $j=1, 2, \ldots, 6$, of metric values at time t–2 in the registers, and obtains the differences $M_{j,t}$, $j=1, 2, \ldots, 6$, of metric values at time t.

At the same time, ACS 28 outputs into SMU 29, as a 12-bit piece of information, which 6 state transitions of the 12 state transitions it has selected. Each of the 12-bit output is called a selection signal and denoted by SELi, i=0, 1, ..., 12. SELi is also defined in the equation (35). Here HIGH indicates a selection signal bit is at high level, and LOW indicates a selection signal bit is at low level.

SEL3=HIGH,

SEL8=HIGH;

If $M_{1,t-2} \geq E01b_t$ and $M_{1,t-2}+M_{2,t-2} \geq E02b_t$, then $M_{1,t}=M_{1,t-2}+M_{2,t-2}+M_{3,t-2}+E30b_t+E20a_t$, $M_{4,t}=E04a_t$, $M_{5,t}=E04b_t+E45a_t$,

SEL0=HIGH,

SEL1=LOW,

SEL2=LOW,

SEL6=HIGH,

SEL7=LOW;

If $M_{1,t-2}<E01b_t$ and $M_{2,t-2} \geq E12b_t+E01a_t$, then $M_{1,t}=M_{2,t-2}+M_{3,t-2}+E31b_t+E20a_t$, $M_{4,t}=E04a_t$, $M_{5,t}=M_{1,t-2}+E14b_t+E45a_t$,

SEL0=LOW,

SEL1=HIGH,

SEL2=LOW,

SEL6=LOW,

SEL7=HIGH;

If $M_{1,t-2} \geq E01b_t$ and $M_{1,t-2}+M_{2,t-2}<E02b_t+E01a_t$, then $M_{1,t}=M_{3,t-2}+E32b_t+E21a_t$, $M_{4,t}=M_{1,t-2}+M_{2,t-2}+E20b_t+E14a_t$, $M_{5,t}=E04b_t+E45a_t$,

SEL0=LOW,

SEL1=LOW,

SEL2=HIGH,

SEL6=HIGH,

SEL7=LOW;

If $M_{1,t-2}<E01b_t$ and $M_{2,t-2}<E12b_t+E01a_t$, then $M_{1,t}=M_{3,t-2}+E32b_t+E21a_t$, $M_{4,t}=M_{2,t-2}+E21b_t+E14a_t$, $M_{5,t}=M_{1,t-2}+E14b_t+E45a_t$,

SEL0=LOW,

SEL1=LOW,

SEL2=HIGH,

SEL6=LOW,

SEL7=HIGH; (35)

Figure 16B:
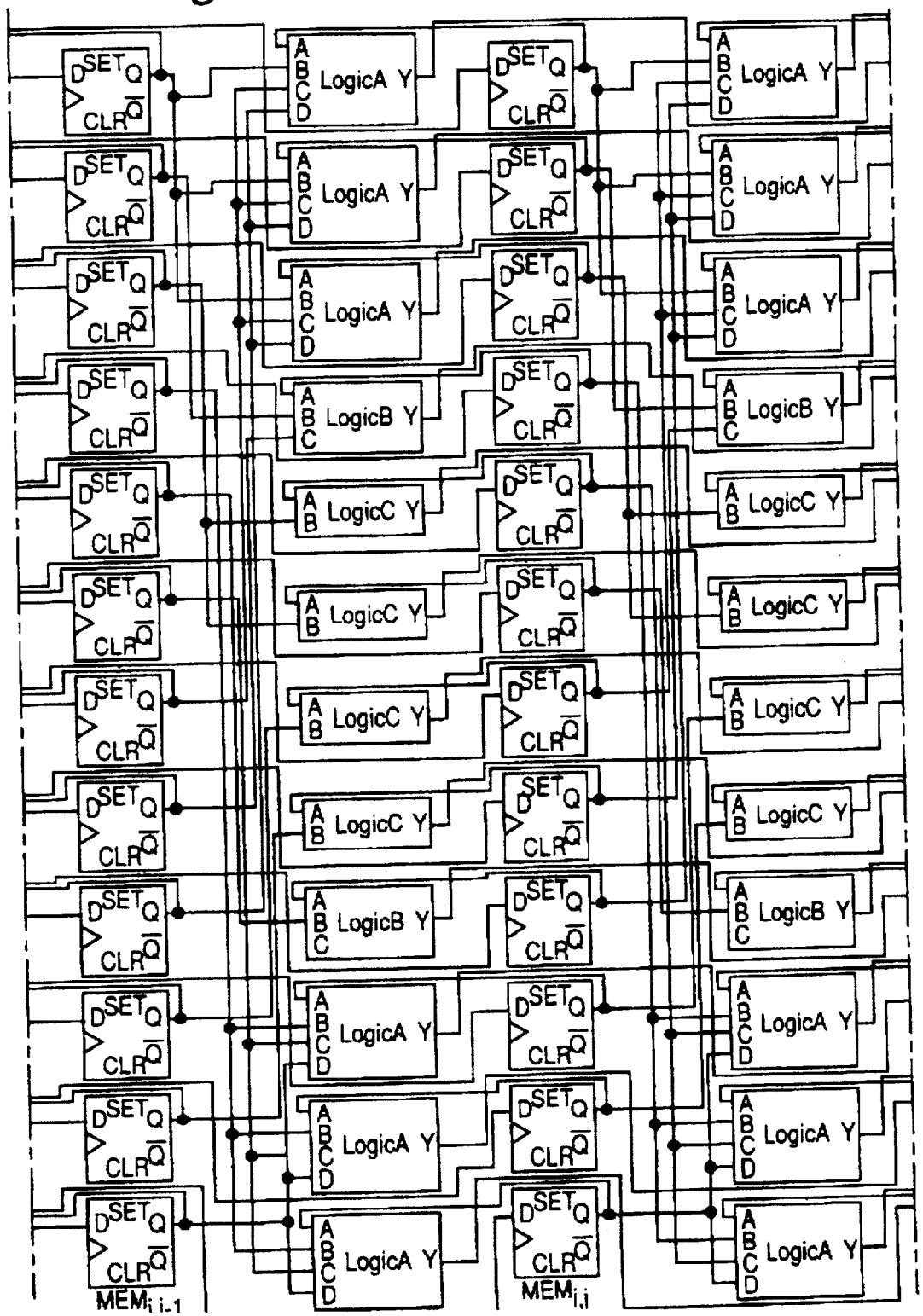
FIGS. 16 (16A, 16B and 16C) is a block diagram of SMU 29 in the maximum likelihood decoder of the third embodiment according to the present invention.
Figure 16C:
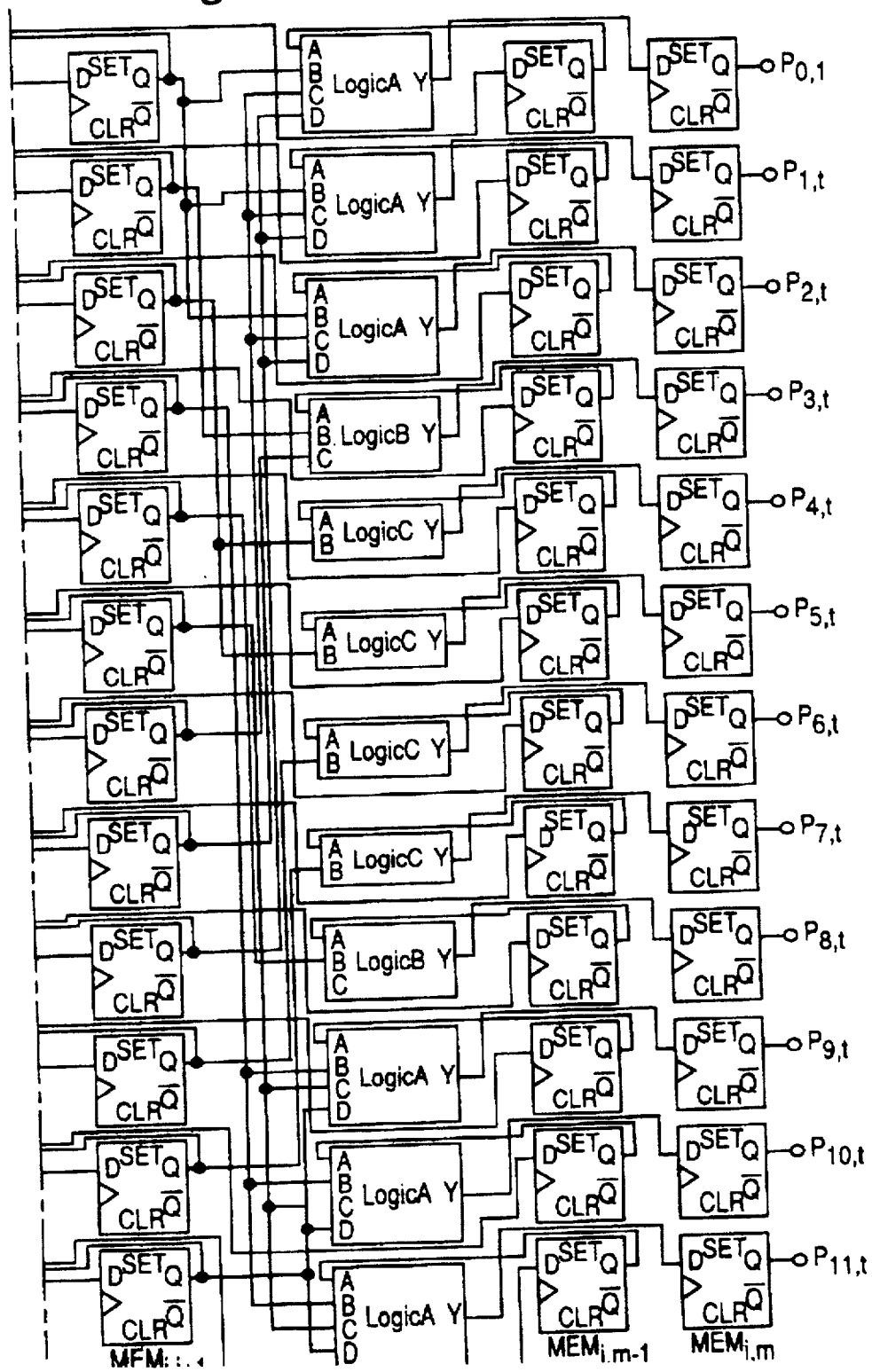
Figure 17A:
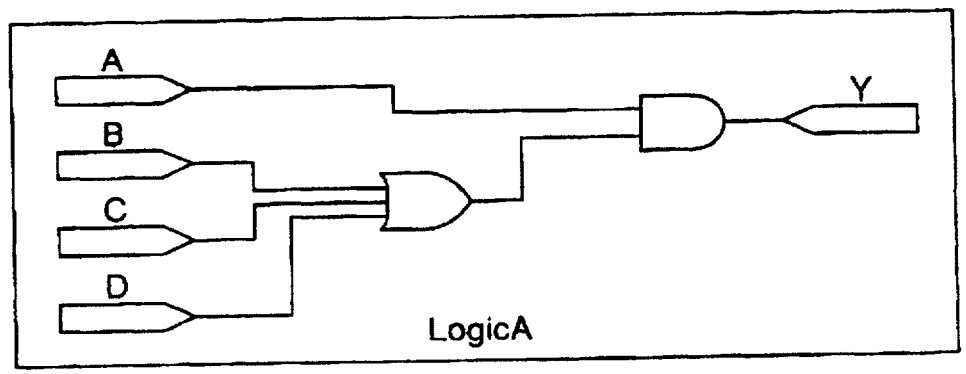
FIGS. 17A, 17B and 17C are block diagrams illustrating the construction of logical circuits A, B, and C in SMU 29 of ACS 28 in the maximum likelihood decoder of the third embodiment according to the present invention.
Figure 17B:
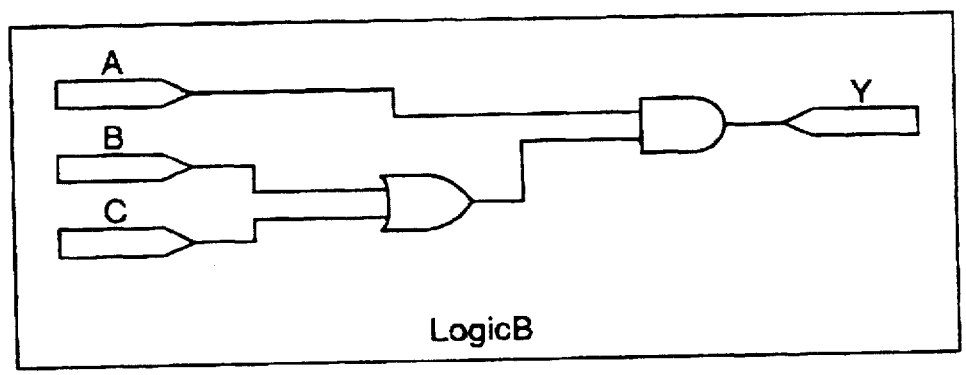
Figure 17C:
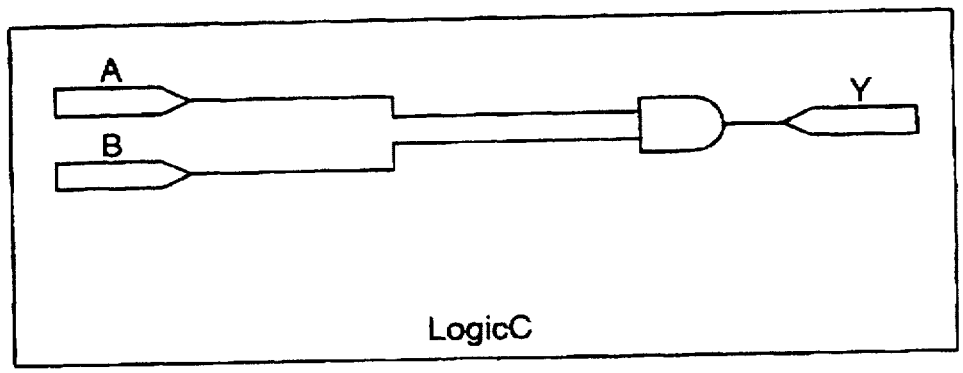

If $M_{6,t-2} \geq E76b_t$ and $M_{6,t-2}+M_{5,t-2} \geq E75b_t+E76a_t$, then $M_{2,t}=E73b_t+E32a_t$, $M_{3,t}=E73a_t$, $M_{6,t}=M_{6,t-2}+M_{5,t-2}+M_{4,t-2}+E47b_t+E57a_t$,

SEL4=LOW,

SEL5=HIGH,

SEL9=LOW,

SEL10=LOW,

SEL11=HIGH;

If $M_{6,t-2} \geq E76b_t$ and $M_{6,t-2}+M_{5,t-2}<E75b_t E76a_t$, then $M_{2,t}=E73b_t+E32a_t$, $M_{3,t}=M_{6,t-2}+M_{5,t-2}+E57b_t+E63a_t$, $M_{6,t}=M_{4,t-2}+E45b_t+E56a$,

SEL4=LOW,

SEL5=HIGH,

SEL9=HIGH,

SEL10=LOW,

SEL11=LOW;

If $M_{6,t-2}<E76b_t$ and $M_{5,t-2} \geq E65b_t+E76a_t$, then $M_{2,t}=M_{6,t-2}+E63b_t+E32a_t$, $M_{3,t}=E73a_t$, $M_{6,t}=M_{5,t-2}+M_{4,t-2}+E46b_t+E57a_t$,

SEL4=HIGH,

SEL5=LOW,

SEL9=LOW,

SEL10=HIGH,

SEL11=LOW;

If $M_{6,t-2}<E76b_t$ and $M_{5,t-2}<E65b_t+E76a_t$, then $M_2=M_{6,t-2}+E63b_t+E32a_t$, $M_3=M_{5,t-2}+E56b_t+E63a_t$, $M_6=M_{4,t-2}+E45b_t+E56a_t$,

SEL4=HIGH,

SEL5=LOW,

SEL9=HIGH,

SEL10=LOW,

SEL11=LOW;

FIG. 16 is a block diagram of SMU 29 in the maximum likelihood decoder in the third embodiment. The operation of SMU 29 is described in detail in the following. SMU 29 has registers (called path memory hereafter) of a total bit size 12×predetermined length (referred to path memory length m hereafter). SMU 29 stores the selection results of state transitions in path memory based on the selection signals input from ACS 28. There are 12 possible state transitions, so that path memory consists of 12×m bits, denoted by $MEM_{i,j}$, where i is path i of state transitions, and j is the bit address taking one of values 1, 2, ..... m. SMU 29 consists of logical circuits A (LogicA), logical circuits B (LogicB), logical circuits C (LogicC), and registers. The block diagram of the logical circuits A, B, and C are shown in FIGS. 17A, 17B and 17C. Each logical circuit A outputs a signal Y=A·(B ∨C ∨D) corresponding to four binary input signals A, B, C, D, where · denotes the logical product, and ∨ denotes the logical sum. Each logical circuit B outputs a signal Y=A·(B ∨C) corresponding to three binary input signals A, B, C. Each logical circuit C outputs a signal Y=A·B corresponding to two binary input signals A, B. The state transitions from time t to time t=2 that have been selected at time t but do not survive at time t+2 can be discarded from the path memory based on the selection results of state transitions at time t and at time t+2 by means of the logical circuits A, B and C. For example, consider the case where ACS 28 outputs the values of the selection signals at time t, t+2, and t+4 as shown in the following table 2, where H indicates high level, and L indicates low level.

TABLE 2

| Time | Selection signal values [SEL11, SEL10, ..., SEL0] |
| --- | --- |
| t | [L,L,H,H,L,H,H,L,H,L,L,H] |
| t + 2 | [H,L,L,H,L,H,H,L,H,L,L,H] |
| t + 4 | [H,L,L,H,H,L,H,L,H,L,H,L] |

When the selection signal values of Table 2 are input at time t, SMU 29 stores "1" in path memory bits $MEM_{9,1}$, $MEM_{8,1}$, $MEM_{6,1}$, $MEM_{5,1}$, $MEM_{3,1}$, and $MEM_{0,1}$, and stores "0" at $MEM_{11,1}$, $MEM_{10,1}$, $MEM_{7,1}$, $MEM_{4,1}$, $MEM_{2,1}$, and $MEM_{1,1}$. Here "1" denotes a high-level bit, and "0" denotes a low-level bit. When selection signal values are input at time t+2, SMU 29 stores the data stored in path memory bits $MEM_{i,1}$, i=11, 10, . . . , 0, in path memory bits $MEM_{i,2}$ for every i. SMU 29 also stores "1" in path memory bits $MEM_{11,1}$, $MEM_{8,1}$, $MEM_{6,1}$, $MEM_{5,1}$, $MEM_{3,1}$, and $MEM_{0,1}$, and stores "0" at $MEM_{10,1}$, $MEM_{9,1}$, $MEM_{7,1}$, $MEM_{4,1}$, $MEM_{2,1}$, and $MEM_{1,1}$. Further, when selection signal values are input at time t+4, then the input A of a logical circuit A becomes the bit "0" of $MEM_{11,2}$, and the input B of the logical circuit A becomes the bit "1" of $MEM_{3,1}$. The input C of the logical circuit A becomes the bit "1" of $MEM_{5,1}$, and the input D of the logical circuit A becomes the bit "1" of $MEM_{11,1}$, so that the output Y of the logical circuit A becomes "0," which is stored in $MEM_{11,3}$. Then, the input A of a logical circuit A becomes the bit "0" of $MEM_{10,2}$, and the input B of the logical circuit A becomes the bit "1" of $MEM_{3,1}$. The input C of the logical circuit A becomes the bit "1" of $MEMS_{5,1}$, and the input D of the logical circuit A becomes the bit "1" of $MEM_{11,1}$, so that the output Y of the logical circuit A becomes "0," which is stored in $MEM_{10,3}$. Also, the input A of a logical circuit A becomes the bit "1" of $MEM_{9,2}$, and the input B of the logical circuit A becomes the bit "1" of $MEM_{3,1}$. The input C of the logical circuit A becomes the bit "1" of $MEM_{5,1}$, and the input D of the logical circuit A becomes the bit "1" of $MEM_{11,1}$, so that the output Y of the logical circuit A becomes "1," which is stored in $MEM_{9,3}$. Further, the input A of a logical circuit B becomes the bit "1" of $MEM_{8,2}$, and the input B of the logical circuit B becomes the bit "0" of $MEM_{4,1}$. The input C of the logical circuit B becomes the bit "0" of $MEM_{10,1}$, so that the output Y of the logical circuit B becomes "0," which is stored in $MEM_{8,3}$. Then the input A of a logical circuit C becomes the bit "0" of $MEM_{7,2}$, and the input B of the logical circuit C becomes the bit "0" of $MEM_{9,1}$, so that the output Y of the logical circuit C becomes "0," which is stored in $MEM_{7,3}$. Then, the input A of a logical circuit C becomes the bit "1" of $MEM_{6,2}$, and the input B of the logical circuit C becomes the bit "0" of $MEM_{9,1}$, so that the output Y of the logical circuit C becomes "0," which is stored in $MEM_{6,3}$. Then, the input A of a logical circuit C becomes the bit "1" of $MEM_{5,2}$, and the input B of the logical circuit C becomes the bit "0" of $MEM_{2,1}$, so that the output Y of the logical circuit C becomes "0," which is stored in $MEM_{5,3}$. Then, the input A of a logical circuit C becomes the bit "0" of $MEM_{4,2}$, and the input B of the logical circuit C becomes the bit "0" of $MEM_{2,1}$, so that the output Y of the logical circuit C becomes "0," which is stored in $MEM_{4,3}$. Further, the input A of a logical circuit B becomes the bit "1" of $MEM_{3,2}$, and the input B of the logical circuit B becomes the bit "0" of $MEM_{1,1}$. The input C of the logical circuit B becomes the bit "0" of $MEM_{7,1}$, so that the output Y of the logical circuit B becomes "0," which is stored in $MEM_{3,3}$. Then, the input A of a logical circuit A becomes the bit "0" of $MEM_{2,2}$, and the input B of the logical circuit A becomes the bit "1" of $MEM_{0,1}$. The input C of the logical circuit A becomes the bit "1" of $MEM_{6,1}$, and the input D of the logical circuit A becomes the bit "1" of $MEM_{8,1}$, so that the output Y of the logical circuit A becomes "0," which is stored in $MEM_{2,3}$. Then, the input A of a logical circuit A becomes the bit "0" of $MEM_{1,2}$, and the input B of the logical circuit A becomes the bit "1" of $MEM_{0,1}$. The input C of the logical circuit A becomes the bit "1" of $MEM_{6,1}$, and the input D of the logical circuit A becomes the bit "1" of $MEM_{8,1}$, so that the output Y of the logical circuit A becomes "0," which is stored in $MEM_{1,3}$. Then, the input A of a logical circuit A becomes the bit "1" of $MEM_{0,2}$, and the input B of the logical circuit A becomes the bit "1" of $MEM_{0,1}$. The input C of the logical circuit A becomes the bit "1" of $MEM_{6,1}$, and the input D of the logical circuit A becomes the bit "1"

of $MEM_{8,1}$, so that the output Y of the logical circuit A becomes "1," which is stored in $MEM_{0,3}$.

By the above operation, path3, path5, path6, and path8 have been discarded from state transitions from time t to time t+2. Further, SMU 29 stores the data stored in path memory bits $MEM_{i,1}$, i=11, 10, . . . , 0, in path memory bits $MEM_{i,2}$ for every i. SMU 29 also stores "1" in path memory bits $MEM_{11,1}$, $MEM_{8,1}$, $MEM_{7,1}$, $MEM_{5,1}$, $MEM_{3,1}$, and $MEM_{1,1}$, and stores "0" at $MEM_{10,1}$, $MEM_{9,1}$, $MEM_{6,1}$, $MEM_{4,1}$, $MEM_{2,1}$, and $MEM_{0,1}$.

The above operation for the data at path memory bits $MEM_{i,3}$, i=0, 1, . . . , 11, are further performed for $MEM_{i,j}$, j=4, . . . , m. Then only one of the 12 bits $ME_{i,m}$, i=0, 1, . . . , 11, of path memory becomes "1," if the path memory length m is sufficiently large. This memory bit indicates a survival path. As described for the trellis diagram of FIG. 12, if the path memory bit $MEM_{3,m}$ is "1," or the path memory bit $MEM_{8,m}$ is "1," then SMU 29 outputs "10" as the decoding result. If one of the path memory bits $MEM_{4,m}$, $MEM_{5,m}$, $MEM_{6,m}$, and $MEM_{7,m}$ is "1," then SMU 29 outputs "01" as the decoding result. In the other cases, SMU 29 outputs "00" as the decoding result. The values $b_{t-1}$, $b_t$ of the original digital information signal are obtained in this way.

SMU 29 outputs $p_{i,t}=MEM_{i,m}$, i=0, . . . , 12 that express a survival path at each time t, where m is the math memory length. BMU 27, ACS 28, and SMU 29 are made to operate in synchronization with each other at a frequency ½ the frequency of the channel clock, so that digital information playback apparatus of a high transfer rate can be produced.

Using the logical circuits A, B, and C, SMU 29 of the present embodiment discards from the path memory the state transitions that have been selected but do not survive at time t+2 based on the selection results on the state transitions at time t and at time t+2. Similar effects are achieved in a construction such that SMU 29 discard from the path memory the state transitions from time t to time t+2r that have been selected at time t but do not survive at time t+2r, where r is a positive integer, based on the selection results on the state transitions at time t and at time t+2r.

In the present embodiment, the branch metric is the absolute value of the difference between each of the values $y_t$, $Y_{t-1}$ of the playback signal and each expected signal value $x_{i,j}$ of PR equalization, as expressed by equation (30). Similar effects are obtained, if the branch metric is the square of the difference between each of the values $y_t$, $y_{t-1}$ of the playback signal and each expected signal value $x_{i,j}$ of the PR equalization output. In the present embodiment, most likely state transitions have been selected from the state transitions from time t−2 to time t. Similar effects are obtained, if, more generally, most likely state transitions are selected from the state transitions from time t to time t−n, where n is a positive integer. Earlier in the present description, tracking operation that follows a timing signal contained in the playback signal was mentioned. A method of extracting a timing signal from a particular pattern on the recording medium to realize high speed synchronization is described in the following. We assume that the format on the recording medium consists of sector units, and that a VFO pattern of a predetermined length is contained on the top of each data unit. A gate signal is a signal that indicates the effective range of the playback signal within a sector depending on the format. The embodiments of the present invention follow the gate signal to start signal processing. Further, the VFO pattern is also usually used for pull-in operation in the PLL circuit.

A fourth embodiment of digital information apparatus in accordance with the present invention is described in the following. FIG. 4 is a block diagram of the fourth embodiment. An A/D converter 32 samples the playback signal played back from the recording medium with an input timing signal to output quantized data. A maximum likelihood decoder 33 estimates a state transition of maximum likelihood from the input quantized data to reproduce and output original digital information. Maximum likelihood decoder 33 also obtains phase error information from the decoding results to output into a timing signal extractor 34. Timing signal extractor 34 obtains an oscillation frequency from the phase error information to output a timing signal into A/D converter 32.

Figure 19:
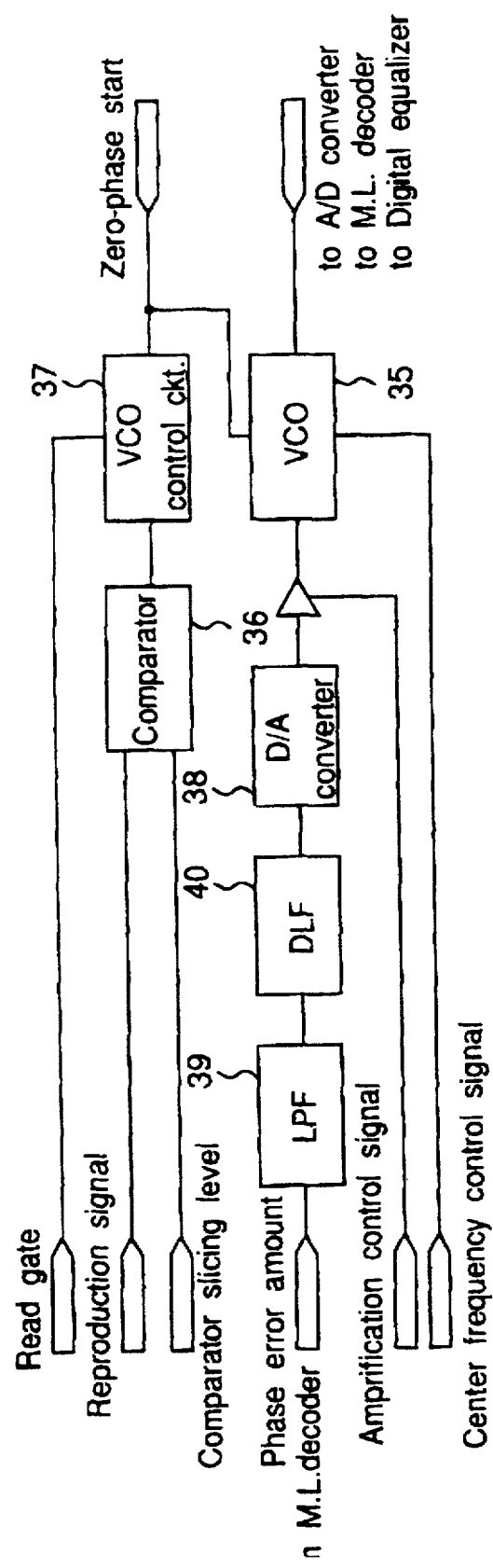
FIG. 19 is a block diagram of timing signal extractor 34 in the fourth embodiment shown in FIG. 18.

First, the operation of the timing signal extractor 34 of the digital information playback apparatus is described in detail. FIG. 19 is a block diagram of timing signal extractor 34 of the fourth embodiment of digital information apparatus in accordance with the present invention. A center frequency control signal sets the center frequency of a VCO 35. Also, an amplification factor control signal sets the gain of VCO 35. A comparator 36 converts the input playback signal into a two-value signal with a comparator slicing level to output into a VCO control circuit 37. VCO control circuit 37 obtains a zero-phase start signal that oscillates VCO 35 from the read gate and the two-value signal to output into VCO 35 in alignment with the phase detected by comparator 36. Using the phase error information input from maximum likelihood decoder 33, an LPF 39 obtains phase error amounts by the equations (11) and (12). Further, a digital loop filter (DLF) 40 obtains a VCO control Signal by the equation (13). A D/A converter 38 converts the input VCO control signal into an analog signal. VCO 35 varies the oscillation frequency based on the output signal of D/A converter 38 to output a timing signal into an A/D converter 32 and the maximum likelihood decoder 33.

Next, the operation of timing signal extractor 34 in the time direction is described. When original digital information is reproduced from a recording medium, there are usually fluctuations in rotational speed in the case of a disk and fluctuations in relative speed between the tape and the head in the case of tape. In order to ensure faithful reproduction of the original digital signal under these fluctuations, a continuous periodic pattern is recorded on the medium. An area in which such a pattern is recorded is called a VFO area. The process of extracting a timing signal is described in the case where a single signal of frequency 1/8 the channel clock frequency is recorded on the VFO area. FIGS. 20A to 20F illustrate a timing chart of timing extractor 34 in the digital information playback apparatus of the fourth embodiment. FIG. 20A represents the playback signal of a VFO area. When the read gate FIG. 20C is not effective, the VCO output FIG. 20B is oscillating at the center frequency. When the read gate becomes effective, VCO control circuit 37 halts the oscillation of VCO 35 and outputs a zero-phase start signal in synchronization with the phase detected by comparator 36., VCO 35 restarts the oscillation with its first rise edge aligned with the rise edge of the zero-phase start signal. Timing signal extractor 34 then outputs a timing signal into A/D converter 32, which obtains and outputs the signal shown by FIG. 20F. In this way, timing signal extractor 34 oscillates VCO 35 in alignment with the phase detected from the playback signal on a VFO area, so that no phase error is contained in the oscillation output of VCO 35 at the start of the oscillation, and accurate synchronization is obtained.

Figure 21:
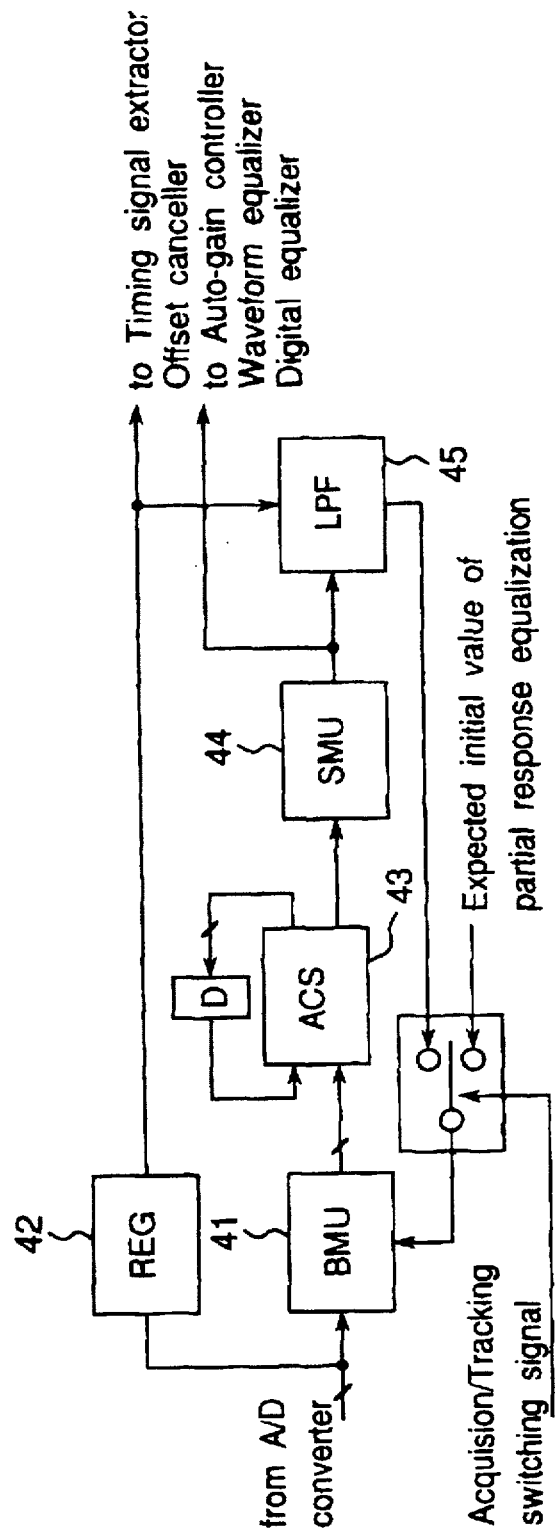
FIG. 21 is a block diagram of maximum likelihood decoder 33 in the fourth embodiment according to the present invention.

Next, the operation of maximum likelihood decoder 33 of the fourth embodiment is described in detail. FIG. 21 is a block diagram illustrating maximum likelihood decoder 33 in the digital information playback apparatus of the fourth embodiment. The quantized data input from A/D converter 32 is input to a BMU 41 and an REG 42. BMU 41 obtains the branch metric from input expected equalized values and the quantized data to output into ACS 43. ACS 43 estimates most likely state transitions to output the selection results on state transitions into SMU 44. SMU 44 obtains a survival path from the selection results on state transitions to output into LPF 45. REG 42 outputs into LPF 45 quantized data delayed by processing time in BMU 41, ACS 43, and SMU 44. LPF 45 obtains expected equalized values from the survival path and the quantized data by the equation (10) to output into BMU 41. In the acquisition mode, BMU 41 uses initial expected equalized values, and in the tracking mode, uses expected equalized values output from LPF 45.

Next, the operation of ACS 43 is described in detail. ACS 43 obtains the differences $M_{j,t}$, j=1, 2, ..., 6, of metric values at time t by the equation (9) from the input signals $E01_t$, $E76_t$, $E45_t$, $E20_t$, $E04_t$, $E14_t$, $E73_t$, $E63_t$, and $E56_t$, and the differences $M_{j,t-1}$, j=1, 2, ..., 6, of metric values at time t−1 in the registers. Then ACS 43 selects likely 6 state transitions from the 8 possible state transitions to output the selection results into SMU 44. ACS 43 selects likely 6 state transitions at each time from the 8 possible state transitions based on the likelihood of states at one unit time before.

Timing signal extractor 32 oscillates VFO in alignment with the detected phase, when the read gate becomes effective at the VFO area. Therefore, maximum likelihood decoder 33 must set metric values $M_{i,t-1}$, i=1, 2, ..., 6, when it receives the first quantized data value $y_0$ after the read gate becomes effective. Since a definite pattern is recorded on the VFO area, quantized data values $y_i$, where i= ..., −2, −1 can be estimated. Therefore, the metric values at t=−1 can be set based on the estimated quantized values $y_i$, so that accurate maximum likelihood decoding results can be obtained by a SMU having path memory of a small memory length.

Next, the method of setting is describes at t=−1 is described. A single signal of the frequency 1/8 that of the channel clock is recorded on the VFO area. Assume that quantized data that was equalized with ideal PR(1, 3, 3, 1) equalization has been input to maximum likelihood decoder 33 before time t=0. FIGS. 22A to 22F show an operation chart of the maximum likelihood decoder of the fourth embodiment. FIG. 22A shows the partial response equalized playback signal at the VFO area. When this playback signal is quantized by A/D converter 32, then the quantized data shown by FIG. 22C is obtained. When this quantized data is input to maximum likelihood decoder 33, a trellis diagram as shown in FIG. 22D is obtained. The solid lines indicate state transitions selected by ACS 43. Also, broken lines indicate state transitions not selected by ACS 43. Further, the bold solid lines indicate the survival path estimated by SMU 43. If we assume that the playback signal before t=−1 has been quantized by A/D converter 32 and that the quantized data shown by FIG. 22E has been obtained, then the maximum likelihood decoding results shown by FIG. 22F are obtained. The quantized data signal $S_t$ takes the following values.

$$S_{1+8j}=8,$$

$$S_{8j}, S_{2+8j}=7,$$

$$S_{3+8j}=S_{7+8j}=4, \quad (36)$$

$$S_{4+8j}=S_{6+8j}=1,$$

$$S_{5+8j}=0,$$

where j is any integer.

Figure 23A:
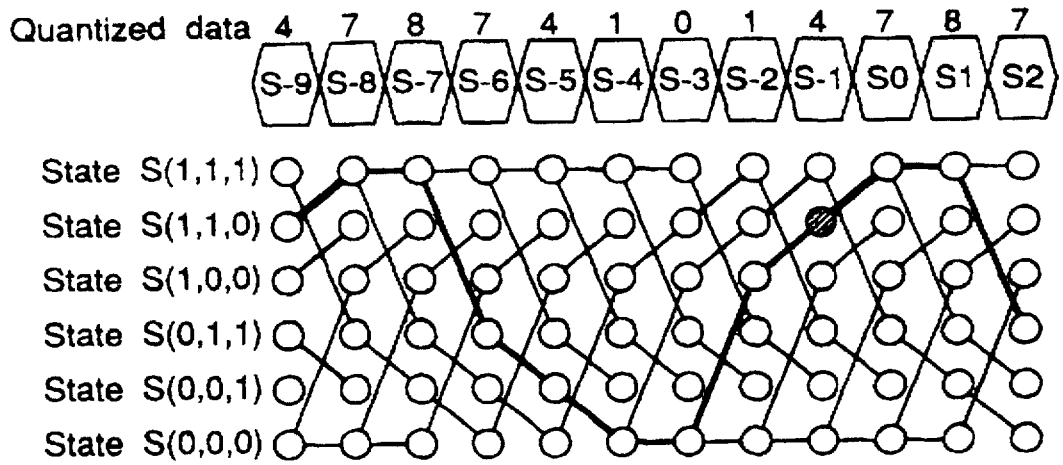
FIGS. 23A, 23B, 23C, 23D, 23E and 23F are enlarged diagrams corresponding to those of FIGS. 22A to 22F in the fourth embodiment.
Figure 23B:
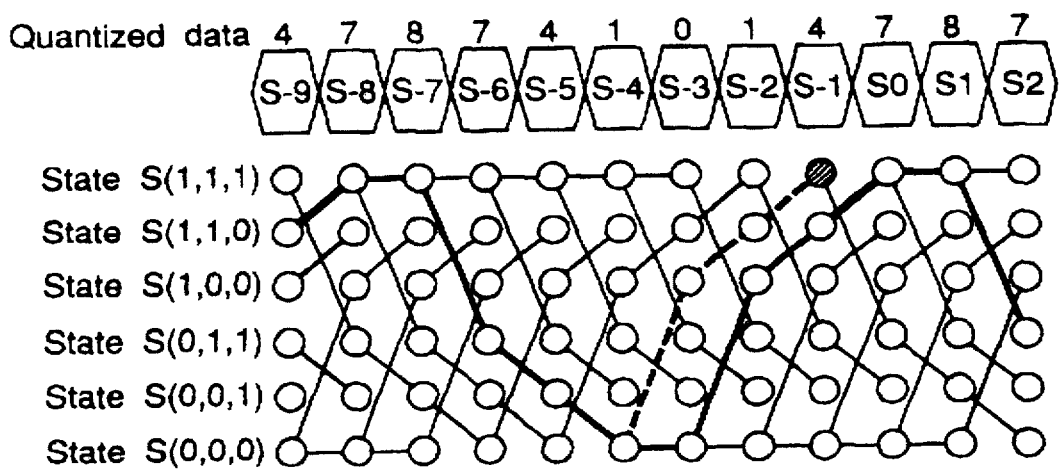
Figure 23C:
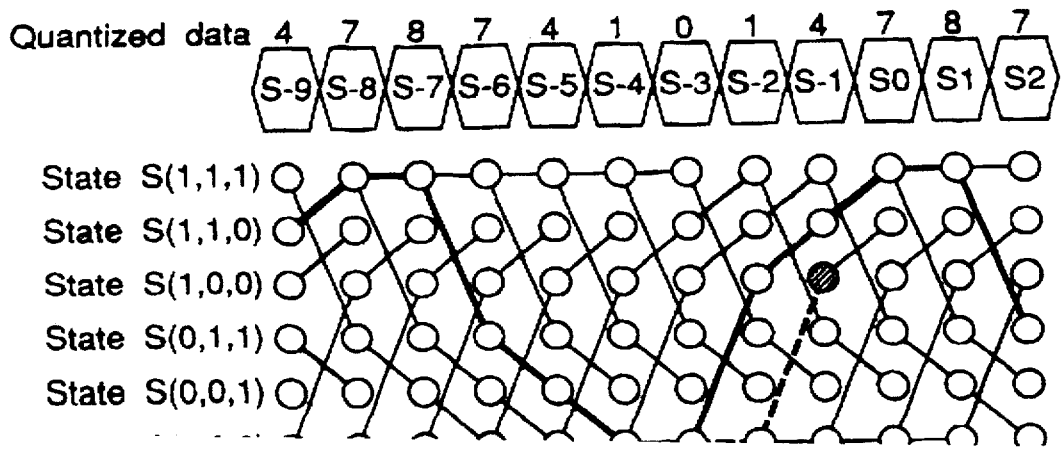
Figure 23D:
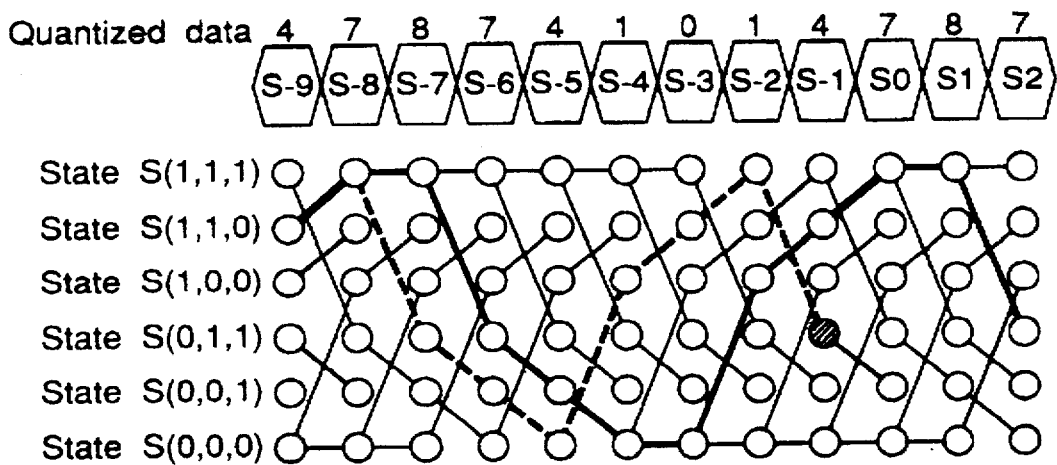
Figure 23E:
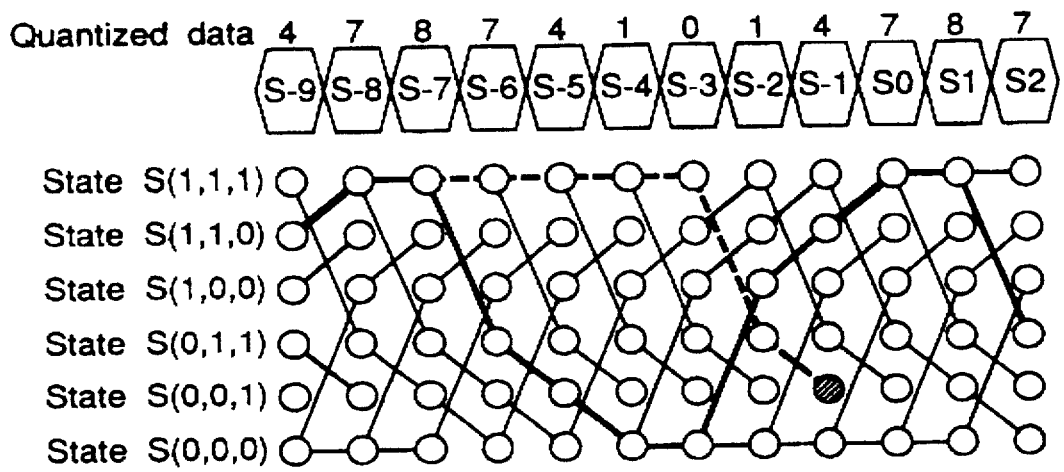
Figure 23F:
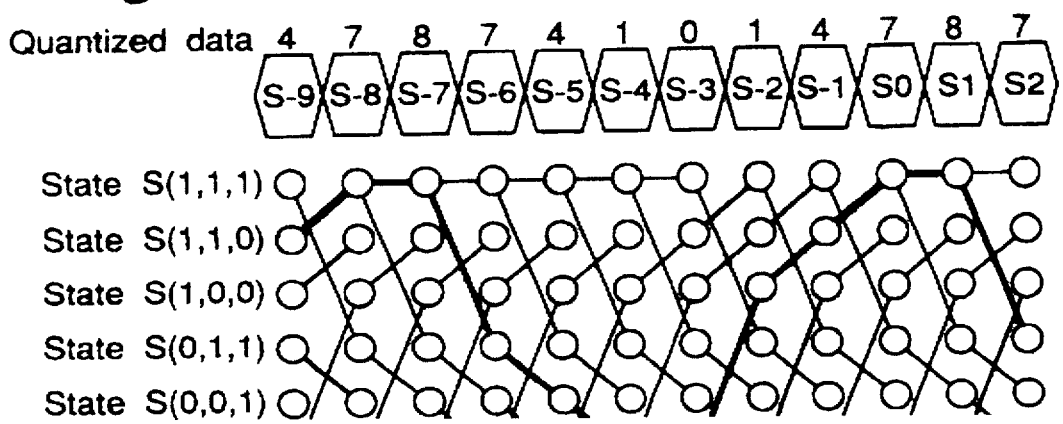

Next, in FIG. 22F, the metric value of each state of S(1,1,1), S(1,1,0), S(1,0,0), S0,1,1), S(0,0,1), and S(0,0,0) at time t=−1 is estimated, and the initial metric values are stored in the registers. Consider the area surrounded by the broken lines in FIG. 22. Each of FIG. 23A tO 23F enlarges the area. Consider the state S(1,1,0) at time t=−1. It is on the survival path estimated by maximum likelihood decoder 33. Since ideal partial response equalization has been performed before time t=−1, each state on the survival path has the maximum likelihood, and metric values always take 0 in the present case. Next, consider the state S(1,1,1) at time t=−1. The metric value of S(1,1,1) at t=−1 is the accumulated sum of the branch metric of the states on the bold broken line in FIG. 23B. Similarly, the metric value of S(1,0,0) at t=−1 is the accumulated sum of the branch metric of the states on the bold broken line in FIG. 23C. The metric value of S(0,1,1) at t=−1 is the accumulated sum of the branch metric of the states on the bold broken line in FIG. 23D. The metric value of S(0,0,1) at t=−1 is the accumulated sum of the branch metric of the states on the bold broken line in FIG. 23E. The metric value of S(0,0,0) at t=−1 is the accumulated sum of the branch metric of the states on the bold broken line in FIG. 23F.

The following Table 3 shows the branch metric at each time and the accumulated sums.

TABLE 3

| | | | Branch metric and accumulated sums | | | | | |
|---|---|---|---|---|---|---|---|---|
| | | | Branch metric | | | | | |
| Time | −7 | −6 | −5 | −4 | −3 | −2 | −1 | Accumulated sums |
| | 0 | 0 | 0 | 0 | −1 | −3 | −3 | $L_{-1}(1,1,1) = -7$ |
| | 0 | 0 | 0 | 0 | 0 | 0 | 0 | $L_{-1}(1,1,0) = 0$ |
| | 0 | 0 | 0 | 0 | 0 | −3 | −4 | $L_{-1}(1,0,0) = -4$ |
| | −1 | −3 | −3 | 0 | −4 | −6 | −3 | $L_{-1}(0,1,1) = -20$ |
| | 0 | −1 | −4 | −7 | −8 | −6 | 0 | $L_{-1}(0,0,1) = -26$ |
| | 0 | 0 | 0 | 0 | 0 | −4 | −5 | $L_{-1}(0,0,0) = -5$ |

Then differences between the metric values at time t=−1 are obtained by the equation (37), and the results are stored in the registers. In this way, SMU 44 can swiftly estimate a survival path, and the memory length is shortened.

$$M_{1,-1}=L_{-1}^{(0,0,0)}-L_{-1}^{(0,0,1)}=21,$$

$$M_{2,-1}=L_{-1}^{(0,0,1)}-L_{-1}^{(0,1,1)}=6,$$

$$M_{3,-1}=L_{-1}^{(0,1,1)}-L_{-1}^{(1,1,1)}=-13, \quad (37)$$

$$M_{4,-1}=L_{-1}^{(1,0,0)}-L_{-1}^{(0,0,0)}=1,$$

$$M_{5,-1}=L_{-1}^{(1,1,0)}-L_{-1}^{(1,0,0)}=4,$$

$$M_{6,-1}=L_{-1}^{(1,1,1)}-L_{-1}^{(1,1,0)}=-7.$$

In the fourth embodiment of digital information decoder, the branch metric has been defined as the absolute value of the difference between the value $y_t$ of the playback signal and the expected signal value $x_{i,t}$ of PR equalization, as expressed by the equation (7). However, similar effects are obtained, if the branch metric is the square of the difference between the value $y_t$ of the playback signal and the expected signal value $x_{i,t}$ of PR equalization. Further, if differences between metric values at time t=−1 are obtained by a similar procedure based on a VFO recording pattern and partial response equalization, then similar effects are obtained.

Figure 18:
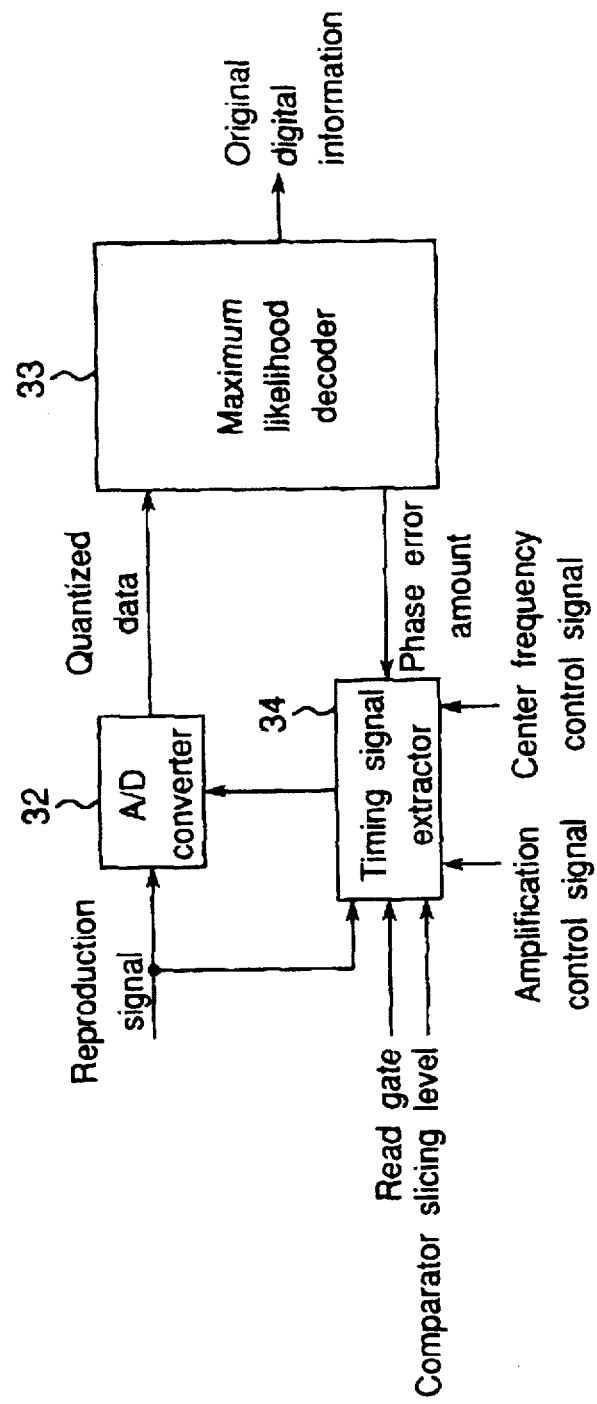
FIG. 18 is a block diagram of a fourth embodiment of digital information apparatus in accordance with the present invention.

Next, a fifth embodiment of digital information apparatus in accordance with the present invention is described. The construction of the fifth embodiment is the same as the fourth embodiment as shown in FIG. 18. The operation of the A/D converter and the maximum likelihood decoder in the fifth embodiment is the same as in the fourth embodiment, so that the construction and operation of only the timing signal extractor in the fifth embodiment is described below.

Figure 24:
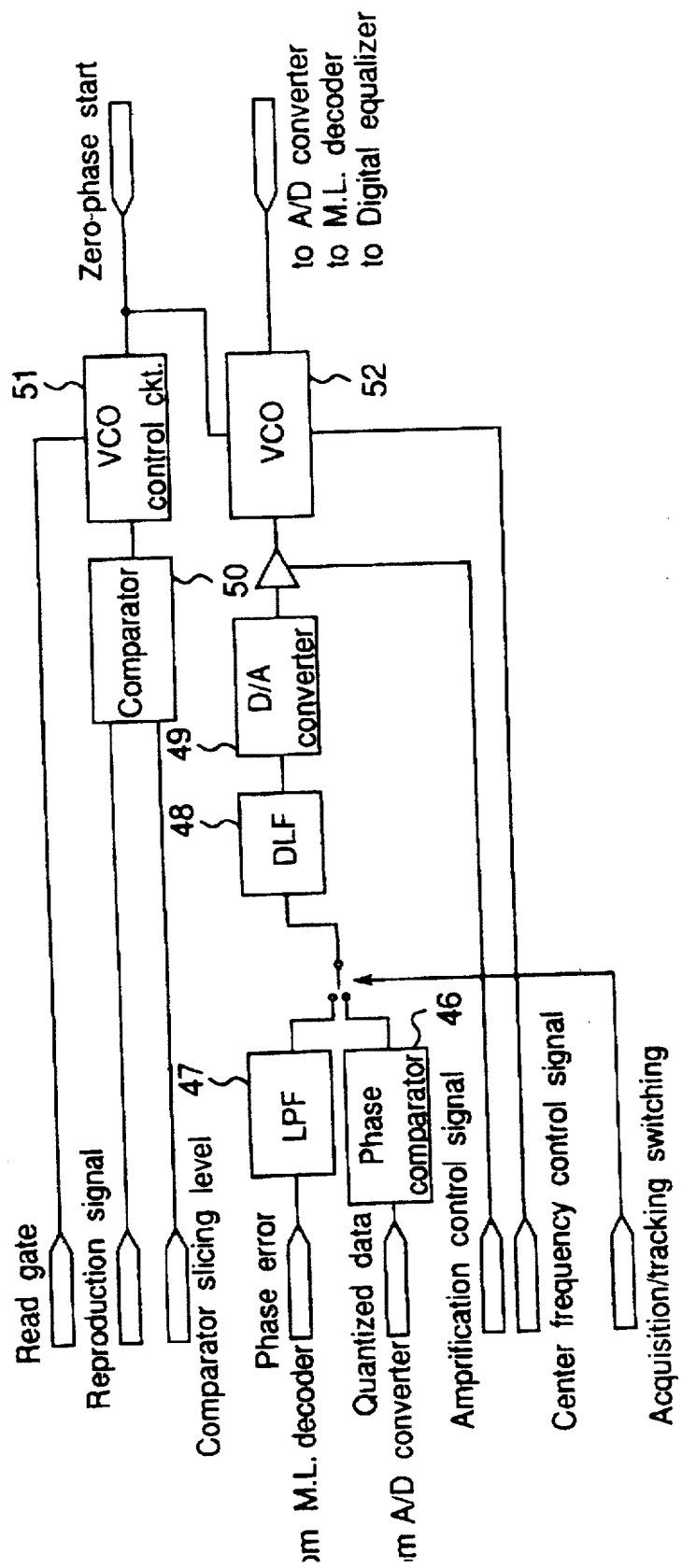
FIG. 24 is a block diagram of the timing signal extractor in a fifth embodiment of digital information playback apparatus in accordance with the present invention.

FIG. 24 is a block diagram of the timing signal extractor in the fifth embodiment. The quantized data output from the A/D converter is input to a phase comparator 46. The center frequency control signal sets the center frequency of a VCO 52. Also, the amplification factor control signal sets the gain of VCO 52. A comparator 50 converts the input playback signal into a two-value signal with a comparator slicing level to output into a VCO control circuit 51. VCO control circuit 51 obtains a zero-phase start signal that oscillates VCO 52 from the read gate and the two-value signal to output into VCO 52 in alignment with the phase detected by comparator 50. Using the phase error information input from the maximum likelihood decoder, an LPF 47 obtains phase error amounts by the equations (11) and (12). Further, a digital loop filter (DLF) 48 obtains a VCO control signal by the equation (13). A D/A converter 49 converts the input VCO control signal into an analog signal. VCO 52 varies the oscillation frequency based on the output signal of D/A converter 49 to output a timing signal into the A/D converter, the maximum likelihood decoder, and the digital equalizer.

In acquisition operation, the timing signal extractor obtains phase error amounts from the quantized data input from the A/D converter to output into DLF 48. DLF 48 sets the coefficients α and β so that the loop gain becomes high during pull-in operation and becomes low after the completion of pull-in operation. Phase comparator 46 of short processing time is used during pull-in operation on the VFO area, and the loop gain is made high, so that pull-in operation time can be shortened, and the capture range can be wider. Further, when effective data is played back, the phase error amounts obtained based on the maximum likelihood decoding results output from LPF 47 are used, and the loop gain is lowered, so that the possibility of unlocking is kept low, even if the quality of the playback signal becomes lower.

Figure 25:
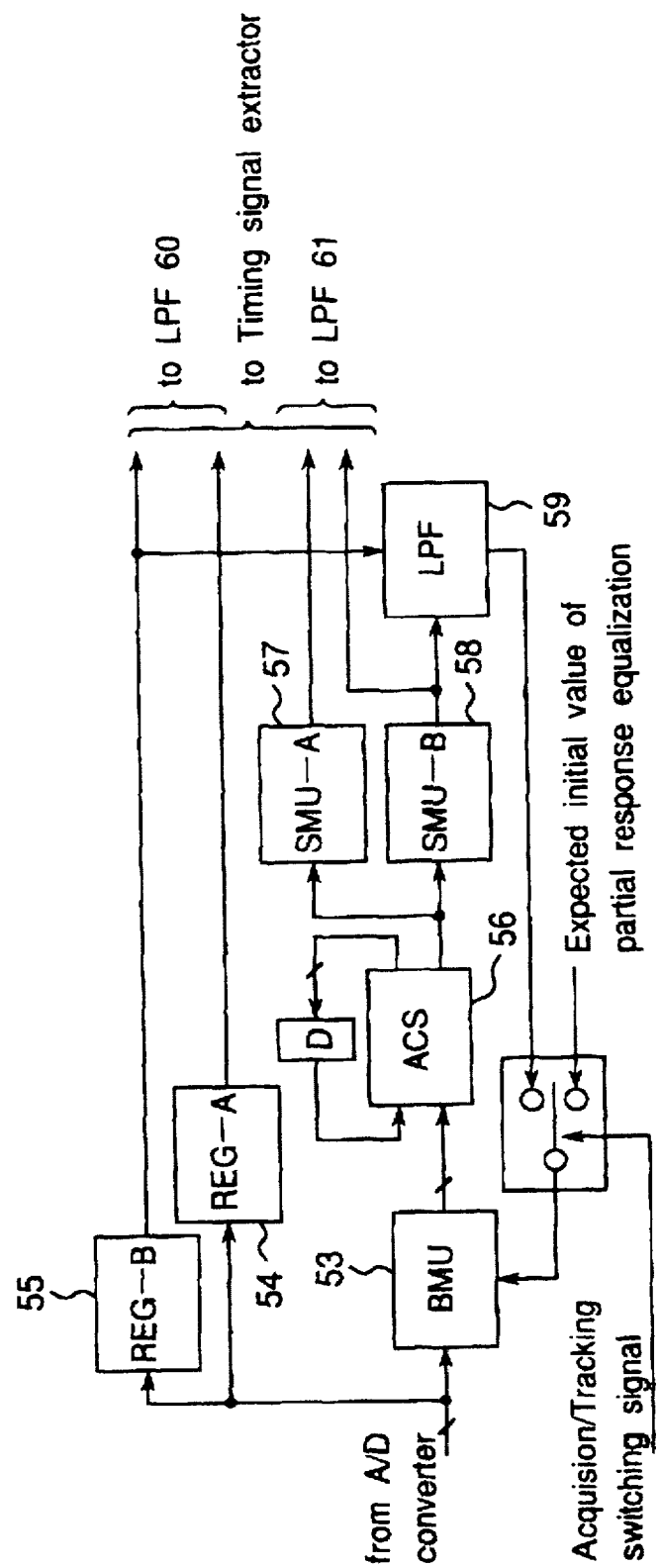
FIG. 25 is a block diagram of the maximum likelihood decoder in a sixth embodiment of digital information playback apparatus in accordance with the present invention. And, FIG. 26 is a block diagram of the timing signal extractor in the sixth embodiment.

Next, a sixth embodiment of digital information playback apparatus in accordance with the present embodiment is described. The maximum likelihood decoder and the timing signal extractor of the sixth embodiment are described in the following. FIG. 25 is a block diagram of the maximum likelihood decoder in the sixth embodiment. The quantized data input from the A/D converter is input to a BMU 53, an REG_A 54, and an REG_B 55. BMU 53 obtains the distance between expected values of partial response quantization and the quantized data value to output into an ACS 56. ACS 56 selects likely state transitions from the possible state transitions based on the metric values and branch metric at one unit time before and obtains metric values at the current time to store in registers. ACS 56 outputs the selection results on state transitions into SMU_A 57 and SMU_B 58. SMU_A 57 and SMU-B 58 discard inconsistent state transitions based on state transition rules to estimate a survival path. SMU_A 57 has path memory of a short path memory length, and SMU_B 58 has path memory of a long path memory length. SMU_B 58 restores original digital information from the survival path. SMU-B 58 also outputs the survival path into an LPF_B 59. REG_A54 stores the input quantized data stores in registers for the time necessary for the processing in BMU 53, ACS 56, and SMU_A57 to output the quantized data. Similarly, REG_B55 stores the input quantized data for the time necessary for processing in BMU 53, ACS 56, and SMU_B 58 to output the quantized data into LPF_B 59. LPF_B 59 performs smoothing processing for the quantized data following the survival path to output expected equalized values into BMU 53.

Figure 26:
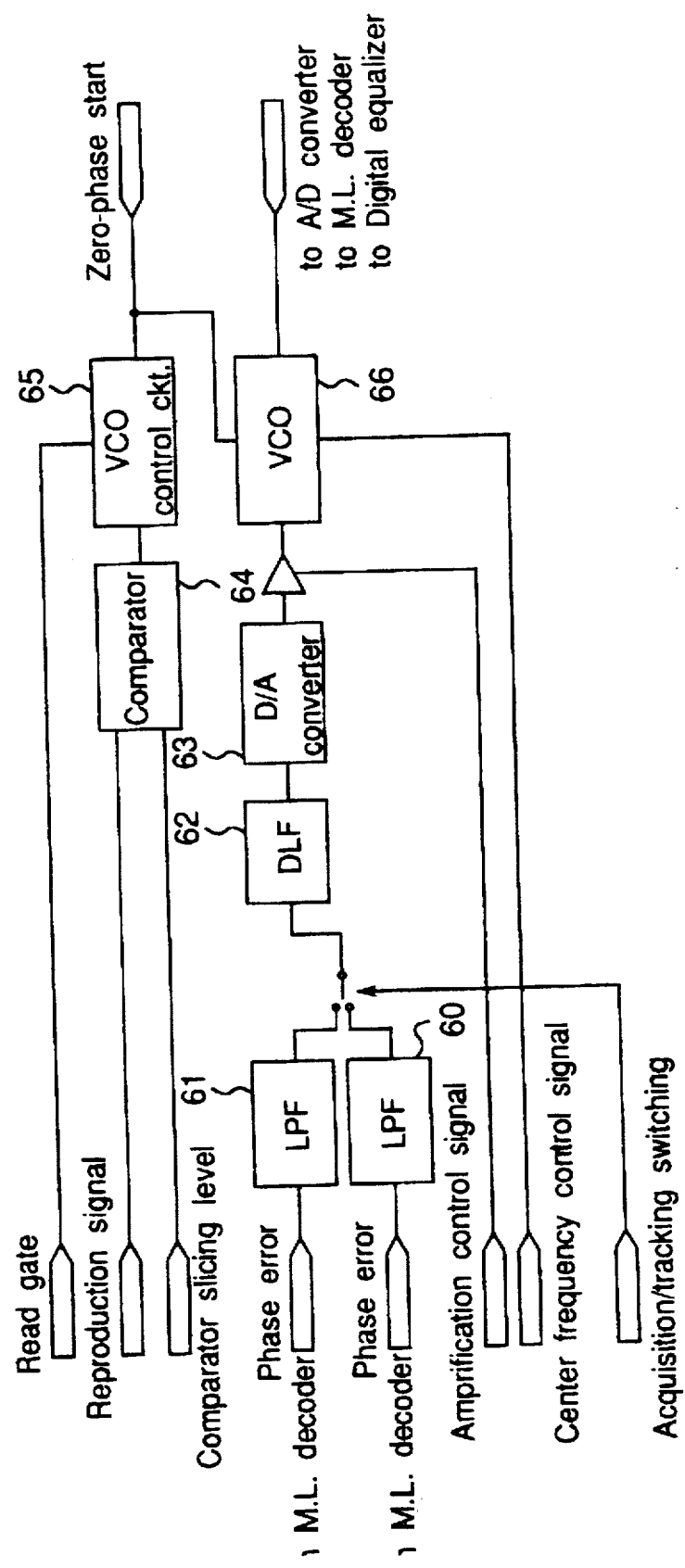

FIG. 26 is a block diagram of the timing signal extractor in the sixth embodiment. The center frequency control signal sets the center frequency of a VCO 66. Also, the amplification factor control signal sets the gain of VCO 66. A comparator 64 converts the input playback signal into a two-value signal with a comparator slicing level to output into a VCO control circuit 65. VCO control circuit 65 obtains a zero-phase start signal that oscillates VCO 66 from the read gate and the two-value signal to output into VCO 66 in alignment with the phase detected by comparator 64. Using the phase error information input from the maximum likelihood decoder, an LPF 60 and LPF 61 obtain phase error amounts by the equations (11) and (12). Further, a digital loop filter (DLF) 62 obtains a VCO control signal by the equation (13). A D/A converter 63 converts the input VCO control signal into an analog signal. VCO 66 varies the oscillation frequency based on the output signal of D/A converter 63 to output a timing signal into the A/D converter, the maximum likelihood decoder, and the digital equalizer.

In acquisition operation, the phase error amounts of LPF 60 obtained from the phase error information of the SMU of short path memory length are input to DLF 62. In tracking operation, the phase error amounts of LPF 61 obtained from the phase error information of the SMU of long path memory length are input to DLF 62. DLF 62 sets the coefficients α and β so that the loop gain becomes high during pull-in operation and the loop gain becomes low after the completion of pull-in operation. Phase error information output from the maximum decoder of short path memory length is used during pull-in operation on a VFO area, and the loop gain is made high, so that the pull-in operation time can be shortened, and the capture range can be wider. Further, when effective data is played back, phase error information obtained by the maximum likelihood decoder of long path memory length is used, and the loop gain is lowered, so that the possibility of unlocking is kept low, even if the quality of the playback signal becomes lower. Pull-in operation time can be shortened, and the capture range can be wider, if comparator 46 of short processing time is used in pull-in operation on a VFO area, and the loop gain is made high. Further, when effective data is played back, if the phase error amounts obtained based on the maximum likelihood decoding results output from LPF 47 are used, and the loop gain is lowered, then the possibility of unlocking is kept low, even if the quality of the played back signal becomes lower.

According to the present invention, in a digital information playback apparatus, a timing signal extractor detects the response characteristic of the record/playback system using the quantized data based on a survival path obtained during viterbi decoding operation, obtains level fluctuations of the playback signal, controls expected equalized values used in a maximum likelihood decoder, and calculates phase shifts of the timing signal to control the phase of the timing signal. As a result, an accurate timing signal can be extracted from the playback signal. Further, timing signal extracting operation is performed by digital processing, so that it is fit for processing of a digital signal, and in particular, analog adjustment is not necessary. Further, when controlling the phase of the timing signal using detected results on phase shifts of the timing signal, speedy transition to stationary operation is made possible by varying the characteristic of phase control during initial operation from the one during stationary operation. Further, the method of reproducing digital information described above can better improve the SN ratio and can realize better error rates than Nyquist equalization by combining the channel code of the minimum distance between polarity inversions 3 or greater with PR equalization that tolerates interference between recorded bits.

Further, a maximum likelihood decoding method of the maximum of the present invention is equipped with a BMU that obtains the distance between each of n quantized data values and each of expected values of partial response equalization, an ACS that performs cumulative summation of input branch metric and the metric values that represent the likelihood of states at n time units before, compares the results, and selects likely state transitions from possible state transitions at each time to output the selection results into an SMU, and an SMU that stores the likely state transitions for a predetermined time period, and discards the state transitions that cannot continue further state transitions because of rules determined by the partial response equalization, to output a survival path. The maximum likelihood decoding method operates in synchronization with a timing signal of the frequency 1/n that of the channel clock. Consequently, a high transfer rate of the digital information playback apparatus is realized.

Further, in a digital information playback apparatus of the present invention, a timing signal extractor generates a timing signal with a pre-set center frequency in alignment with an instance when the playback signal reaches a pre-set threshold value after the gate signal that indicates the start of signal processing becomes effective. The timing signal extractor also varies the frequency of the timing signal based on phase error amounts output from a maximum likelihood decoder or a phase comparator, a pre-set amplification factor control signal, and a pre-set center frequency control signal.

Further, a maximum likelihood decoder has path memories of different lengths, obtains different phase error information from different survival path information, and selects phase error information based on the output of a counter circuit that counts the number of times at which an A/D converter has quantized the playback signal since the gate signal became effective. The maximum likelihood decoder then obtains a phase error amount to output into the timing signal extractor.

Further, a maximum likelihood decoder selects phase error information from the phase error information of the maximum likelihood decoder and the phase error information of a phase comparator based on the output of a counter circuit that counts the number of times at which an A/D converter has quantized the playback signal since the signal became effective. The maximum likelihood decoder then obtains a phase error amount to output into the timing signal extractor.

Further, a timing signal extractor varies the coefficient of a digital loop filter based on the output of a counter circuit that counts the number of times at which an A/D converter has quantized the playback signal since the gate signal became effective. Also, a timing signal extractor switches expected values of partial response equalization from fixed initial values to those output from a maximum likelihood decoder when the output of the counter circuit becomes a predetermined value.

Further, a maximum likelihood decoder sets, at predetermined initial values, metric values that represent the likelihood of states at one unit time before, before it receives a first quantized data value after the read gate becomes effective and after the ACS of the decoder starts to perform operations.

By these constructions and operation, during pull-in operation on a VFO area, phase error information of short processing time is used, and the loop gain is made high, so that pull-in operation time can be shortened, and the capture range can be wider. When effective data is played back, phase error information obtained based on the maximum likelihood decoding results is used, and the loop gain is made low, so that the possibility of unlocking is kept low, even if the quality of the playback signal becomes low.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A maximum likelihood decoder for reproducing original digital information using partial response equalization which is recorded on a recording medium by modulation with channel codes of the minimum distance between polarity inversions 3 or more, comprising:

an equalizer means for equalizing played back signal with an impulse response of the record/playback system which is defined by the following equation, $$h((2k-1)T/2) = \begin{cases} a, & \text{if } k=1, \\ b, & \text{if } k=0, \\ c, & \text{if } k=1, \\ d, & \text{if } k=2, \\ 0, & \text{otherwise,} \end{cases}$$

where a, b, c and d are arbitrary constants, k is an integer, and T is the period of timing signal;

a quantizing means for quantizing said played back signal having been equalized with a timing signal contained in said played back signal; and a maximum likelihood decoding means for estimating a most likely state transition sequence from state transitions obtained from constraints determined by said impulse response and said minimum distance between polarity inversions to reproduce original digital information.

2. The maximum likelihood decoder according to claim 1 wherein said maximum likelihood decoding means comprises a branch metric calculator, an addition comparison selector, a survival path detector, and a smoother, and wherein said branch metric calculator obtains the cumulative sums of the absolute values of differences between the quantized data values of said playback signal and expected values of partial response equalization output from said smoother, and said addition comparison selector selects most likely state transitions using said cumulative sums.

3. The maximum likelihood decoder according to claim 1 wherein said maximum likelihood decoding means comprises a branch metric calculator, an addition comparison selector, a survival path detector, and a smoother, and wherein said branch metric calculator obtains the cumulative sums of the absolute values of differences between the quantized data values of said playback signal and expected values of partial response equalization output from said smoother, and said addition comparison selector stores differences between said cumulative sums in registers for pairs of states.

4. The maximum likelihood decoder according to claim 1 wherein said maximum likelihood decoding means comprises a branch metric calculator, an addition comparison selector, a survival path detector, and a smoother, and wherein said branch metric calculator obtains the cumulative sums of the squares of differences between the quantized data values of said playback signal and expected values of partial response equalization output from said smoother, and said addition comparison selector selects most likely state transitions using said cumulative sums.

5. The maximum likelihood decoder according to claim 1 wherein said maximum likelihood decoding means comprises a branch metric calculator, an addition comparison selector, a survival path detector, and a smoother, and wherein said branch metric calculator obtains the cumulative sums of the squares of differences between the quantized data values of said playback signal and expected values of partial response equalization output from said smoother, and said addition comparison selector stores differences between said cumulative sums in registers for pairs of states.

6. The maximum likelihood decoder according to claim 1 wherein said maximum likelihood decoding means comprises a branch metric calculator, an addition comparison selector, a survival path detector, and a smoother, and wherein said branch metric calculator switches expected equalized values between initially set values and output values of said smoother when obtaining the cumulative sums of distances between the quantized data values of said playback signal and expected values of partial response equalization output from said smoother, and said addition comparison selector selects most likely state transitions using said cumulative sums.

7. A digital information playback apparatus for reducing original digital information from a recording medium using partial response equalization, said digital information playback apparatus comprising an A/D converter that converts a playback signal played back from said recording medium into quantized data, a maximum likelihood decoder that decodes said quantized data to obtain said original digital information, and a timing signal extractor that extracts, from among timing signals contained in said playback signal, only timing signals identified to be correct based on information output from said maximum likelihood decoder and outputs the extracted timing signals to feed back to said A/D converter for sampling said playback signal.

8. The digital information playback apparatus according to claim 7, wherein said maximum likelihood decoder outputs phase error information and said timing signal extractor extracts said timing signal based on said phase error information.

9. The digital information playback apparatus according to claim 8 wherein said timing signal extractor generates a timing signal based on a pre-set amplification factor control signal and a pre-set center frequency signal in alignment with an instance when said playback signal reaches a pre-set threshold value after a gate signal that indicates the start of signal processing becomes effective, and varies the frequency of said timing signal based on phase error amounts output from said maximum likelihood decoder and a pre-set timing signal control signal.

10. The digital information playback apparatus according to claim 9 wherein metric values that represent the likelihood of states at one unit time before are set at predetermined initial values after said gate signal becomes effective, and until a first quantized data value is input to said maximum likelihood decoder from said A/D converter and operations are started at an addition comparison selector in said maximum likelihood decoder.

11. The digital information playback apparatus according to claim 9 wherein said maximum likelihood decoder has path memories of different lengths, obtains different phase error information from different survival path information, selects phase error information during acquisition operation different from phase error information selected during tracking operation to obtain phase error amounts to output into said timing signal extractor.

12. The digital information playback apparatus according to claim 9 wherein said maximum likelihood decoder selects the phase error information of said maximum likelihood decoder during acquisition operation and selects the phase error information of said phase comparator during acquisition operation to obtain phase error amounts to output into said timing signal extractor.

13. The digital information playback apparatus according to claim 9 wherein said maximum likelihood decoder varies the coefficient of a digital loop filter during acquisition operation from the one during tracking operation.

14. The digital information playback apparatus according to claim 9 said maximum likelihood decoder uses fixed initial expected values of partial response equalization during acquisition operation and uses operations results of said maximum likelihood decoder as expected equalized values during tracking operation.

15. The digital information playback apparatus according to claim 7, further comprising
an automatic gain controller for controlling the amplitude of said playback signal played back from said recording medium to a constant value and wherein said maximum likelihood decoder outputs a gain control signal based on results of the maximum likelihood decoding to said automatic gain controller.

16. The digital information playback apparatus according to claim 7, further comprising
an offset cancel means that represses fluctuations in signal level contained in said playback signal played back from said recording medium and wherein said maximum likelihood decoder outputs an offset control signal based on results of the maximum likelihood decoding to said offset cancel means.

17. The digital information playback apparatus according to claim 7 further comprising an equalizer that equalizes the waveform of a playback signal played back from said recording medium with predetermined partial response equalization, and wherein said maximum likelihood decoder detects equalization error amounts of said equalizer based on the maximum likelihood decoding results to output thereby a boost amount control signal and a cutoff frequency control signal to said equalizer.

18. The digital information playback apparatus according to claim 7 further comprising a digital equalizer that equalizes the waveform of data quantized by said A/D converter with predetermined partial response equalization, and wherein said maximum likelihood decoder detects equalization error amounts of said equalizer based on the maximum likelihood results to output thereby a coefficient setting signal to said digital equalizer.

19. The digital information playback apparatus according to claim 7 further comprising a parallel data converter that outputs n values of said quantized data and a frequency divider that divides a timing the frequency of timing signal output from said timing signal extractor into a/n.

* * * * *